United States Patent
Kats et al.

(10) Patent No.: US 9,952,096 B2
(45) Date of Patent: Apr. 24, 2018

(54) ULTRA-THIN OPTICAL COATINGS AND DEVICES AND METHODS OF USING ULTRA-THIN OPTICAL COATINGS

(71) Applicant: PRESIDENT AND FELLOWS OF HARVARD COLLEGE, Cambridge, MA (US)

(72) Inventors: Mikhail A. Kats, Cambridge, MA (US); Romain Blanchard, Cambridge, MA (US); Patrice Genevet, Cambridge, MA (US); Federico Capasso, Cambridge, MA (US)

(73) Assignee: PRESIDENT AND FELLOWS OF HARVARD COLLEGE, Cambridge, MA (US)

(*) Notice: Subject to any disclaimer, the term of this patent is extended or adjusted under 35 U.S.C. 154(b) by 560 days.

(21) Appl. No.: 14/404,834

(22) PCT Filed: Jun. 3, 2013

(86) PCT No.: PCT/US2013/043851
§ 371 (c)(1),
(2) Date: Dec. 1, 2014

(87) PCT Pub. No.: WO2013/184556
PCT Pub. Date: Dec. 12, 2013

(65) Prior Publication Data
US 2015/0116721 A1    Apr. 30, 2015

Related U.S. Application Data

(60) Provisional application No. 61/655,898, filed on Jun. 5, 2012, provisional application No. 61/655,905, filed
(Continued)

(51) Int. Cl.
*G01J 3/02* (2006.01)
*G01J 3/12* (2006.01)
(Continued)

(52) U.S. Cl.
CPC ............ *G01J 3/0205* (2013.01); *G01J 3/021* (2013.01); *G01J 3/0208* (2013.01);
(Continued)

(58) Field of Classification Search
CPC .......... G02B 5/008; G02B 5/207; G02B 5/22; G02B 5/223; G02B 17/004; G01J 3/0205;
(Continued)

(56) References Cited

U.S. PATENT DOCUMENTS 3,483,110 A    12/1969 Rozgonyi
3,834,793 A *  9/1974 McConnell ............ G02B 5/201
                                              359/289
(Continued)

FOREIGN PATENT DOCUMENTS

EP    0 893 7130 A2    1/1999
WO    WO-2012/153340 A1    11/2012

OTHER PUBLICATIONS

Garry et al. (Structural, electrical and optical properties of pulsed laser deposited VO2 thin films on R- and C-sapphire planes, Thin Solid Films vols. 453-454, pp. 427-430 {2004}).*
(Continued)

*Primary Examiner* — Kimberly N Kakalec
(74) *Attorney, Agent, or Firm* — Foley & Lardner LLP; Cliff Z. Liu

(57) ABSTRACT

A spectral encoder includes a thin layer of lossy dielectric material whose thickness varies transversely from 0 to a thickness of about $\lambda/4n$ (e.g., <100 nm), where $\lambda$ is the wavelength of incident radiation and n is the dielectric material's refractive index. The dielectric layer reflects (and/or transmits) light at a wavelength that depends on the layer's thickness. Because the dielectric layer's thickness varies, different parts of the dielectric layer may reflect (transmit) light at different wavelengths. For instance, shin-
(Continued)

ing white light on a dielectric layer with a linearly varying thickness may produce a rainbow-like reflected (and/or transmitted) beam. Thus, the spectral encoder maps different wavelengths to different points in space. This mapping can be characterized by a transfer matrix which can be used to determine the spectrum of radiation incident on the spectral encoder from the spatial intensity distribution of the radiation reflected (and/or transmitted) by the spectral encoder.

33 Claims, 70 Drawing Sheets

Related U.S. Application Data on Jun. 5, 2012, provisional application No. 61/744,862, filed on Oct. 3, 2012, provisional application No. 61/784,612, filed on Mar. 14, 2013.

(51) Int. Cl.

| | |
|---|---|
| *G01J 3/26* | (2006.01) |
| *G01J 3/28* | (2006.01) |
| *G02B 5/20* | (2006.01) |
| *G02B 5/22* | (2006.01) |
| *G02B 5/28* | (2006.01) |
| *H01L 31/0216* | (2014.01) |
| *H01L 31/0232* | (2014.01) |

(52) U.S. Cl.
CPC .............. *G01J 3/0218* (2013.01); *G01J 3/26* (2013.01); *G01J 3/2803* (2013.01); *G02B 5/207* (2013.01); *G02B 5/22* (2013.01); *G02B 5/223* (2013.01); *G02B 5/286* (2013.01); *H01L 31/02162* (2013.01); *H01L 31/02168* (2013.01); *H01L 31/02325* (2013.01); *G01J 2003/1213* (2013.01); *Y02E 10/50* (2013.01)

(58) Field of Classification Search
CPC ........ G01J 3/0208; G01J 3/021; G01J 3/0218; G01J 3/26; G01J 3/2803; G01J 2003/1213; H01L 31/12162; H01L 31/02168; H01L 31/02325; Y20E 10/50
USPC .................. 136/252–265; 359/2, 567; 283/86
See application file for complete search history.

(56) References Cited

U.S. PATENT DOCUMENTS

| | | | |
|---|---|---|---|
| 4,393,095 A | 7/1983 | Greenberg | |
| 4,401,690 A | 8/1983 | Greenberg | |
| 5,166,755 A | 11/1992 | Gat | |
| 5,342,681 A * | 8/1994 | Sulzbach | C23C 14/0617 428/307.3 |
| 5,801,383 A | 9/1998 | Wada et al. | |
| 5,978,141 A * | 11/1999 | Karwacki | B82Y 20/00 359/584 |
| 6,384,916 B1 | 5/2002 | Furtak | |
| 6,630,999 B2 | 10/2003 | Shroder | |
| 7,187,487 B2 | 3/2007 | Przybyla et al. | |
| 7,310,153 B2 | 12/2007 | Kiesel et al. | |
| 7,345,764 B2 | 3/2008 | Bulovic et al. | |
| 7,608,492 B2 | 10/2009 | Takayama et al. | |
| 7,749,621 B2 | 7/2010 | Greenberg et al. | |
| 7,761,053 B2 | 7/2010 | Kruzelecky et al. | |
| 7,864,256 B2 | 1/2011 | Yoon | |
| 8,187,908 B2 | 5/2012 | Gaebler | |
| 2004/0095645 A1 | 5/2004 | Pellicori et al. | |
| 2004/0219364 A1 | 11/2004 | Shirk et al. | |
| 2006/0251904 A1 * | 11/2006 | Ealey | G02B 5/08 428/426 |
| 2007/0279718 A1 * | 12/2007 | Einhorn | B41M 3/14 359/2 |
| 2009/0011145 A1 | 1/2009 | Yun et al. | |
| 2009/0183763 A1 * | 7/2009 | Meyer | H01L 31/02021 136/246 |
| 2010/0097613 A1 | 4/2010 | Saari | |
| 2010/0317133 A1 * | 12/2010 | Shaikevitch | G02B 5/02 438/27 |
| 2011/0039112 A1 * | 2/2011 | Itatani | C23C 14/024 428/426 |
| 2011/0106215 A1 | 5/2011 | Moffitt | |
| 2011/0122474 A1 | 5/2011 | Payne et al. | |
| 2011/0299167 A1 | 12/2011 | Woolf | |
| 2011/0315981 A1 | 12/2011 | Xu et al. | |
| 2012/0006781 A1 | 1/2012 | Jiang et al. | |
| 2012/0206726 A1 | 8/2012 | Pervez et al. | |

OTHER PUBLICATIONS

A. Chin and T. Y. Chang, "Multilayer reflectors by molecular-beam epitaxy for resonance enhanced absorption in thin high-speed detectors", J. Vac. Sci. Technol. B. 8,2 , (1990).
C. Chen, X. Yi, X. Zhao, and B. Xiong, "Characterizations of VO2-based uncooled microbolometer linear array", Sensors and Actuators A: Physical 90, pp. 212-214 (2001).
C. Hagglund, S. P. Apell, and B. Kasemo, "Maximized optical absorption in ultrathin films and its application to plasmon-based two-dimensional photovoltaics", Nano Letters 10, 3135 (2010), pp. A-G.
C. Wu, B. N Ill, and G. Shvets, "Large-area wide-angle spectrally selective plasmonic absorber", Physical Review B 84, pp. 075102-1 through 075102-7 (2011).
D. Ruzmetov, K. T. Zawilski, S. D. Senanayake, V. Narayanamurti, and S. Ramanathan, "Infrared reflectance and photoemission spectroscopy studies across the phase transition boundary in thin film vanadium dioxide", Journal of Physics: Condensed Matter 20, 465205 (2008) 6 pages.
F. Gervais and B. Piriou, "Anharmonicity in several-polar-mode crystals: adjustign phonon self-energy of LO and TO modes in Al2O3 and TiO2 to fit infrared reflectivity", J. Phys. C: Solid State Phys. 7, pp. 2374-2386 (1974).
H. Miyazaki and I. Yasui, "Substrates bias effect on the fabrication of thermochromic VO2 films by reactive RF sputtering", Journal of Physics D 39, pp. 2220-2223 (2006).
H. Noh, Y. Chong, A. D. Stone, and H. Cao, "Perfect coupling of light to surface plasmons by coherent absorption", Physical Review Letters 108, pp. 186805-1 through 186805-5 (2012).
H. S. Choi, J. S. Ahn, J. H. Jung, T. W. Noh, and D. H. Kim, "Mid-infrared properties of a VO2 film near the metal-insulator transition", Physical Review B vol. 54, No. 7 (1996), pp. 4621-4628.
H. Tao, C. M. Bingham, A. C. Strikwerda, D. Pilon, D. Shrekenhamer, N. I. Landy, K. Fan, X. Zhang, W. J. Padilla, and R. D. Averitt, "Highly flexible wide angle of incidence terahertz metamaterial absorber: design, fabrication, and characterization", Physical Review B 78, 241103(R) (2008), 4 pages.
Hen Dotan et al.,"Resonant light trapping in ultrathin films for water splitting," Nature Materials (Nov. 11, 2012) DOI: 10.1038/NMAT3477.
International Preliminary Report on Patentability for PCT/US2013/043851, dated Dec. 18, 2014.
International Search Report and Written Opinion dated Oct. 8, 2013 based on PCTUS201343851.
J. Hao, J. Wang, X. Liu, W. J. Padilla, L. Zhou, and M. Qiu, "High performance optical absorber based on a plasmonic metamaterial", Applied Physics Letters 96, 251104 (2010), 3 pages.
J. R. Tischler, M. S. Bradley, and V. Bulovic, "Critically coupled resonators in vertical geometry using a planar mirror and a 5 nm thick absorbing film", Optics Letters vol. 31, No. 13 Jul. 1, 2006, pp. 2045-2047.
K. K. Law, R. H Yan, L. A. Coldren, and J. L. Merz, "Self-electro-optic device based on a superlattice asymmetric Fabry-Rerot modulator with an on/off ratio 100:1", Applied Physics Letters 57, pp. 1345-1347 (1990).

(56) References Cited

OTHER PUBLICATIONS

K. Kishino, M. S. Unlu, J.-I. Chyi, J. Reed, L. Arsenault, and H. Morkoc, "Resonant cavity-enhanced (RCE) photodetectors", IEEE Journal of Quantum Electronics 27, Aug. 8, 1991, pp. 2025-2034.

Kats, M., et al., "Nanometre Optical Coatings Based on Strong Interference Effects in Highly Absorbing Media", Nature Materials, vol. 12, pp. 20-24, Oct. 14, 2012.

L. A. Gea and L. A. Boatner, "Optical switching of coherent VO2 precipitates formed in sapphire by ion implantation and annealing", Applied Physics Letters 68, pp. 3081-3083 (1996).

M. Diem, T. Koschny, and C. M. Soukoulis, "Wide-angle perfect absorber/emitter in the terahertz regime", Physical Review B 79, 033101-1 through 033101-4 (2009).

M. Gurvitch, S. Luryi, A. Polyakov, and A. Shabalov, "Nonhysteretic behavior inside the hysteresis loop of VO2 and its possible applications in infrared imaging", Journal of Applied Physics 106, pp. 104504-1 through 104504-15 (2009).

M. Gurvitch, S. Luryi, A. Polyakov, and A. Shabalov, "Nonhysteretic phenomena in the metal-semiconducting phase-transition loop of VO2 films for bolometric sensor applications", IEEE Transactions on Nanotechnology 9, pp. 647-652 (2010).

M. J. Dicken, K. Aydin, I. M. Pryce, L. A. Sweatlock, E. M. Boyd, S. Walavalker, J. Ma, H. A. Atwater, "Frequency tunable near-infrared metamaterials based on VO2 phase transition", Optics Express 17, 20 (2009), 10 pages.

M. M. Qazilbash, M. Brehm, B.-G. Chae, P.-C. Ho, G. O. Andreev, B.-J. Kim, S. J. Yun, A. V. Balatsky, M. B. Maple, F. Keilmann, H.-T. Kim, and D. N. Basov, "Mott transition in VO2 revealed by infrared spectroscopy and nano-imaging", Science 318, 1750 (2007) 22 pages.

M. Seo, J. Kyoung, H. Park, S. Koo, H. Kim, H. Bernien, B. J. Kim, J. H. Choe, Y. H. Ahn, H.-T. Kim, N. Park, Q-H. Park, K. Ahn, and D. Kim, "Active terahertz nanoantennas based on VO2 phase transition", Nano Letters 10, pp. 2064-2068 (2010).

M. Wuttig and N. Yamada, "Phase-change materials for rewriteable data storage", Nature Materials 6, pp. 824-833 Nov. 2007.

N. I. Landy, S. Sajuyigbe, J. J. Mock, D. R. Smith, and W. J. Padilla, "Perfect metamaterial absorber", Physical Review Letters 100, 207402 (2008), 4 pages.

N. J. Herrick and A. F. Turner, "A thin film optical cavity to induce absorption or thermal emission", Applied Optics 9, 9 (1970), pp. 2111-2114.

N. Liu, M. Mesch, T. Weiss, M. Hentschel, and H. Giessen, "Infrared perfect absorber and its application as plasmonic sensor", Nano Letters 10, pp. 2342-2348 (2012).

Nadia K. Pervez, et al., "Photonic crystal spectrometer" Optics Express 8285, Apr. 12, 2010, vol. 18, No. 8.

R. H. Yan, R. J. Simes, and L. A. Coldren, "Electroabsorptive Fabry-Perot Reflection Modulators with Asymmetric Mirrors", IEEE Photonics Technology Letters 1, 9 pp. 273-275(1989).

R. H. Yan, R. J. Simes, and L. A. Coldren, "Surface-normal electroabsorption reflection modulators using asymmetric Fabry-Perot structures", IEEE Journal of Quantum Electronics 27, pp. 1922-1931 Jul. 1991.

R. S. Scott and G. E. Fredericks, "Model for infrared detection by a metalsemiconductor phase transition", Infrared Physics 16, pp. 619-626 (1976).

Shin-Hyun Kim, et al., "Robust Chirped Photonic Crystals Created by Controlled Colloidal Diffusion" Angew. Chem. 2011, 123, 11853-11857.

T. Driscoll, H.-T. Kim, B.-G. Chae, B.-J. Kim, Y.-W. Lee, N. M. Jokerst, S. Petit, D. R. Smith, M. D. Ventre, and D. N. Basov, "Memory metamaterials", Science 325, pp. 1518-1521 (2009).

W. Wan, Y. D. Chong, L. Ge, H. Noh, A. D. Stone, and H. Cao, "Time-reversed lasing and interferometric control of absorption", Science vol. 331, pp. 889-892 (2011).

Y. D. Chong, L. Ge, H. Cao, and A. D. Stone, "Coherent perfect absorbers: time-reversed lasers", Physical Review Letters 105, 2 pages (2010).

Z. Yang, C. Ko, and S. Ramanathan, "Oxide electronics utilizing ultrafast metalinsulator transitions", Annual Review of Materials Research 41, pp. 337-367 (2011).

\* cited by examiner

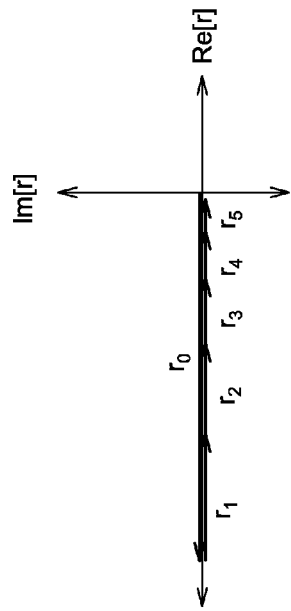
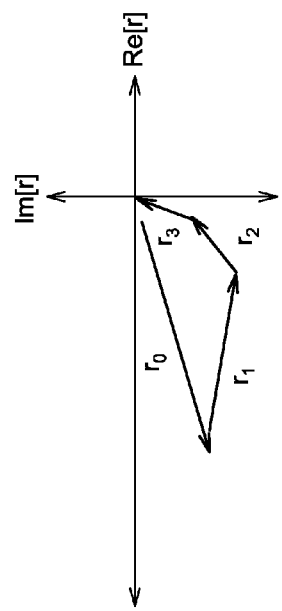
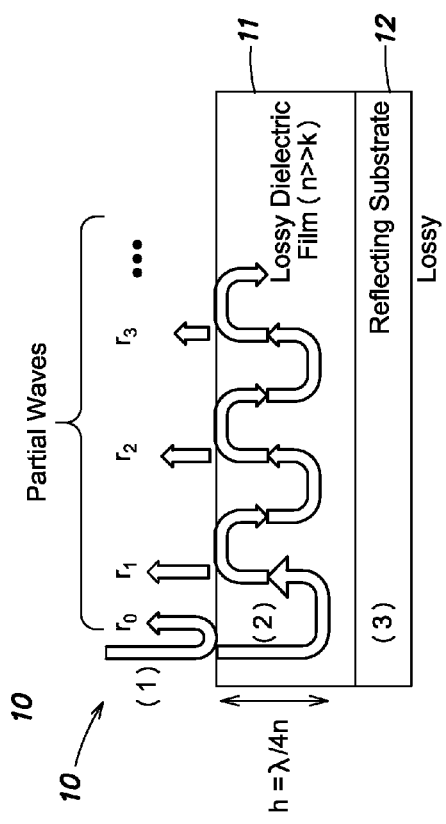
FIG. 1A
FIG. 1B
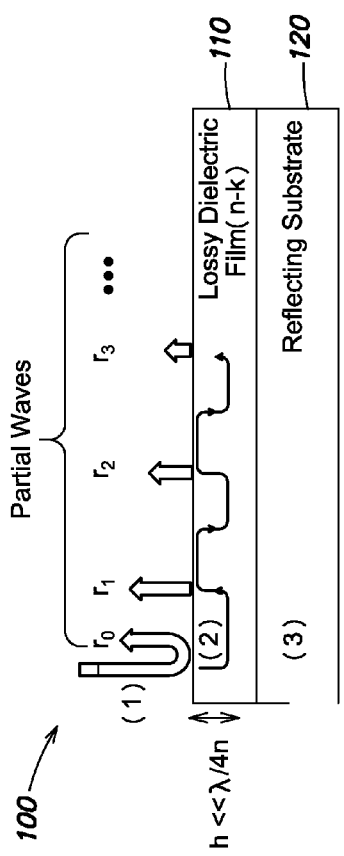
FIG. 1C
FIG. 1D

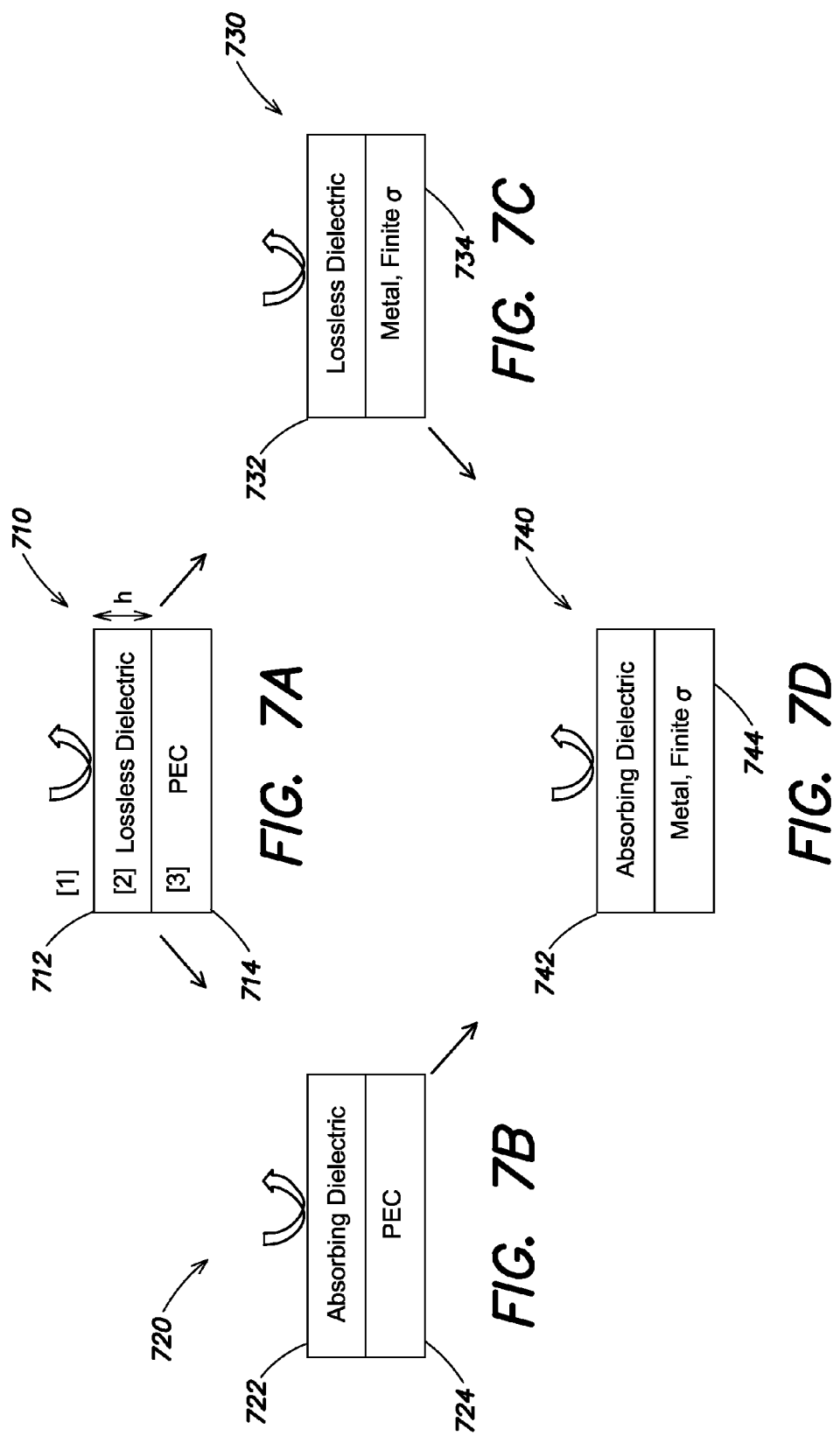

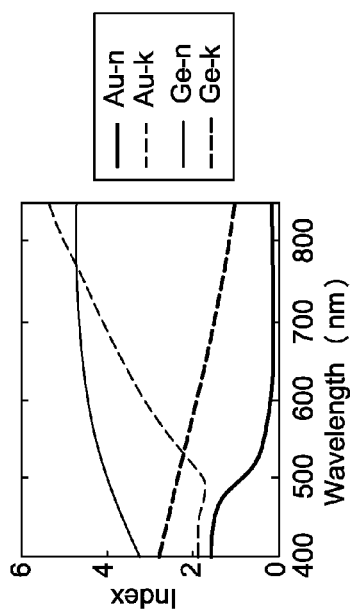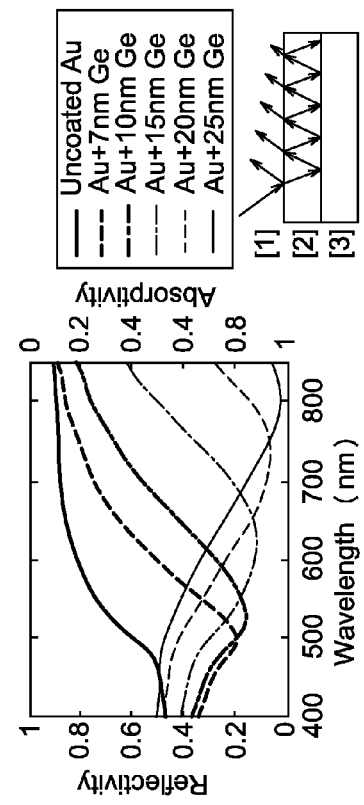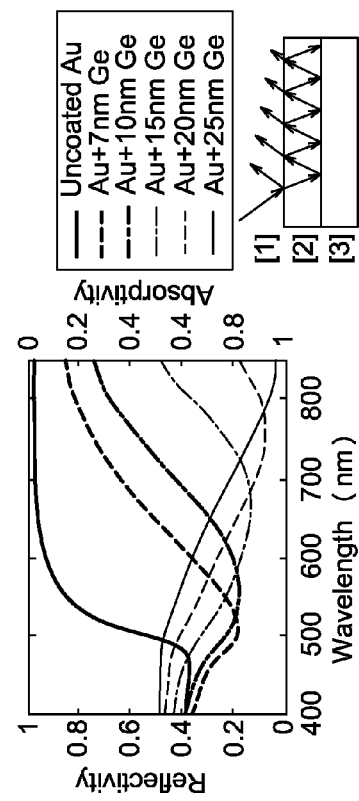
FIG. 8A
FIG. 8B
FIG. 8C

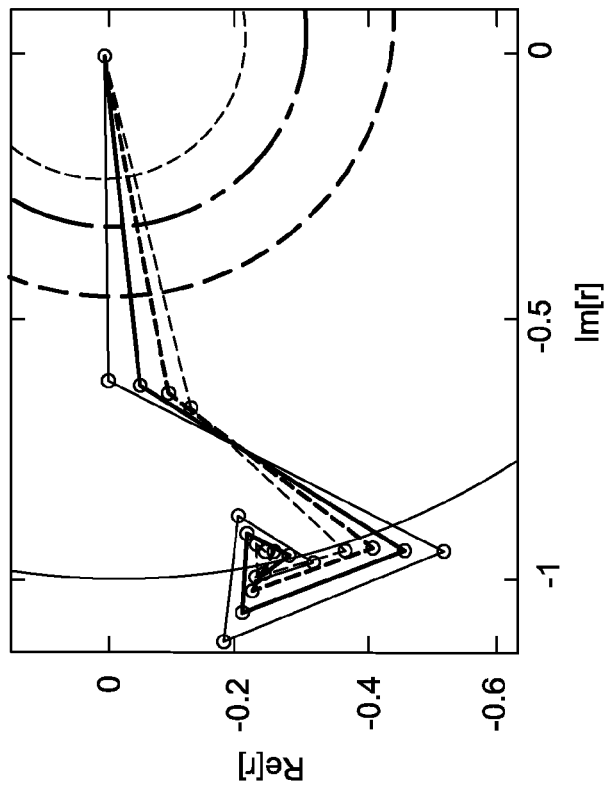
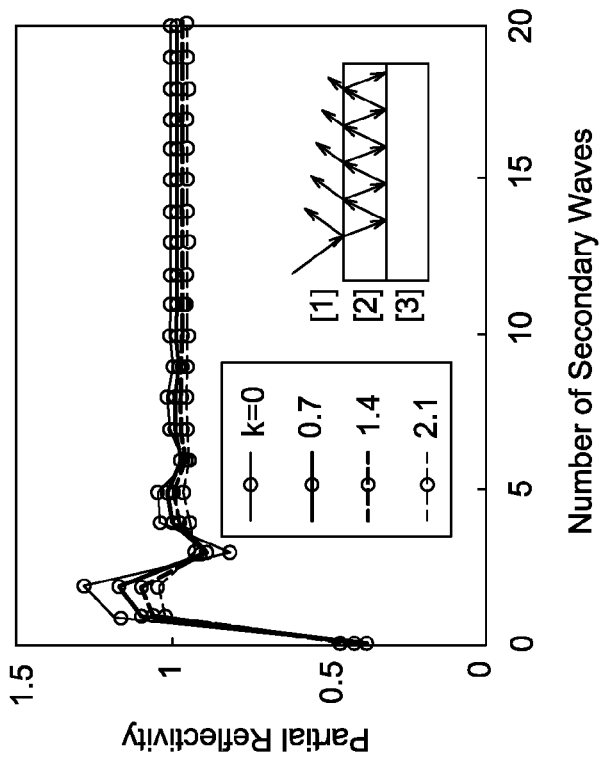
FIG. 14B
FIG. 14A

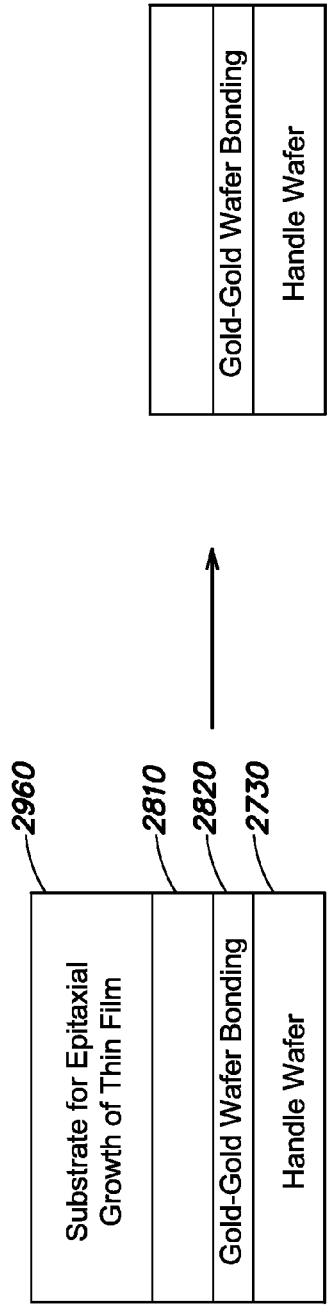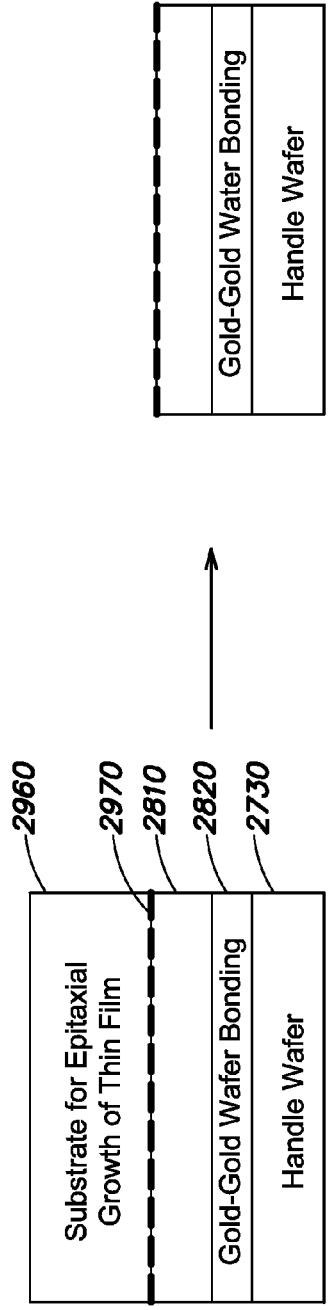

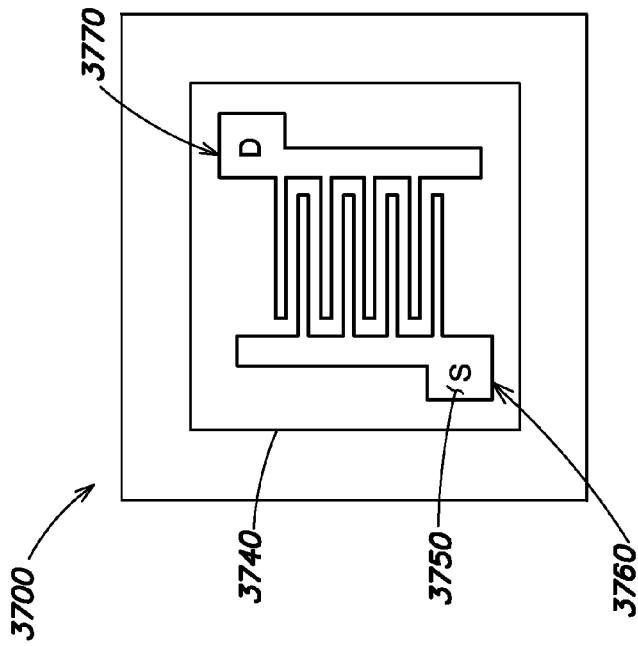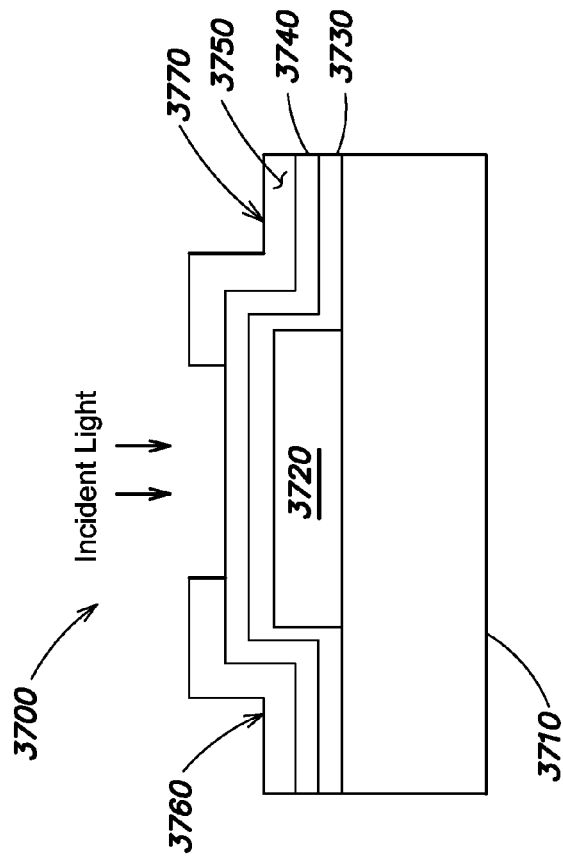

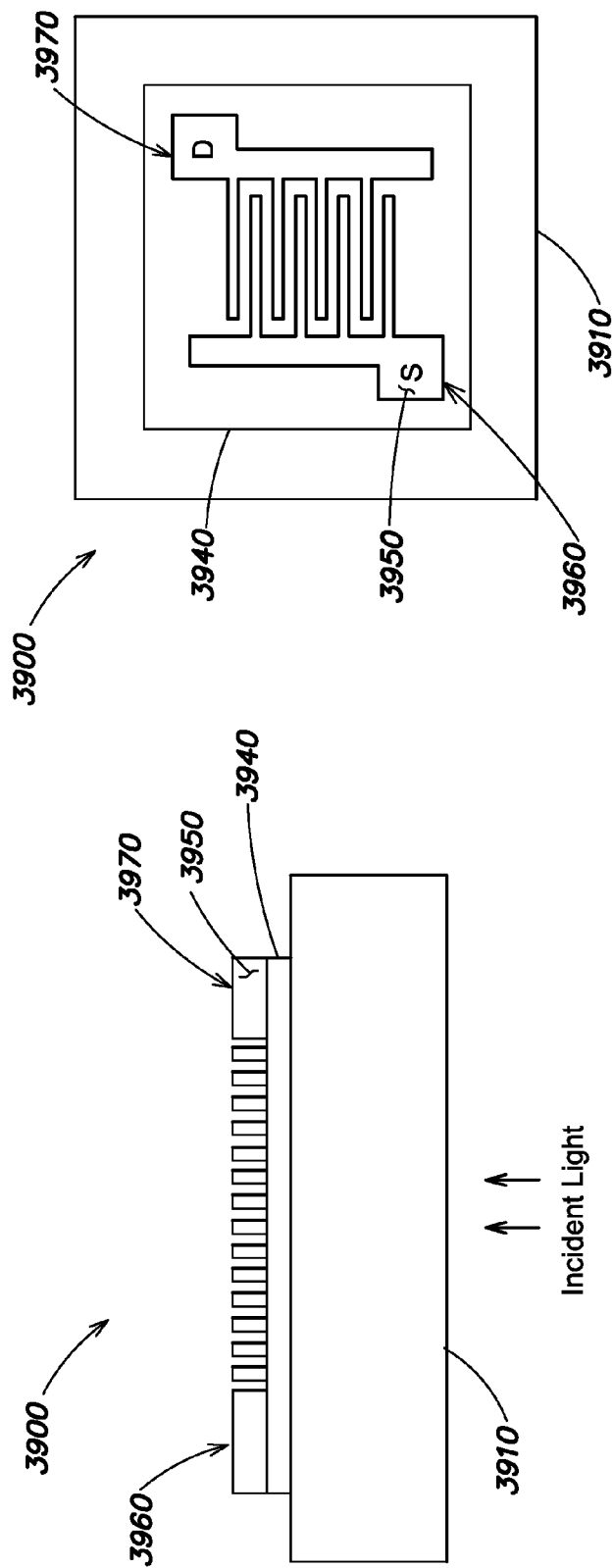

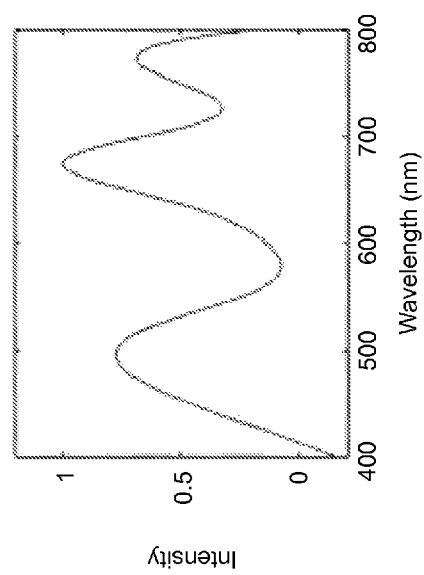
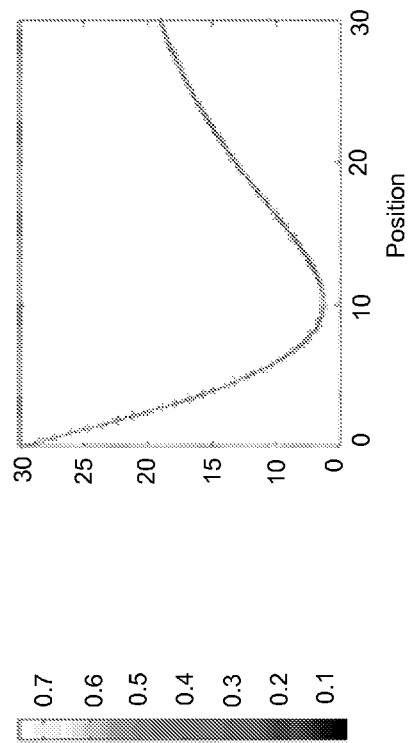
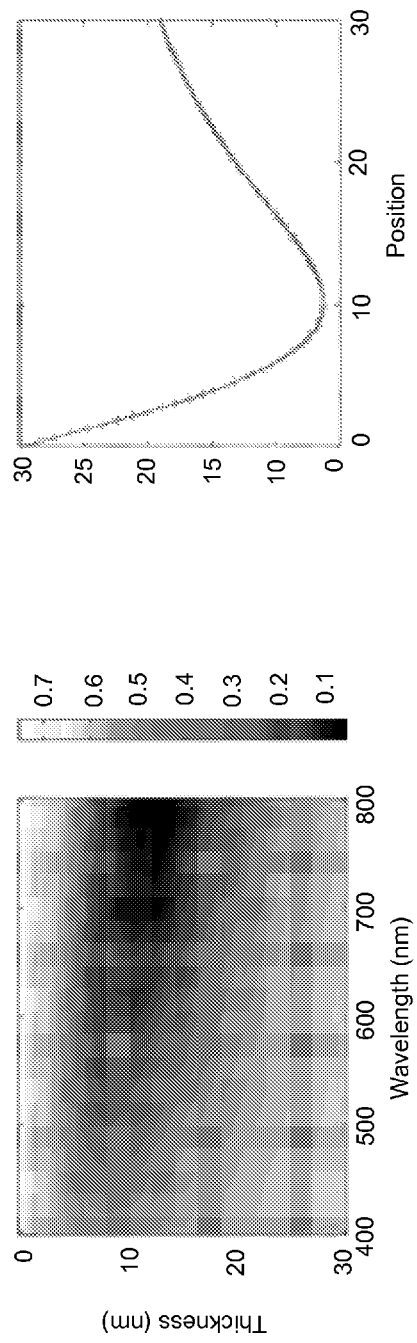
FIG. 50A
FIG. 50C
FIG. 50B

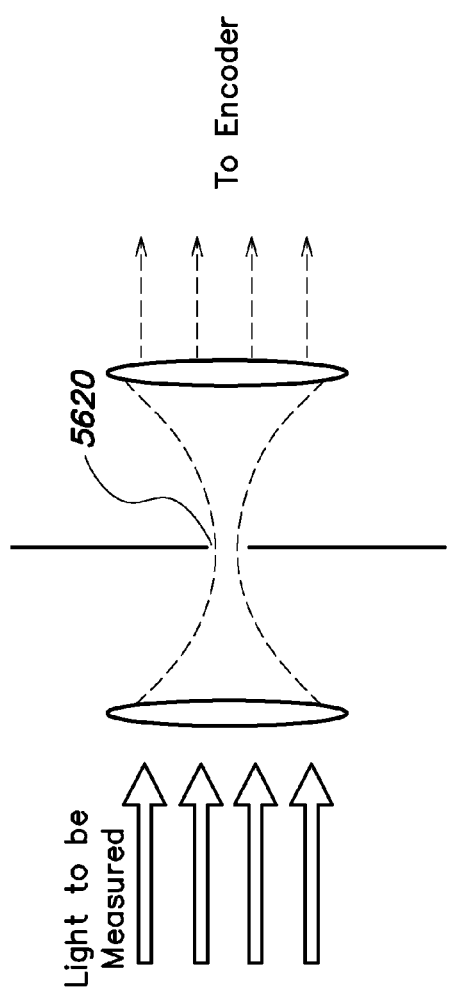
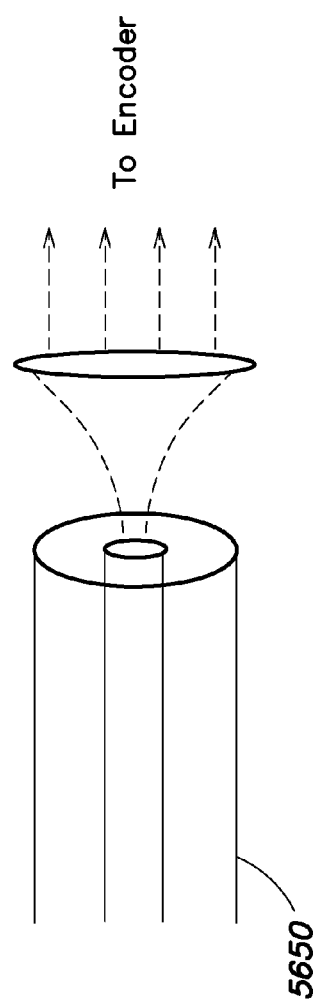
FIG. 56A
FIG. 56B

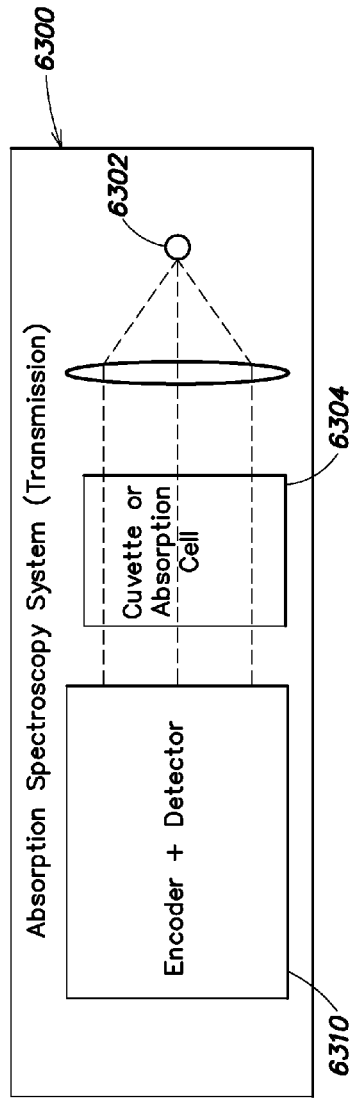
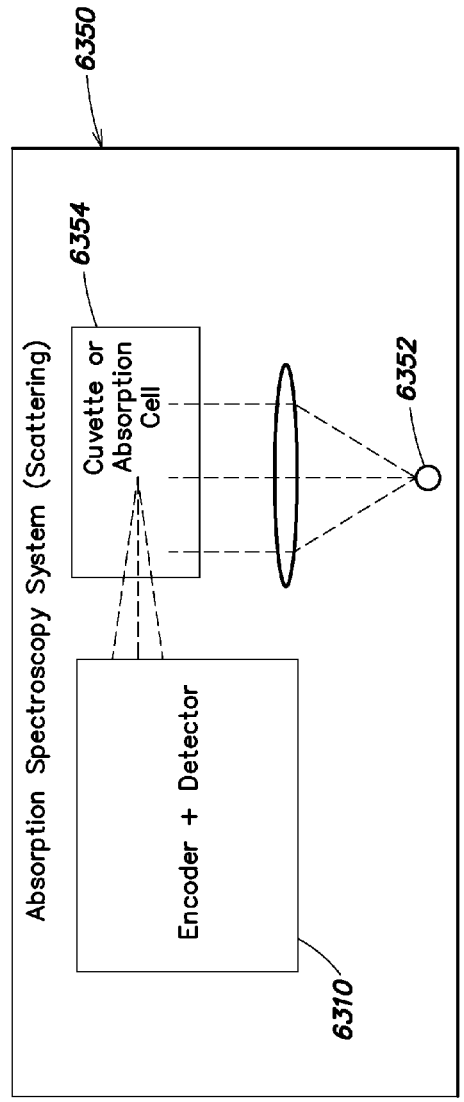
FIG. 63A
FIG. 63B

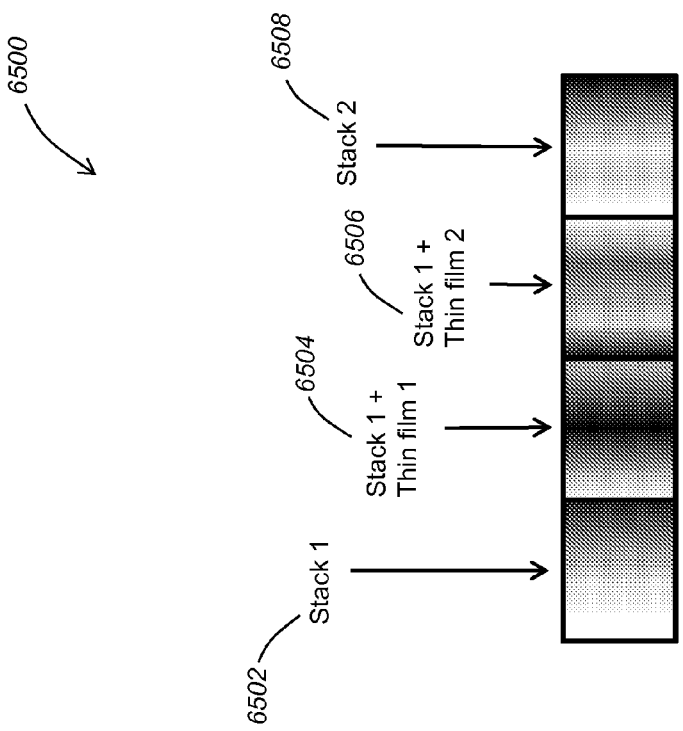
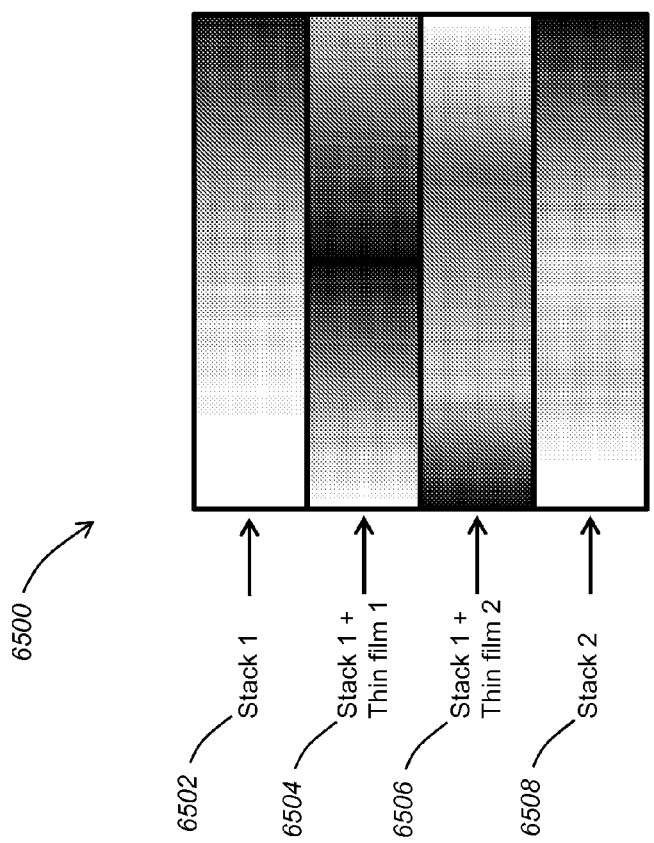
FIG. 65B
FIG. 65A

ULTRA-THIN OPTICAL COATINGS AND DEVICES AND METHODS OF USING ULTRA-THIN OPTICAL COATINGS

CROSS-REFERENCE TO RELATED PATENT APPLICATIONS

This application is a U.S. National Stage Application of PCT/US2013/043851 filed Jun. 3, 2013, which claims the priority benefit under of each of the following applications, each of which is incorporated herein by reference in its entirety:

U.S. Provisional Application No. 61/655,898, entitled "Optical Coatings" and filed on Jun. 5, 2012;

U.S. Provisional Application No. 61/655,905, entitled "Method and Apparatus for Tuning Radiation Absorption and Emission" and filed on Jun. 5, 2012;

U.S. Provisional Application No. 61/744,862, entitled "Optical Coatings" and filed on Oct. 3, 2012; and U.S. Provisional Application No. 61/784,612, entitled "Ultra-Thin Optical Coatings and Devices and Methods of Using Ultra-Thin Optical Coatings" and filed on Mar. 14, 2013.

GOVERNMENT SUPPORT

This invention was made at least in part with a Graduate Research Fellowship awarded by the National Science Foundation and Contract No. N66001-10-1-4008 awarded by Depart of Defense/DARPA. The government has certain rights in the invention.

BACKGROUND

Optical coatings, which include one or more films of dielectric or metallic materials, are widely used in both research and commercial applications from mirrors to eyeglasses to photography lenses. Many conventional dielectric coatings rely on Fabry-Perot-type interference, involving multiple optical passes through transparent layers with wavelength-scale thickness to achieve effects such as anti-reflection, high-reflection, and dichroism. Highly absorbing dielectrics are generally not used because wavelength-scale propagation through such media may limit coherent optical effects.

Conventional optical coatings generally comprise some combination of thin metallic films serving as partial and full reflectors, and wavelength-scale dielectric films which rely on Fabry-Perot-type or "thin film" interference—the same effect that is responsible for colorful patterns on oil films and soap bubbles. Common examples include anti-reflection (AR) and high-reflection (HR) coatings, which are often made by stacking layers of dielectrics with quarter-wave thickness ($\lambda/4n$, where n is an index of refraction of the material). These interference effects rely on multi-pass light circulation within the optical cavities formed by the films, and are typically very sensitive to the angle of incidence. By engineering multi-layer dielectric stacks, more complex and robust devices, such as omni-directional reflectors may be created—e.g., optical coatings are primarily designed and optimized by computer software. However, such a design may be time and cost intensive both to design and to fabricate.

SUMMARY

In view of the foregoing, the Inventors have recognized and appreciated the advantages of an article including ultra-thin, highly absorbing films on a reflecting substrate, which may selectively absorb the incident light at various frequency ranges. This property may be exploited in various inventive embodiments as set forth in greater detail below.

For instance, embodiments of the present invention include a spectrometer and corresponding methods of measuring a spectrum of incident radiation having a mean wavelength $\lambda$. In one example, the spectrometer comprises a spectral encoder and a detector. The spectral encoder includes a dielectric layer, with a refractive index n, an extinction coefficient k>0.5 (e.g., k≥1.0), a thickness that varies between about 0 and about $\lambda/4n$ as a function of transverse dimension (of the dielectric layer), and a transmission spectrum and/or reflectance spectrum that varies as a function of thickness. The detector is disposed to sense at least a portion of radiation transmitted or reflected by the dielectric layer. In operation, the detector provides a signal representative of an intensity of the radiation transmitted or reflected by the dielectric layer.

Depending on the example, the dielectric layer may comprise a semiconductor, a metal, a polymer, and/or a carbon-containing molecule. The dielectric layer may also comprises two or more sublayers, including a first sub-layer with a first refractive index $n_1$, a first extinction coefficient $k_1>0.5$, and a first thickness that varies between about 0 and about $\lambda/4n_1$ and a second sub-layer with a second refractive index $n_2$, a second extinction coefficient $k_2>0.5$, and a second thickness that varies between about 0 and about $\lambda/n_2$. In some cases, the first sub-layer completely or partially overlap the second sub-layer. The dielectric layer's thickness may vary linearly or nonlinearly with the dielectric layer's transverse dimension. For instance, the dielectric layer's thickness may vary between 0 nm and 60 nm (e.g., between 0 nm and 30 nm).

In at least one example, the detector comprises a first detector element and a second detector element. In operation, the first detector element may detect radiation transmitted or reflected by a first portion of the dielectric layer, and the second detector element may detect radiation transmitted or reflected by a second portion of the dielectric layer.

An exemplary spectrometer may also include a first actuator, mechanically coupled to at least one of the spectral encoder and the detector, that moves the spectral encoder with respect to the detector at a first velocity during operation of the spectrometer. Such an exemplary spectrometer may also include a mask, disposed in a path of the incident radiation, that defines an aperture which transmits at least some of the incident radiation towards the spectral encoder. A second actuator, mechanically coupled to the mask and/or the spectral encoder, may move the mask with respect to the spectral encoder at a second velocity during operation of the spectrometer.

In certain examples, the spectrometer also includes a processor that is operably coupled to the detector. In operation, the processor estimates the spectrum of the incident radiation based on (i) the signal representative of the intensity of the radiation transmitted or reflected by the dielectric layer and (ii) a transfer matrix representing the reflectance spectrum of the dielectric layer. This transfer matrix may be over-determined and/or rank-deficient. Such a spectrometer may also include a light source to illuminate the spectral encoder with a calibration beam having a known spectrum. In this case, the processor may estimate the transfer matrix based at least in part on the calibration beam's known spectrum and a signal from the detector representing a measured spectrum of the calibration beam.

In another embodiment, a spectral encoder comprises a substrate (e.g., a fully or partially reflecting substrate) and at least one dielectric layer. The dielectric layer is disposed on the substrate and has a refractive index n, an extinction coefficient k>0.5 (e.g., k≥1.0), and a thickness that varies between about 0 nm and about 300 nm (e.g., between 0 nm and 30 nm or between 0 nm and 60 nm) as a function of transverse dimension of the dielectric layer (e.g., linearly or nonlinearly). The dielectric layer may include a semiconductor, a metal, a polymer, and/or a carbon-containing molecule. It may include two or more sublayers, including a first sub-layer with a first refractive index $n_1$, a first extinction coefficient $k_1$>0.5, and a first thickness that varies between about 0 and about $\lambda/4n_1$, and a second sub-layer with a second refractive index $n_2$, a second extinction coefficient $k_2$>0.5, and a second thickness that varies between about 0 and about $\lambda/4n_2$. In some examples, the first sub-layer partially or fully overlaps the second sub-layer.

Embodiments of the present invention also include an apparatus and corresponding method for absorbing incident light having a wavelength λ. An exemplary absorber comprises a substrate having a reflectivity of less than 100%, a dielectric layer disposed on the substrate, and an actuator. The dielectric layer has a thickness of less than or equal to about λ/8 and comprises a material having a first state with an absorption loss $k_1$ and a second state with an absorption loss $k_2$>1.0. (The material may also have a first index of refraction $n_1$ in the first state and a second index of refraction $n_2$ in the second state.) The actuator is configured to switch the material between the first state and the second state so as to change the dielectric layer's absorbance. The absorber may also include a controller, operably coupled to the actuator, to modulate the absorbance of the dielectric layer.

In some embodiments, the substrate is opaque and can comprise sapphire, gold, silver, aluminum, a transparent conducting oxide (e.g., indium tin oxide, fluorine-doped tin oxide, and zinc oxide), or any other suitable material. The substrate can be selected to be reflecting, but with a complex index of refraction ñ on the order of the index of the dielectric, depending on the operating wavelength of the device (e.g., visible, near infrared, mid-infrared). For example, at about 11.75 μm (demonstration wavelength of the perfect absorber paper), the complex index of sapphire is approximately ñ=0.1+0.8i, due in part to phonon activity. This phonon activity makes sapphire suitable for operating wavelengths of, e.g., about 10 μm to about 15 μm and about 20 μm 25 μm. As understood by those of skill in the art, other materials may be chosen for other operating wavelengths, e.g., gold for visible wavelengths, silver or aluminum for ultraviolet wavelength, and so on.

In some embodiments, the material in the dielectric layer comprises at least one of a phase-change material, a quantum dot, a quantum well, a polymer, a dieletric-metal alloy, graphene, graphite, boron nitride, and metallic nanoparticles in a dieletric matrix. In some examples, the material in the dielectric layer undergoes a phase change during a transition from the first state and the second state. In these examples, the actuator may comprise a heater to heat the material from a first temperature to a second temperature so as to cause the material to undergo the phase change, and the controller may include a temperature sensor or probe to provide feedback so as to stabilize the material's temperature. The actuator may also comprise a gate or other device configured to induce the phase change by applying a current or voltage to the material or a light source (e.g., a laser or light-emitting diode) configured to induce the phase change by shining light on the material. Alternatively, the actuator may also be configured to induce the phase change by applying a strain on the material or by exerting pressure on the material.

Accordingly, provided in one embodiment is an article exposed to an incident light having a wavelength λ, the article comprising: a first layer, comprising a reflector; and a dielectric layer disposed over the first layer, the dielectric layer having a thickness h that is less than about λ/4n, wherein n is the index of refraction of the dielectric layer.

Provided in another embodiment is a method of making an article exposed to an incident light having a wavelength λ, the article comprising: disposing a dielectric layer over a first layer, wherein the first layer comprises a reflector and the dielectric layer has a thickness h that is less than about λ/4n, wherein n is an index of refraction of the dielectric layer.

Provided in another embodiment is a method of modulating incident light having a wavelength λ, the method comprising: exposing an article to the incident light, the article comprising: a first layer, comprising a reflector; and a dielectric layer disposed over the first layer, the dielectric layer having a thickness h that is less than about λ/4n, wherein n is an index of refraction of the dielectric layer.

Other embodiments include an article comprising a reflective layer and a dielectric layer disposed over the reflective layer, methods of modulating light using such an article, and methods of making such an article. The dielectric layer has an index of refraction n and a thickness that ranges from a maximum thickness that is less than about $\bar{\lambda}/n$ to a minimum thickness that is less than the maximum thickness, e.g., zero. In some cases, the thickness of the dielectric layer varies smoothly (e.g., linearly or nonlinearly) as a function of position along the surface of the substrate, such as from the maximum thickness to the minimum thickness. In other cases, the thickness of the dielectric layer varies in a discrete or stepwise fashion, either periodically or aperiodically, between the maximum thickness and the minimum thickness, or is constant.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A illustrates reflection from a quarter-wave film with low losses (k<<n) on a perfectly reflecting substrate at normal incidence, showing the partial waves, with, any multiple reflections are involved because of the small losses.

FIG. 1B is a phasor addition diagram (the complex reflected partial waves are represented in the complex plane) demonstrating that a quarter-wave film with a particular value of k (when k<<n) on a perfectly reflecting substrate can produce zero reflection via destructive interference, corresponding to complete absorption.

FIG. 1C illustrates reflection from a highly absorbing (e.g., k on the order of n), ultra-thin film according to embodiments of the present invention.

FIG. 1D is a phasor diagram demonstrating that a zero-reflection (and hence perfect absorption) condition is achievable if the complex refractive index of the film has a large imaginary component, according to embodiments of the present invention.

FIGS. 7A-7D show incident light from medium 1 (air) being reflected from a structure comprising different types of dielectric medium 2 and reflector medium 3.

FIG. 8A shows real and imaginary parts of the complex refractive indices of gold (Au) and germanium (Ge), obtained by variable angle spectroscopic ellipsometry in one embodiment.

FIG. 8B shows near-normal incidence(7°) reflection spectra of thick Au coated with 7, 10, 15, 20, and 25 nm of Ge (Inset: schematic of the Ge film on an Au substrate, showing a partial wave decomposition).

FIG. 8C shows calculated reflection spectra using Eqn. (1) and the optical constants in FIG. 2A corresponding to the measurement in FIG. 2B.

FIGS. 14A-14D show partial reflectivity and phasor diagrams of the sample in one embodiment.

FIGS. 29A and 29B illustrate processes for making an article with an ultrathin, highly absorbing layer on a reflective layer according to embodiments of the present invention.

FIGS. 37-44 illustrate thin-film photoconducting detectors according to embodiments of the present invention.

FIGS. 50A, 50B, and 50C show an incident spectrum, a transfer matrix, and a measured signal, respectively, for the spectral encoder of FIG. 49 according to embodiments of the present invention.

FIGS. 56A and 56B illustrate point illumination sources (apertures) suitable for using in spectrometers according to embodiments of the present invention.

FIGS. 63A and 63B illustrate transmission- and scattering-geometry spectrometers according to embodiments of the present invention.

FIGS. 65A and 65B are top and side views, respectively, of a multi-film spectral encoder according to embodiments of the present invention.

DETAILED DESCRIPTION

Figure 2B:
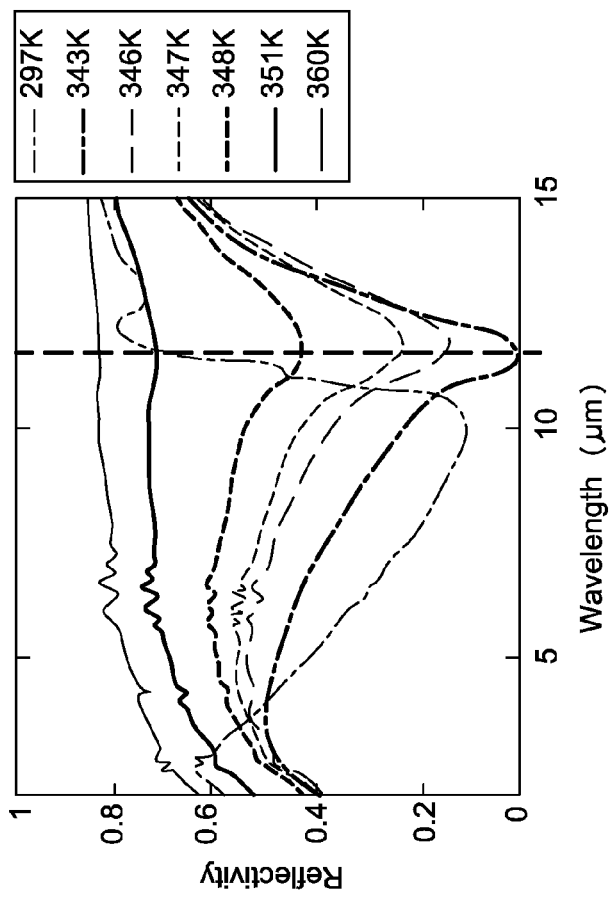
FIG. 2B is a plot of the experimental reflectivity spectrum at temperatures from 297 K to 360 K for the experimental setup of FIG. 2A.

Following are more detailed descriptions of various concepts related to, and embodiments of, inventive thin optical coatings and the methods related thereto. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Embodiments of the present invention include a tunable perfect absorber comprising an unpatterned, ultra-thin film of highly lossy material on a substrate that is opaque and partially reflecting. The absorber also includes an actuator that is electromagnetically (e.g., thermally, electrically, optically, or mechanically) coupled to the highly lossy material in the ultra-thin film. When actuated, the actuator causes the highly lossy material to switch from a first state in which the substrate and ultra-thin film act together to reflect at least some (e.g., 25%, 50%, 75%, or 100%) incident light to a second state in which it reflects less than 10% of the incident light (e.g., less than 5%, less than 1%, or less than 0.1%). For instance, such a tunable perfect absorber can be tuned from a first state with a reflectively of about 80% or more to a second state with a reflectivity of about 0.25% or less at a wavelength of about 11.6 µm. The low reflectivity in this second state occurs because the incident light interacts with the ultra-thin film and the underlying substrate in a way that causes the absorber to absorb all or nearly all of the incident light to be absorbed through critical coupling. As explained in greater detail below, critical coupling in exemplary devices involves very few optical round trips through the absorbing ultra-thin film.

Tunable materials can also be used to change the spectral position of the reflectivity minimum in the critical coupling state by significantly changing the real and/or imaginary components of the ultra-thin layer's complex refractive index and/or ultra-thin layer's thickness h (via, for example a soft polymer layer).

As stated above, the ultra-thin film has a thickness that is significantly smaller than the wavelength of the incident light. More specifically, the term "ultra-thin film" as used herein refers to a film whose thickness is anywhere from about one-eighth the wavelength of light as measured in the film to a thickness of about one atom or molecule. The film's thickness may be a specific value based on the wavelength of operation, the highly lossy material's complex refractive index at this wavelength, and the substrate's complex refractive index at this wavelength. This specific value can be determined by calculating a minimum value for the reflectivity given by Equation (1) (below) in the limit of high losses and very thin film. In some examples, this calculation may yield a film thickness of about $\lambda/8n$, $\lambda/10n$, $\lambda/20n$, $\lambda/25n$, $\lambda/50n$, $\lambda/75n$, $\lambda/100n$, $\lambda/200n$, or any other suitable value, where $\lambda$ is the wavelength of light and n is the real portion of the material's index of refraction.

The ultra-thin film is comprised of a "highly lossy dielectric material" whose absorption loss can be tuned to a desired value. As understood by those of skill in the art, a dielectric can be characterized by a respective complex index of refraction $\tilde{n}=n+ki$, where n is proportional to the phase velocity of light propagating through the material and k represents the absorption loss experienced by light propagating through the material. In a highly lossy dielectric material, k is equal to or greater than 0.5 (e.g., k>1.0, k>1.2, k>1.5). For instance, k may be equal to about 1.0, 1.1, 1.25, 1.5, 1.75, 2.0, or any other suitable value in a highly lossy film. Films with suitable values of k can be made from materials including, but not limited to: metal-dielectric alloys (e.g., SiAl alloys); metal-doped dielectrics; doped semiconductors (e.g., highly doped semiconductors); semiconductors whose bandgap energy is below the photon energy of the incident radiation; graphene; phase-change material (e.g., $VO_2$); quantum wells; quantum dots; polymers; and organic materials.

In some embodiments, the highly lossy dielectric material has a tunable absorption loss k. This absorption loss can be tuned between discrete values (e.g., in the case of a nonlinear material or in the case of an actuator configured to switch a material among two or more states) or among a continuous range of values using any one of a variety of suitable tuning techniques. For instance, the highly lossy dielectric material's absorption loss can be tuned by changing the material's temperature, by illuminating the material with light at a particular wavelength, by subjecting the material to a magnetic field, by changing the orientation of a magnetic field applied to the material, by applying a voltage across the material, by running a current through the material, or by applying strain or pressure to the material. Those of skill in the art will appreciate that other tuning mechanisms are possible as well.

Exemplary lossy materials can be tuned with a suitable actuator, such as a heating element, a voltage supply, a current supply, a magnetic field generator, or a light source. For example, the actuator may include a resistive element or thermo-electric cooler that is implanted in or on the substrate or otherwise disposed in thermal communication with the ultra-thin film. Alternatively, the actuator may include two or more electrical contacts disposed on the substrate and configured to run a current through the substrate so as to heat the ultra-thin film.

The absorption loss k of the ultra-thin film (lossy dielectric material) can also be tuned with an electric field (e.g., in the case where the dielectric material comprises quantum wells, quantum dots, graphene, highly doped semiconductor material, etc.). In such a case, the actuator may include an electrode that is transparent at the operating wavelength disposed on the ultra-thin film opposite the substrate, which is conductive or coated with a conductive layer. Applying a voltage across the ultra-thin film via the transparent electrode and the substrate/conductive layer causes a change in the ultra-thin film's absorption loss k. Alternatively, or in addition, the properties of the back reflector 1 could be tuned (optically or electrically), e.g., using a highly doped semiconductor as a THz reflector.

The tunable absorbers disclosed herein can be made using any suitable deposition technique and thus can easily be made to cover a large area. Ultra-thin films of highly lossy material can be deposited, disposed, or otherwise formed on a substrate that is an imperfect or partial reflector, i.e., a substrate that reflects less than 100% of incident light. The ultra-thin film can be deposited onto the substrate using any suitable deposition technique, including but not limited to: sputtering, molecular beam epitaxy, chemical vapor deposition, atomic layer deposition, spin coating, electron beam evaporation, thermal evaporation, electroplating, and chemical synthesis.

The substrate may be reflecting and have a complex index that is on the order of the index of the lossy material. The substrate should have a thickness that is equal to or thicker than the skin depth in the material at the operating wavelength. As understood by those of skill in the art, the skin depth is defined as $\lambda/(2\pi k_3)$. For instance, for $k_3=0.8$ at an operating wavelength of about 12 µm, then the skin depth is about 2.4 µm, the substrate should be at least 2.4 µm thick.

Some embodiments of the inventive perfect absorbers may also include a transparent or translucent layer disposed on the ultra-thin film opposite the substrate. This transparent or translucent layer may be a dielectric material, such as a glass or polymer, that has relatively low loss, e.g., loss characterized by k<<1.0 (e.g., k<0.2).

Vanadium Oxide Perfect Absorbers

Some ultra-thin films may include a phase-change dielectric material, such as vanadium dioxide ($VO_2$) or another correlated oxide, that is close to an insulator-metal phase transition (IMT). In this transitional state, the film comprises nanoscale structures of metallic- and insulator-state $VO_2$, and the resulting effective medium behaves as a tunable disordered metamaterial with very high optical absorption at infrared frequencies. As described below, for an absorber with a $VO_2$-based film, heating the $VO_2$ above its IMT temperature of about 68° C. causes the absorber's reflectivity to increase by a factor of about 300. What is more, the IMT in $VO_2$ occurs on a picosecond timescale and can be triggered thermally, optically, or electrically, making $VO_2$-based components promising for fast optoelectronic devices, including but not limited to bolometers, modulators, optical memory/buffers, and tunable thermal emitters (thermal emission is closely linked to absorption via Kirchhoff's law of thermal radiation).

For instance, one embodiment of a perfect absorber comprises a film of vanadium dioxide ($VO_2$) with a thickness of about $\lambda/65$ deposited on an opaque substrate. $VO_2$ is a correlated oxide that undergoes an insulator-metal phase transition (IMT) at a temperature of about 68° C. By utilizing an intermediate state of the IMT in VO$_2$ which exhibits multiple co-existing phases, an effective medium with tunable optical properties is formed. In particular, the absorption coefficient can be very large in proximity to the IMT, and can be tuned by controlling the transition. The absorption in our device is greatly enhanced via critical coupling to a cavity resonance which exists in the ultra-thin film as a result of non-trivial optical phase shifts at the interfaces between highly-absorptive media. (Because the absorption exhibits a tunable cavity resonance, it could be used as an optical memory or buffer that stores incident light for brief periods.) Thermal control of the phase co-existence in the VO$_2$ film enables switching of the absorption from about 20% to about 99.75% at $\lambda$=11.6 μm. This exemplary device combines the deep-subwavelength thickness characteristic of nanostructure-based perfect absorbers with the wide tuning capability typical of asymmetric FP cavities in a single film deposited on a reflecting substrate. This approach can be used to implement modulators, buffers (memories), thermal emitters, bolometers, and other devices as described below.

To see how this device works, consider light incident from air (n$_1$=1) onto a dielectric film with complex refractive index n$_2$+ik$_2$, deposited on a substrate with index n$_3$+ik$_3$ as shown in FIG. 1A. The reflection can be calculated as the coherent sum of the partial waves reflected from the first interface (with reflection coefficient r$_0$) and those reflected from the cavity after 1, 2, . . . , m roundtrips with reflection coefficients r$_1$, r$_2$, . . . , r$_m$. Writing the total reflectivity R=|r|$^2$, in terms of the reflection coefficient yields:

$$r = \sum_{m=0}^{\infty} r_m = \frac{r_{12} + r_{23}e^{2i\beta}}{1 + r_{12}r_{23}e^{2i\beta}} \quad (1)$$

where $r_{pq}=(\tilde{n}_p-\tilde{n}_q)/(\tilde{n}_p+\tilde{n}_q)$ and $t_{pq}=2\tilde{n}_p/(\tilde{n}_p+\tilde{n}_q)$ are the Fresnel reflection and transmission coefficients as the wave encounters medium p from medium q; $\tilde{n}_p=n_p+ik_p$ is the complex refractive index of medium p; $\beta=2\pi n_2 h/\lambda_0$; and $r_m=t_{12}r_{23}{}^m r_{21}{}^{(m-1)}t_{21}\exp(2mi\beta)$ for m>0.

When k$_2$ n$_2$, Eqn. (1) describes the reflection properties of a simple asymmetric FP cavity with small optical losses. On resonance, light is stored for many optical cycles and is gradually absorbed as it circulates; most FP modulators and RCE detectors operate in this manner. Such a cavity 10 is illustrated in FIG. 1A, with a dielectric film 11 deposited on a reflecting substrate 12. In the partial wave picture, the first reflection r$_0$ has a phase of about π and thus the corresponding phasor points to the left, predominantly along the real axis in the complex plane as shown in FIG. 1B. The front facet reflection can be cancelled out if the partial waves emerging from the film each have a phase of about 0 and the phasor trajectory terminates precisely at the origin; this occurs when the thickness h of the dielectric is an odd integer multiple of $\lambda$/4n (if the reflection phase from the substrate is π) and the reflectivity |r$_{12}$|$^2$ is equal to the effective bottom mirror reflectivity |r$_{23}$exp (2i β)|, as can be seen from Eqn. (1). This is the critical coupling condition for asymmetric FP cavities, which has also been interpreted from the viewpoint of coherent perfect absorbers (CPA) where the resonant absorption process can be viewed as time-reversed lasing at threshold.

In other words, FIG. 1B shows that a quarter-wave film on a reflecting substrate can produce zero reflection via destructive interference, corresponding to complete absorption. This destructive interference occurs for a particular value of k which is relatively small, leading to a small imaginary part of r$_0$, and corresponding to critical coupling. The phase of the first partial wave r$_0$ is about equal to π with respect to the incident wave, but the phase of all of the other partial waves is about equal to 0.

The phasor diagram in FIG. 1D suggests another route to achieving the perfect absorption condition. In this route, the exact phasor trajectory does not matter as it returns to the origin. One of the possible trajectories in which the phase of r$_0$ is not π is shown in FIG. 1D. The interface reflection phase shifts become substantially different from 0 and π when at least one of the materials has k comparable to n. As a result a resonance can exist for a film 110 that is much thinner than the wavelength of light and disposed on a reflecting substrate 120, and critical coupling to this ultra-thin resonance yields a perfectly absorbing state as shown in FIG. 1C. In other words, FIG. 1C shows a "perfect absorber" 100 that uses this condition to enhance absorption, e.g., using the intermediate phase state in the IMT in VO$_2$ to introduce a large, controllable degree of loss.

Put differently, FIG. 1D shows that a zero-reflection (and hence perfect absorption) condition is achievable if the complex refractive index of the film has a large imaginary component. In this case, the phase of r$_0$ deviates from π (the phasor is not along the horizontal axis) and a small number of reflections is sufficient to both cancel r$_0$ and increase (e.g., maximize) absorption.

VO$_2$ is a correlated oxide that undergoes a thermally triggered IMT around T$_c$~340K, which takes the material from an insulating state (band gap of about 0.6 eV) to a metallic one. During the IMT, the band gap collapses and nanoscale islands of the metallic phase emerge in the surrounding insulating VO$_2$, which then grow and connect in a percolation process. The IMT in VO$_2$ is the target of active research and holds promise for the realization of novel electronic switching devices that may complement MOSFET technology. In the optical regime, the metal-dielectric phase co-existence during the IMT makes VO$_2$ a tunable effective medium with largely varying optical properties. The IMT has been utilized for optical switching, and has enabled several tunable devices comprising metallic nanostructures on VO$_2$ films.

In one example, an exemplary device comprises a crystalline film of VO$_2$ with a thickness of 180 nm grown on a c-plane sapphire substrate. The roughly 180 nm thick VO$_2$ thin film was grown on a single-side-polished c-plane sapphire substrate (1 mm thick) using magnetron sputtering from a V$_2$O$_5$ target at 550° C. under 10 mTorr pressure with 100 sccm Ar gas flow rate at a power of 120 W. The thickness was checked with a scanning electron microscope (SEM) after milling a cross-section with focused ion beam (FIB).

Reflectance Measurements and Calculations

Figure 2A:
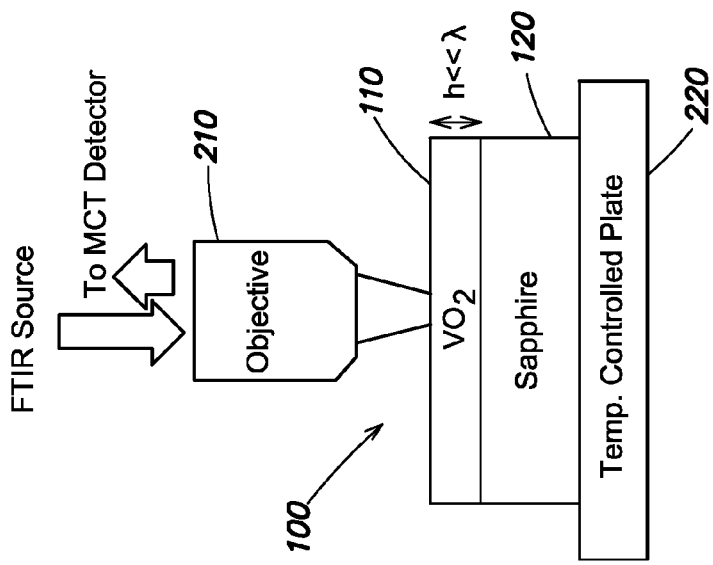
FIG. 2A illustrates an experiment setup according to embodiments of the present invention.

The absorption of the perfect absorber 100 was investigated via normal incidence measurements using a Fourier transform infrared (FTIR) spectrometer and mid-IR microscope 210 as shown in FIG. 2A: The setup includes a sapphire substrate 120 coated with a thin film 110 (h=180 nm) of VO$_2$ placed on a temperature-controlled stage 220 mounted inside an infrared microscope and illuminated at normal incidence using a mid-IR source. A liquid nitrogen-cooled mercury-cadmium-telluride (MCT) detector collects the reflected light.

More specifically, FIG. 2A shows that the sample was mounted on a temperature controlled stage (Bruker Optics A599, 1° temperature deviation) inside a mid-infrared (MIR) microscope (Bruker Optics Hyperion 2000). A reflective objective (15×, NA=0.4) was used to focus an unpolarized beam from a MIR Globar source mounted in an FTIR spectrometer (Bruker Optics Vertex 70) onto the sample from the $VO_2$ side, with the reflected light collected by the same objective and sent to the MCT detector. To normalize the reflectance spectra, a reference spectrum was taken in transmission mode utilizing a second identical objective to collect the light. An additional sample was fabricated under different growth conditions and measured with the same setup; these measurements are presented in the next section.

Figure 3:
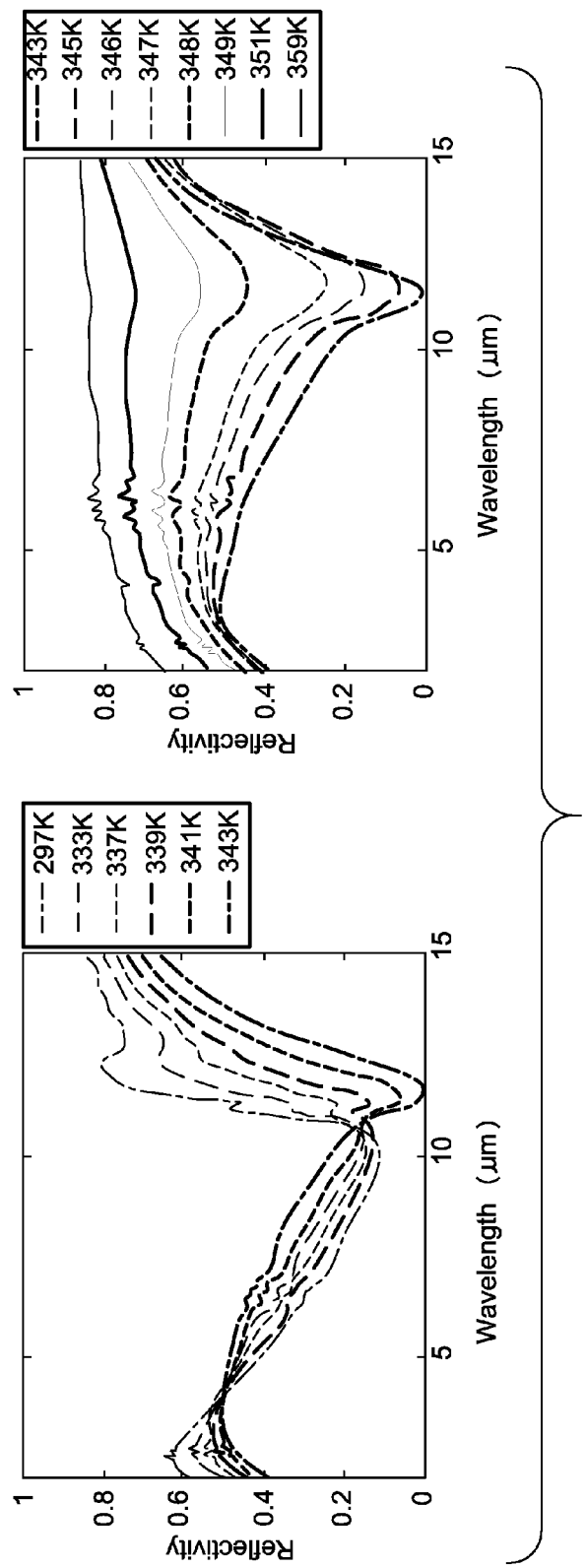
FIGS. 3A and 3B are plots of the measured reflectance of $VO_2$ for increasing temperature for temperatures up to 343 K and above 343 K, respectively.

FIGS. 2B, 3A, and 3B are plots of the measured reflectivity spectra from a $VO_2$ film on a sapphire substrate for several different temperatures collected while gradually increasing the device's temperature from 297 K to 360 K at 1 K increments. The 297 K curve in FIG. 2B is representative of the reflection spectrum at a temperature significantly below Tc. Since insulating $VO_2$ is transparent at energies below the band-gap, the primary features are due to the underlying sapphire. Sapphire is highly absorptive at $\lambda \approx 5$-10 µm despite its large band gap in due to the presence of several phonon modes, which also result in high reflectivity between 10 µm and 15 µm. The $VO_2$ thickness is much smaller than the wavelength of the incident light, so no FP fringes are observed. The small features at about 3 µm, about 4.5 µm, and about 6 µm correspond to ambient atmospheric absorption. At high temperatures (e.g., the 360 K curve in FIG. 2B), the $VO_2$ is entirely in the metallic phase, and displays relatively high reflectivity which slowly increases with increasing wavelength, as expected for a Drude-like metal.

Figure 2C:
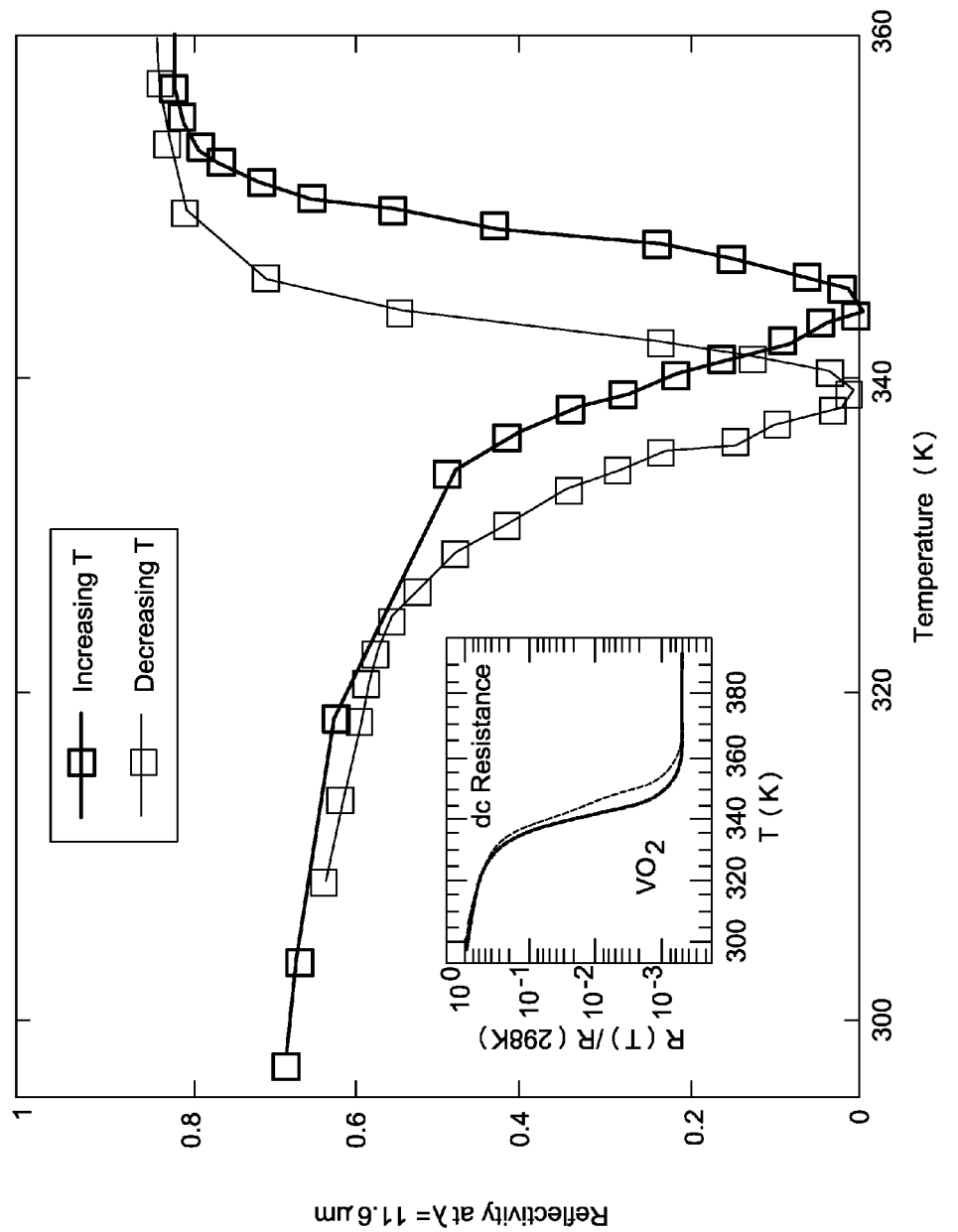
FIG. 2C is a plot of experimental reflectivity from the experimental setup shown in FIG. 2A at $\lambda=11.6$ μm as a function of increasing (red) and then decreasing (blue) temperature. A hysteresis of about 5 K is seen in the reflectivity. The inset shows the normalized dc resistance of the $VO_2$ thin film sample as a function of temperature showing nearly four orders of magnitude of change in the resistance and hysteretic behavior.

The reflectivity spectrum does not transition monotonically from that of the low-temperature state to that of the high-temperature one due to the complex interplay between the effective medium formed when the $VO_2$ is in an intermediate state and the underlying sapphire substrate. In particular, the feature at $\lambda \sim 11.6$ µm (represented by the vertical dashed line in FIG. 2B) shows that the reflectivity is ~0.7 with the $VO_2$ in the insulating state (at room temperature) due to the high reflectivity of the underlying sapphire, and ~0.8 with the $VO_2$ in the metallic state (T=360K). At T=343K, however, the reflectivity abruptly drops to approximately 0.0025, corresponding to a reduction by a factor ~280 with respect to the low-temperature insulating state and by a factor ~320 with respect to the high-temperature metallic state. Since the sapphire substrate is opaque at this wavelength, this corresponds to a 99.75% absorbance within the $VO_2$ film and the top part of the substrate. The reflectivity spectrum has a hysteresis of approximately 5K as shown in FIG. 2C, comparable to the dc resistance hysteresis width of the $VO_2$ film (shown in the inset of FIG. 2C). The normalized dc resistance R(T)/R(298K) exhibits a change of more than three orders of magnitude between 298K and 393K.

Figure 2D:
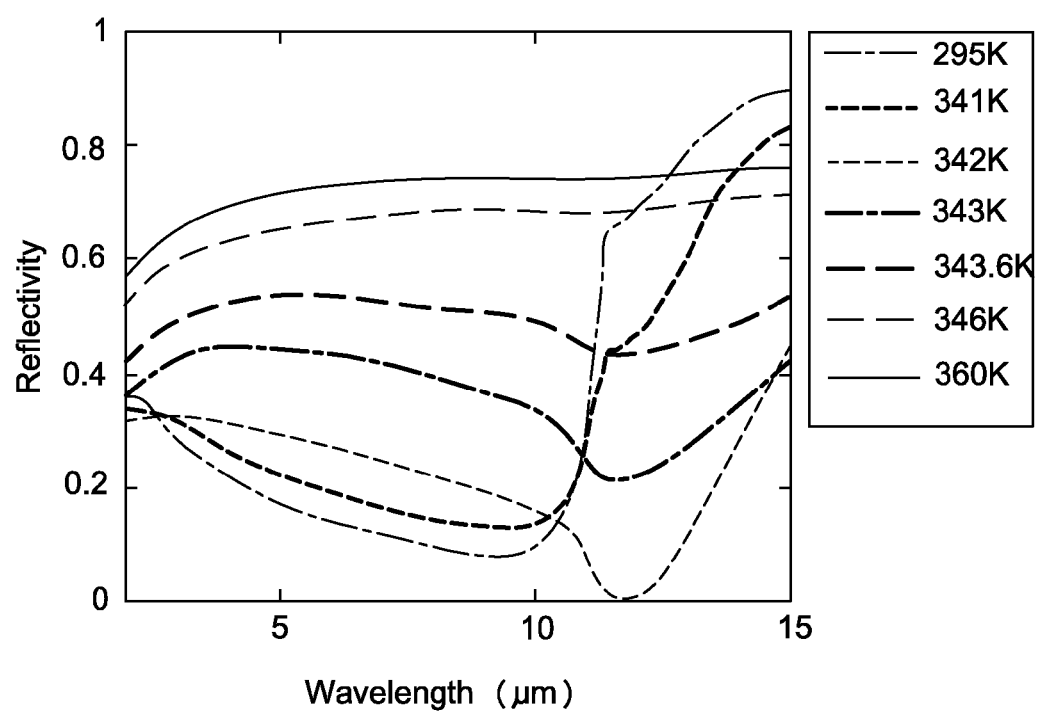
FIG. 2D is a plot of the calculated reflectivity spectrum at temperatures from 295 K to 360 K for the experimental setup of FIG. 2A using experimental values for the complex refractive indices of $VO_2$ and sapphire.

Computing Eqn. 1 with the temperature-dependent complex refractive indices for $VO_2$ (for increasing temperature) experimentally obtained by ellipsometry, and previously determined indices for sapphire yields the theoretical reflectivity of this experimental device. The calculated spectra match up well with the experimental data across the entire $\lambda$=2-15 µm range as shown in FIGS. 2B and 2D, though the temperatures at which the various spectral features occur differ by 2-5 degrees. This variation is due to the differences in growth conditions between the experimental $VO_2$ sample and the one used as the basis for the ellipsometry measurements. The predicted reflectivity minimum is ~0.0007 at $\lambda$=11.75 µm and T~342K, compared to the experimental data which showed a minimum value of about 0.0025 at $\lambda$=11.6 µm and T=343K.

Calculating the reflectivity for an unknown homogeneous dielectric of the same thickness as the $VO_2$ layer leads to a better understanding of the conditions leading to perfect absorption. In these calculations, the unknown homogeneous dielectric was taken to have a complex refractive index ñ=n+ik.

Figure 4A:
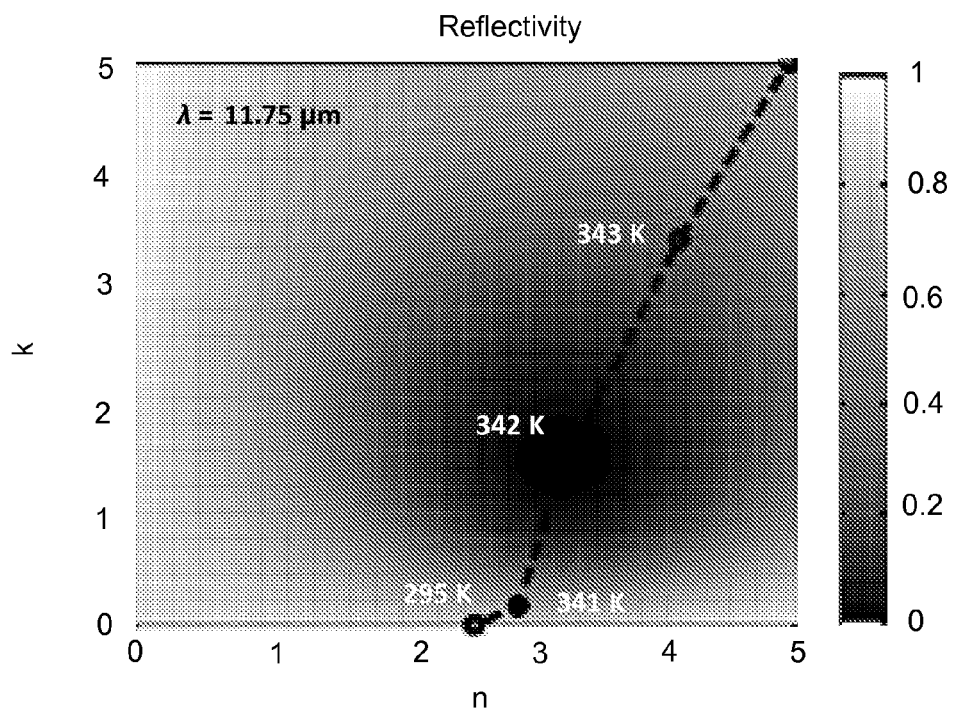
FIG. 4A is a map of the calculated reflectivity as a function of n and k, the real and imaginary parts of the complex refractive index ñ, of a uniform dielectric film of 180 nm thickness on sapphire for $\lambda=11.75$ μm.

FIG. 4A is a plot of the calculated reflectivity at $\lambda$=11.75 µm as a function of n and k, covering a wide range of potential values of ñ for the material comprising the thin film. The black dashed line marks the trajectory of the complex refractive index of $VO_2$ with increasing temperature. The complex index of sapphire at this wavelength was taken to be about 0.1+0.8i. For ñ=3.25+1.5i, the calculated reflectivity drops to zero indicating critical coupling, with about 90% of the light absorbed in the 180 nm film and the remaining about 10% absorbed in the top layer (1-2 µm) of the underlying sapphire. This reflectivity minimum is very broad in n–k space, making the phenomenon very robust; as a result, small changes in the composition (and hence ñ) of the lossy dielectric will not significant impact device performance.

Figure 4B:
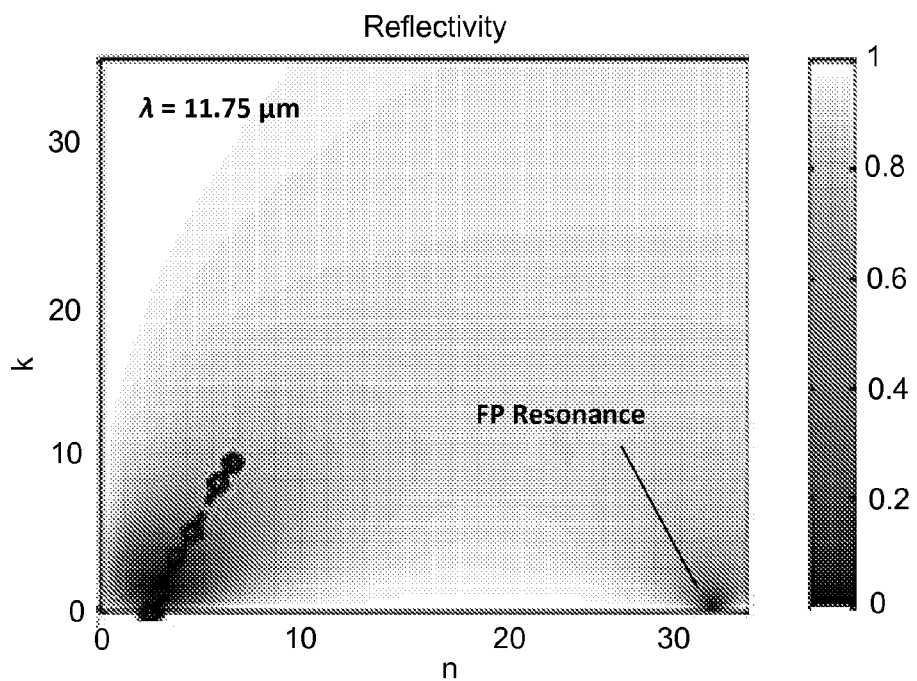
FIG. 4B is a zoomed-out version of the reflectivity map in shown in FIG. 4A.

FIG. 4B is a zoomed-out version of the reflectivity map in shown in FIG. 4A. The reflectivity dip at ñ32.9+0.35i corresponds to a higher-order resonance within the 180 nm film. The $VO_2$ index trajectory is again shown in black for temperatures from 295 K to 360 K, and does not approach this value.

As shown in FIGS. 1C and 1D, complex values of the refractive indices lead to non-trivial reflection phase shifts (e.g., approximately 0.087π for the $VO_2$/air interface and −0.02π for $VO_2$/sapphire at $\lambda$ about 11.75 µm) and substantial absorption as light propagates through the lossy film. As a result of these high losses, all or substantially all of the incident light is absorbed after only a few passes through the thin film; $R=|r|^2$ already reaches about 0.0006 after including just the m={0, 1, 2, 3} terms in Eqn. (1). This structure functions as an ultra-thin single-channel CPA and coherent absorption is still observed in our system even though the absorption coefficient is two orders of magnitude larger than other CPAs (approximately 15,000 $cm^{-1}$ vs. 100 $cm^{-1}$). As a result of the small thickness and high attenuation of the $VO_2$ film, there is little phase accumulation within this exemplary device; consequently, it absorbs light having a low degree of temporal coherence.

Thermally tuning the phase co-existence in $VO_2$ is equivalent to tracing out a path in n–k space; this trajectory is plotted as a function of temperature in FIGS. 4A and 4B (black curve) using the data from M. M. Qazilbash et al., "Mott transition in $VO_2$ revealed by infrared spectroscopy and nano-imaging," Science 318, 1750 (2007), which is incorporated herein by reference in its entirety. At a temperature of about 342 K, the index of $VO_2$ passes almost through a point of low reflectivity, confirming the experimental data presented herein. The phase transition in $VO_2$ results in a very large change in its optical properties, enabling a change in device reflectivity on the order of unity.

Calculations show that the spectral position of the absorption maximum can be tailored over a significant portion of the 8 µm to 14 µm atmospheric transparency window by changing the $VO_2$ film thickness, making this geometry potentially useful for infrared detection and imaging applications. The calculated absorption maximum occurs at $\lambda$~10.5 µm for a 20 nm $VO_2$ film on sapphire, and can be continuously red-shifted with increasing $VO_2$ 2 thickness;

for example, at h=400 nm the dip is predicted to be at λ about 13.3 μm with a value of about 0.09 for R (see supplementary information for data on a sample with h=80 nm).

As explained in greater detail below, $VO_2$ is suitable for applications in bolometers using the IMT, though this approach is complex due to the presence of hysteresis. Nonetheless, $VO_2$ (and mixed valence $VO_x$) is widely used for commercial bolometers at temperatures away from the IMT. A bolometer based on non-hysteretic behavior within $VO_2$'s transition region could increase the temperature coefficient of resistance (TCR) and lower the device resistance, leading to enhanced performance. Combining this approach with the perfect absorber geometry demonstrated in the present work could result in significantly improved bolometers. For more information on bolometers based on non-hysteric behavior within $VO_2$'s transition region, see M. Gurvitch et al., "Nonhysteretic behavior inside the hysteresis loop of $VO_2$ and its possible applications in infrared imaging," Journal of Applied Physics 106, 104504 (2009) and M. Gurvitch et al., "Nonhysteretic phenomena in the metal-semiconducting phase-transition loop of $VO_2$ films for bolometric sensor applications," IEEE Transactions on Nanotechnology 9, 1536 (2010), each of which is incorporated herein by reference in its entirety.

In order to extend the absorber concept demonstrated here to other spectral ranges, alternate materials for either the substrate or the ultra-thin film can be used. $VO_2$ films, for example, can be grown on substrates including, but not limited to glass, silicon, germanium, titanium oxide, and indium-tin-oxide (ITO). In general, tunable highly-absorptive layers can be created using a variety of correlated oxides which exhibit phase co-existence in the vicinity of phase transitions as well as other phase change materials.

Figure 5A:
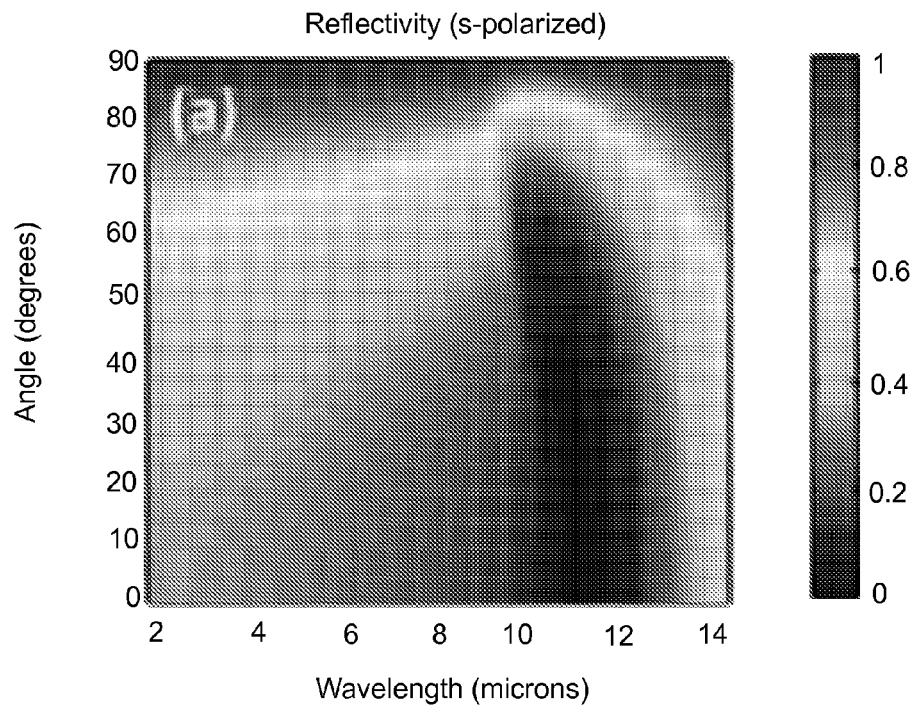
FIGS. 5A and 5B are plots of calculated reflection spectra from the 180 nm $VO_2$ film on sapphire (T=342 K) for s-polarized and p-polarized incident light, respectively, at various angles of incidence.
Figure 5B:
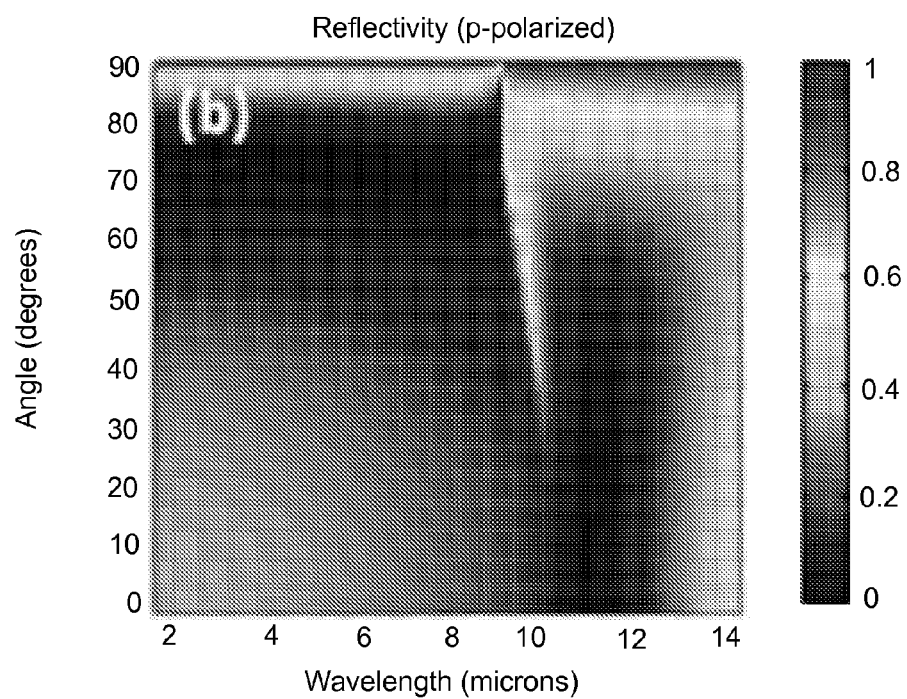

The calculated values for reflection presented herein (including those shown FIGS. 2D and 4) were made for normally-incident illumination. It is useful to consider the behavior of this perfect absorber given oblique incident light. FIGS. 5A and 5B are plots that show the structure's calculated reflection spectra using the index for $VO_2$ at T=342 K for various angles of incidence for s- and p-polarized light, respectively. Very low reflectivity and high absorption values are observed over a broad range of angles around our wavelength of interest (about 11.75 μm). Calculations show that the reflectivity remains under 0.01 for incident angles of 0° about 30° for both s- and p-polarization. This low sensitivity to incident angle is a result of the small propagation distance for light inside the $VO_2$ film. In this experiment, the numerical aperture (NA) of the objective is about 0.4 (acceptance angle of about 24°), which is the likely source of the discrepancy between the calculated and measured reflection minima (0.0007 and 0.0025, respectively).

Samples with Different Growth Conditions

Because optical properties of $VO_2$ vary depending on material parameters, we performed an additional set of reflectance experiments identical to that of FIG. 1A on a second $VO_2$ film also grown on c-plane sapphire. This sample was grown by DC sputtering with a Vanadium target, using gun power of 250 W in an atmosphere of 8.5% $O_2$ and 91.5% Ar, substantially different conditions from the sample measured in FIG. 1. The resulting sample was about 70 nm thick as measured by FIB cross-section, though it had significant surface roughness (on the order of 15 nm), and displayed a four-order of magnitude change in DC resistivity across the phase transition.

Figure 6B:
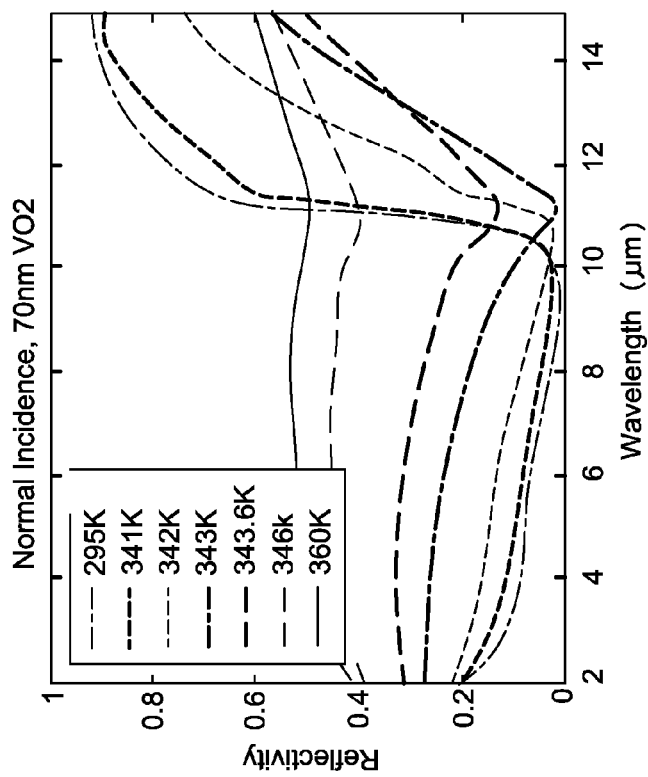
FIGS. 6A and 6B are plots of measured and calculated reflection spectra, respectively, from a $VO_2$ film with a thickness of about 70 nm on a sapphire substrate.
Figure 6A:
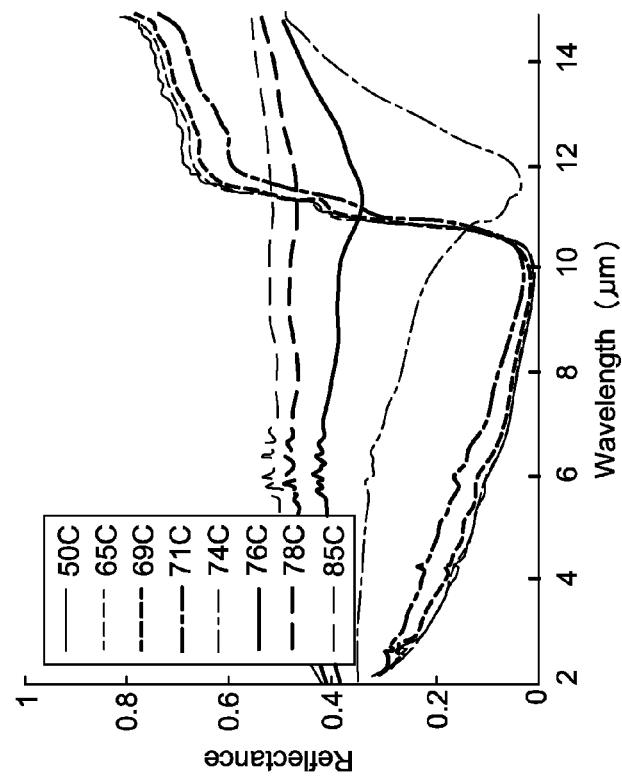

FIG. 6A is a plot of the experimental reflectance curves, with the corresponding calculations for 70 nm $VO_2$ on sapphire shown in FIG. 6B. The reflectivity minimum is once again visible when the $VO_2$ is in a transitional state between the purely insulating and metallic phases in both the experimental and calculated spectra, though the exact spectral position of the reflectivity minimum in the calculation is blue-shifted by about 0.8 μm compared to the experiment. This discrepancy may be due to sample differences at different growth conditions. Nonetheless, the dynamically tunable reflectivity minimum is still visible despite the difference in the film thickness and the large surface roughness of the sample.

Bolometers with Tunable Absorption

A detector element in a conventional bolometer includes a small piece of material, such as mixed (nonstoichiometric) vanadium oxide ($VO_x$) (which does not have any phase transition), that has a relatively high temperature coefficient of resistance (TCR). Because this small piece of material has a high TCR, its resistance changes with temperature. As this piece of material absorbs infrared radiation, its resistance changes, and this change can be measured by a voltmeter that is electrically connected to the piece of material.

In principle it can be very advantageous to make a bolometer out of stoichiometric $VO_2$, which, unlike $VO_x$, undergoes phase transition at temperature of about 68° C., and to operate such a bolometer in $VO_2$'s phase transition region. This is because $VO_2$ undergoes a large resistance change in this region with just a small amount of heating (as the phase transition gets pushed along), which translates to high sensitivity. Unfortunately, there is hysteresis present in the phase transition. This hysteresis causes unwanted forward and/or backward excursions in resistance for a given change in temperature. Fortunately, the recent discovery of some nonhysteretic behavior within the phase transition region reduces or eliminates problems of forward and backward excursion in $VO_2$-based bolometers as explained in M. Gurvitch et al., "Nonhysteretic phenomena in the metal-semiconducting phase-transition loop of VO2 films for bolometric sensor applications," IEEE Transactions on Nanotechnology 9, 1536 (2010).

Combining this nonhysteretic behavior with the capacity to absorb a large amount of incident infrared radiation yields a bolometer with increased sensitivity. The typical way to increase absorption capacity is to build a quarter-wave resonator above or below the $VO_2$ film in the detector element. Another way to increase absorption capacity (e.g., up to 70%, 80%, 90%, or even 100%) is to apply an ultra-thin film that, in combination with the detector substrate, is configured to act as a critically coupled resonator according to embodiments of the present invention. Such a film could be ultra-thin, e.g., about 50 nm to about 250 nm, and could comprise a highly lossy material, e.g., $VO_2$, deposited on a sapphire substrate, which can be relatively thin (e.g., about 1-2 μm thick) and unsupported or relatively thick (e.g., >2 μm thick). When acting as a critically coupled resonator, this ultra-thin film absorbs all or substantially all of the incident radiation at a particular wavelength or range of wavelengths to increase the bolometer's sensitivity.

Thermal Emitters

Exemplary filters can also be patterned (e.g., as described above) and used as markers or tags that can be turned on and off. For instance, an exemplary filter can be used to absorb incident infrared light in a predetermined pattern. Alternatively, it can be used to emit infrared radiation in a predetermined pattern because of the thermal absorption/emission reciprocity implied by Kirchoff's law of thermal radiation.

Such a tag could be used as an invisible authenticity mark, in which the tag is turned on and off or monitored using a secret process, for jewelry, art, electronics, software, or any other valuable item. A thermally emitting tag could display a bar code or other scannable mark. It could also be used in combination with thermal imaging to light a path, to provide wayfinding, or to distinguish friend from foe (e.g., on a battlefield).

Such exemplary thermal emitters can be made by depositing and patterning an ultra-thin film of absorptive material on a suitable substrate (as discussed above) using lithography or any other suitable fabrication technique. For instance, an ultra-thin film, such as a static lossy film (e.g., a metal-dielectric alloy) can be patterned to create an image, message, or tag (e.g., a quick response code) in such a way that the region with the thin film absorbs a more infrared (or Terahertz) radiation than the surrounding area. This tag could be read with an infrared camera in either a passive configuration (e.g., with infrared light shining from elsewhere) or in an active configuration in which the tag is heated up to become a thermal emitter. When heated, the highly absorbing region emits more light than the surrounding region, rendering the message readable with an appropriate detector.

Furthermore, the absorbing material can have tunable optical properties (as discussed above with respect to $VO_2$, graphene, etc.) and be reconfigurable. For example, by making an array of pixels of these thin absorbing layers that can be addressed individually, one can make an infrared display. By using different materials and/or different thicknesses, different groups of pixels can be obtained having different resonant wavelengths, enabling the infrared analog of a visible-wavelength multicolor tag, display (e.g., a red-green-blue display), or filter (e.g., a Bayer filter).

Radiation Detection and Energy Harvesting

Ultra-thin absorbing structures can also be used in photodetectors and energy-harvesting devices using the deposition techniques disclosed above. Because these structures are so thin, they can be incorporated into photodetectors and energy-harvesting devices by depositing small amounts of material. Photodetectors and energy-harvesting devices with ultra-thin absorbing structures have absorbances, reflectivities, and other properties that depend less on angle than conventional devices. They would also allow for more charge trapping defects as excited charges have a shorter length to travel through the material.

As understood by those of skill in the art, conventional thin structures are typically not used in photodetectors or energy-harvesting devices because because the materials used in conventional thin structures have a relatively low absorption. The resonant absorption in an ultra-thin film disclosed here offers the prospect to realize both ultra-thin photodetectors (in addition to bolometers already discussed) and energy harvesting devices. This thin layer can comprise one or several layers of an MIM diode, a p-n junction, a Schottky detector, or any other suitable structure. For example, a thermoelectric photodetector (based on a thermopile) could be realized, converting into a measurable voltage the temperature difference established between the ultra-thin highly absorptive layer (that heats up when it absorbs infrared light) and the substrate or another material touching the ultra-thin layer.

The ultra-thin layer can also form a rectifying junction between two electrodes defined on each side (on one side, either a conductive substrate or a conductive layer deposited on the substrate can be used, on the other side, a transparent electrode can be used). The rectifying junction (or diode) has asymmetric conduction properties and is thus able to convert an incident infrared AC field into a DC bias, that can be used as a source of power, for example to charge a battery. The very small thickness of the highly absorptive dielectric can enable to form a metal-insulator-metal (MIM) tunneling diode, where the insulator is the dielectric layer itself. Alternatively, the ultra-thin absorptive layer could be one of the electrode or the whole MIM structure. If needed, additional conductive or non-conductive layers can be used.

An ultra-thin absorptive layer can also be used in a hot-carrier photovoltaic device, where hot carriers are generated by absorption of incident photons (e.g., through an interband transition), and then extracted (e.g., with an electric field) before they can thermalize (and thus lose their energy into heat). The extracted hot-carriers can be directed to a layer where their extra energy (compared to the bottom of the electronic band they are in) can be used to generate new carriers in an avalanche-like process, to tunnel through energy selective barriers (formed by a superlattice for example) into layers with higher electric potential, or to otherwise extract energy.

One embodiment described herein provides an article in which coherent phenomena may be maintained. The article may include an ultra-thin, highly absorbing film disposed over a reflecting substrate, which article may selectively absorb the incident light at various frequency ranges. The article may have low sensitivity to the incident angle of the light and need minimal amount of absorbing material (e.g. 5-20 nm for visible light). This technology has potential for a variety of applications. For example, the article may be a part of an optical coating, which may be a part of solar cells, photodetectors, optical filters, or decorations such as visual arts and jewelry. In one embodiment, the article may be a part of a detector and/or a device for energy harvesting—e.g., bolometer, photodetector, solar cells, rectifier, thermoelectric, modulator, threshold absorber, etc. In one embodiment, the article is a part of a device for thickness monitoring, thermal emitting, water spitting cell, or a hysteresis memory.

The article may comprise a first layer, comprising a reflector; and a dielectric layer disposed over the first layer, the dielectric layer having a thickness h that is less than about $\lambda/4n$, wherein n is an index of refraction of the dielectric layer and $\lambda$ is the wavelength of the incident light. In one embodiment, n is the real part of an complex index of refraction of the dielectric layer. The incident light in one embodiment is visible light. For example, the wavelength $\lambda$ may be between about 350 nm about 800 nm—e.g., about 390 nm and about 750 nm, about 400 nm and about 600 nm.

The reflector, or reflecting medium, may be a partial reflector. Examples of such reflectors may include a metal, a Bragg reflector, or both. A Bragg reflector may be, for example a Bragg grating close to the edge of the photonic band gap. The metal of the first layer may be any suitable metal, depending on the application. For example, it can be a noble metal or an alloy thereof. In one embodiment, the metal is at least one of Ag, Au, Cu, and Pt. Alternatively, the metal may be a non-noble metal—e.g., palladium, nickel, lead, zinc, rhodium, iron, and alloys thereof (e.g., as steel, stainless steel, etc.)

The first layer may have any thickness, including a thickness that is greater in magnitude than that of the dielectric layer. The thickness may be a function of the wavelength of the incident light and the material parameters (e.g., dielectric and imperfect mirror). In one embodiment, the first layer may be optically thick. For example, the first layer may have a thickness that is at least about 25 nm—e.g. at least about 30 nm, 50 nm, 60 nm, 80 nm, 100 nm, 150 nm, 200 nm, 250 nm, 300 nm, 400 nm, 500 nm, 600 nm, or more.

In one embodiment, the thickness is between about 100 nm and about 800—e.g., between about 150 nm and about 600 nm, about 200 nm and about 500, about 250 nm and about 400 nm, etc.

The dielectric layer may comprise a dielectric material, such as a semiconductor, a metal element, a polymer, a carbon-containing molecule, or combinations thereof. The dielectric material may be, for example, a highly absorbing dielectric material or a lossless dielectric material, such as in a visible light range or in a new-IR regime. In one embodiment, the dielectric may be a lossy dielectric. A lossy dielectric may refer to a material having a moderate to a large loss, including, for example, semiconductors for light with photo energies above the bandgap. A highly absorbing material may have a k value on the order of n. For example, k may be greater than 0.4—e.g., greater than 0.5, 0.6, 0.7, 0.8, 0.9, 1.0, 1.2, 1.5, 2.0, or more.

The ultra-thin may comprise a "highly lossy dielectric material" whose absorption loss can be tuned to a desired value. As understood by those of skill in the art, a dielectric can be characterized by a respective complex index of refraction $\tilde{n}=n+ki$, where n is proportional to the phase velocity of light propagating through the material and k, which is known as the extinction coefficient, represents the absorption loss experienced by light propagating through the material. In a highly lossy dielectric material, k is equal to or greater than 0.5 (e.g., k>1.0, k>1.2, k>1.5). For instance, k may be equal to about 1.0, 1.1, 1.25, 1.5, 1.75, 2.0, or any other suitable value in a highly lossy film. Films with suitable values of k can be made from materials including, but not limited to: metal-dielectric alloys (e.g., SiAl alloys); metal-doped dielectrics; doped semiconductors (e.g., highly doped semiconductors); semiconductors whose bandgap energy is below the photon energy of the incident radiation; graphene; phase-change material (e.g., $VO_2$); quantum wells; quantum dots; polymers; and organic materials.

In one embodiment, the semiconductor may be silicon, germanium, or both, or other types of known semiconductor. Other semiconductors, such as Zinc-Blende type materials in the visible and near-IR (e.g., InP, InSb, InAs, GaAs, GaSb, HgTe, HgSe, CdTe, ZnTe, ZnSe), GaN (for short wavelength, blue UV), $CuInSe_2$ or $CuInGaSe_2$, and molecular dyes (e.g., cis-bis(isothiocyanato)bis(2,2'-bipyridyl-4,4'-dicarboxylato)-ruthenium(II), or "N3"). A highly doped semiconductor can be used. In some alternative embodiments, the dielectric layer need not comprise a semiconductor. For example, the dielectric layer may comprise a metal element. The element refers to the element found in a Period Table. A metal element may be present in a metallic form or a metal compound, such as an oxide, nitride, etc. In one embodiment, the metal dielectric layer may comprise at least one metal alloy, metal nanoparticles in a dielectric matrix, phase coexistence materials (e.g., $VO_2$), quantum wells, quantum dots, carbon-containing material (e.g., graphene (single or few layers), graphite), poor metals (e.g., iron, tungsten, etc.), metal oxides (e.g., ITO). In some instances, certain polymers may be used as well.

The dielectric layer may be ultra thin, referring to having a thickness that is less than about $\lambda/4n$, wherein n is an index of refraction of the dielectric material in the dielectric layer and $\lambda$ is the wavelength of the incident light. In one embodiment, the thickness may be less than about $\lambda/4n$, $\lambda/10n$, $\lambda/25n$, $\lambda/50n$, $\lambda/100n$, $\lambda/250n$, $\lambda/500n$, $\lambda/1000n$, etc. In some, instances, the thickness may be at least one (e.g., two, three, four, or more) order of magnitude smaller than $\lambda/4n$. In one embodiment, the thickness h may be less than or equal to about 35 nm—e.g., less than or equal to about 30 nm, 25 nm, 20 nm, 15 nm, 10 nm, 8 nm, 6 nm, 5 nm, 4 nm, 3 nm, 2 nm, 1 nm or less. For example, the thickness h may be between about 2 nm and 35 nm—e.g., about 5 nm and about 30 nm, about 7 nm and about 25 nm, about 10 nm and about 20 nm, etc.

As described below, in some embodiments the first (metal) layer may be further disposed over a substrate. The substrate may be, for example, any suitable material, including a silicon wafer, a semiconductor, glass, or other materials. The substrate could also be a doped semiconductor (such as Si, InP, GaAs, Ge, CdTe, etc) with sufficiently high doping density that the complex refractive index becomes "metal-like" (that is, the imaginary part of complex refractive index is larger than the real part). The doping density required is different for different frequency ranges—for example to be "metal-like" at terahertz frequencies, the doping level may be about $10^{17}$ or $10^{18}$ $cm^{-1}$, whereas the doping level may be about level of $10^{18}$ or $10^{19}$ $cm^{-1}$ for "metal-like" behavior at mid-infrared frequencies, and so forth. The precise level of doping can be determined from conventional models such as the Drude model and Drude Lorentz model.

The surface of the wafer substrate may be optionally polished to have a surface finish, although a polished surface is not needed. As described below, the surface roughness of the underlying substrate does not necessarily affect the desirable optical interference effects; in some cases, it has a minimal effect on the functionality on the optical coating described in one embodiment. In fact, underlying surface roughness may be desirable in certain situations. For example, for labeling, decorative, or similar purposes, a matte finish may be desired over a polished finish. In this case, the substrate may be initially rough (or roughened).

In contrast to the conventional coating, the articles described herein are relatively independent to the incident angle θ of the incident light with respect to the absorption ability of the articles. In some embodiments, the articles described herein remain absorptive of the incident light for the incident angle of between about 0° and about 80°—e.g., between about 0° and about 60°, between about 10° and about 50°, between about 20° and about 40°, etc. In some embodiments, some reflectivity may be observed. For example, for a large change in incident angle (e.g., 0° to 70°), there may be a change in reflectivity.

The articles and coatings described herein may be fabricated by any suitable techniques, depending on the material and configuration used. The first layer and/or the dielectric layer may be disposed via any suitable techniques. For example, the disposing may involve evaporation, such as electron-beam evaporation or thermal evaporation, sputtering, or combinations thereof. Alternatively, CVD growth, atomic layer deposition (ALD), molecular beam epitaxy (MBE), or any other thin film deposition, may also be employed for disposing. Depending on the technique used, the disposing may take place in an at least partial vacuum environment, such as low vacuum, high vacuum.

In one embodiment, a test sample with an optically-thick (e.g., ~30 nm of greater) film of a metal may be put into the deposition chamber along with the actual substrate on which a deposition is desired. The metal film may be then taken out and measured with a spectrometer, which allows for an accurate thickness to be determined for the deposition. This could be used in process control or calibration of depositions.

Figure 15:
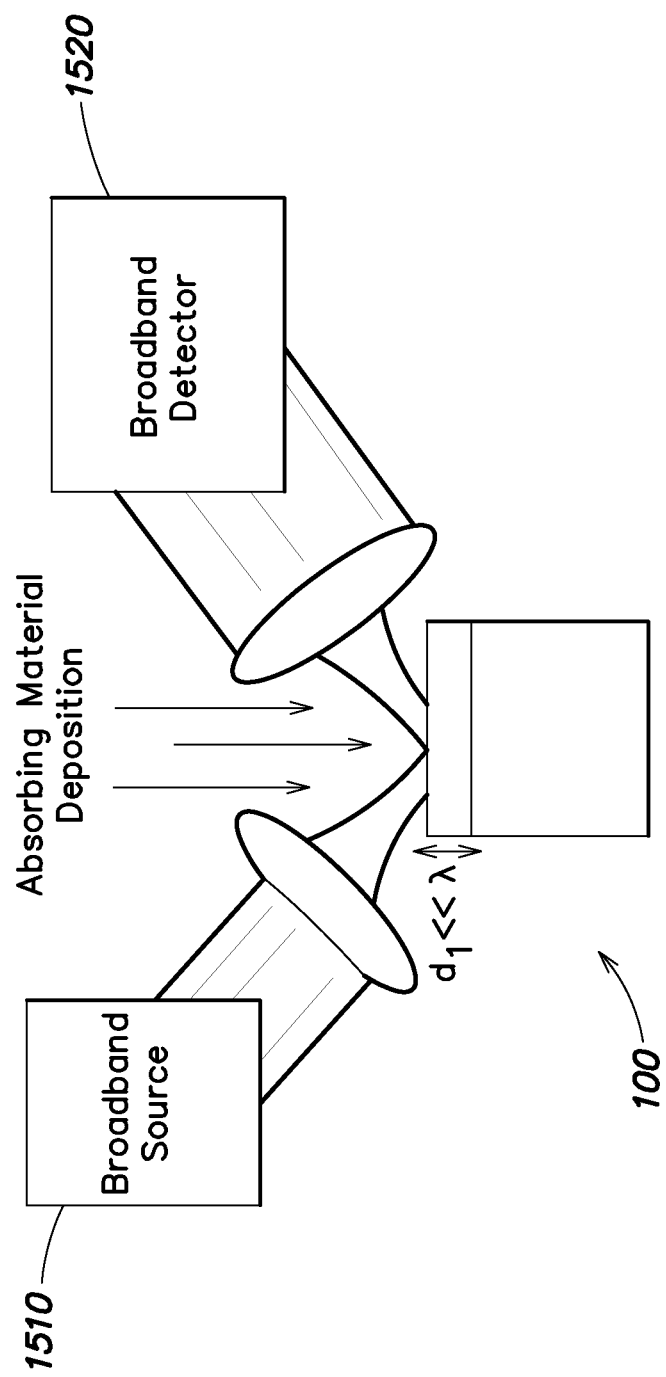
FIG. 15 shows a schematic setup of using the article provided in one embodiment as a thickness monitoring apparatus.

In another embodiment, a visible spectrometer may be built into the deposition chamber, and is aimed at the test sample. This allows for in-situ monitoring of the deposition process, and would allow the process to be stopped when the desired thickness of deposited material to be reached. Thus, the article provided herein may be used for thickness monitoring, as shown in the schematic in FIG. 15, which shows a broadband source 1510 that illuminates an article 100 during material deposition and a broadband detector 1520 that senses light reflected from the article 100 during material deposition.

The use of ultra-thin highly absorptive dielectric films of the coatings described herein enable several desirable functionalities. For example, the conventional Fabry-Perot-type optical thin films utilizes constructive and destructive interference, with the optical phase controlled by gradual accumulation within the transparent dielectric layers. The material losses in the dielectrics are usually assumed to be small such that light is gradually absorbed, and the interface reflection and transmission phase changes at the interfaces between dielectric films are either approaching about 0 or approaching about π, depending on the index contrast. By contrast, the articles described in some embodiments herein utilize highly absorbing dielectrics (e.g., semiconductors for ligt with photon energies above the bandgap) in combination with metal layers, which metal layers have finite optical conductivity. The reflector, as described above, may comprise a metal and/or a Bragg reflector—e.g. a Bragg mirror.

These materials may exhibit a range of interface reflection and transmission phase shifts, which may be controlled by tailoring the material properties. In one embodiment, the present inventors have observed that combining the large optical attenuation within the highly-absorbing dielectrics with the nontrivial interface phase shifts may lead to strong resonant behavior in films that are significantly thinner than the wavelength of light. For example, one embodiment provides an ultra-thin coating on the surface of a noble metal in the visible light regime and shows that deposition of nanometers of a lossy dielectric on a metal results in dramatic modification of the reflectivity spectrum (and therefore color). In other words, by changing, for example, the thickness and/or materials, the color of the articles described herein may be changed as a result.

Tunable Filter

Figure 16:
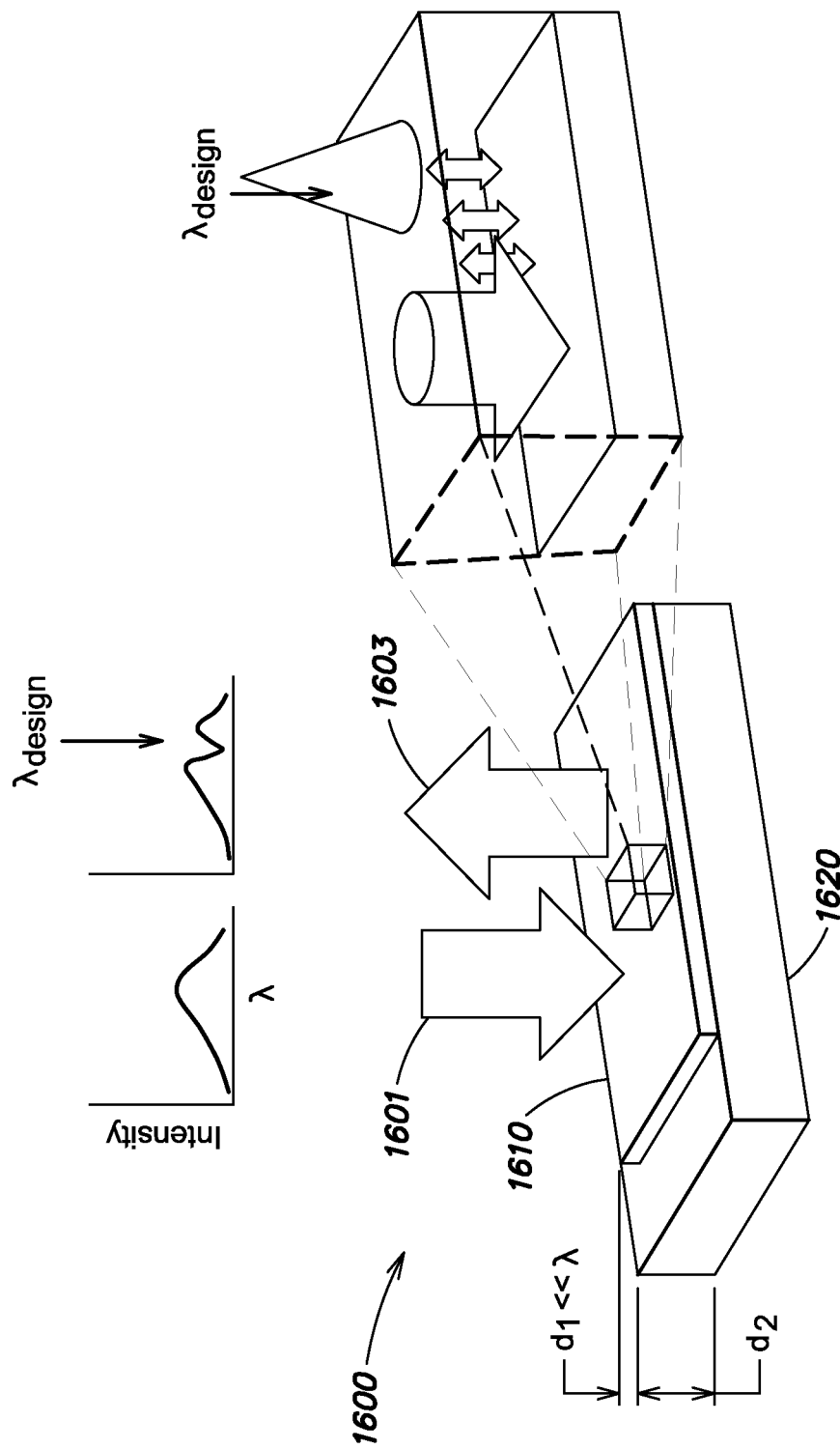
FIG. 16 shows a schematic setup of a tunable reflection filter/modulator according to embodiments of the present invention

FIG. 16 shows a tunable absorption/reflection filter 1600 suitable for modulating incident light. The filter 1600 includes an ultra-thin film 1610 of lossy dielectric material on a partially reflecting substrate 1620. Applying an electromagnetic field (e.g., a broadband pulse 1601) to the ultra-thin film causes the dielectric material's absorption loss k to change, which in turn reduces the filter's reflectivity at a specified wavelength or wavelength range. As a result, the filter does not reflect incident light at the specified wavelength or wavelength range (e.g., as shown by partially reflected pulse 1603). In some cases, the filter's surface is pixelated or patterned such that the filter's reflectivity can be varied as a function of spatial position.

The tunable absorption/reflection filter 1600 shown in FIG. 16 can be used to modulate the output of a pulsed laser, a continuous-wave laser, or any other suitable light source. It can be modulated electrically by applying an electric field through the dielectric layer. In case of thermal tuning, the small thickness (and thus small volume) of the dielectric layer also lead to a reduced time constant for modulation.

Figure 17:
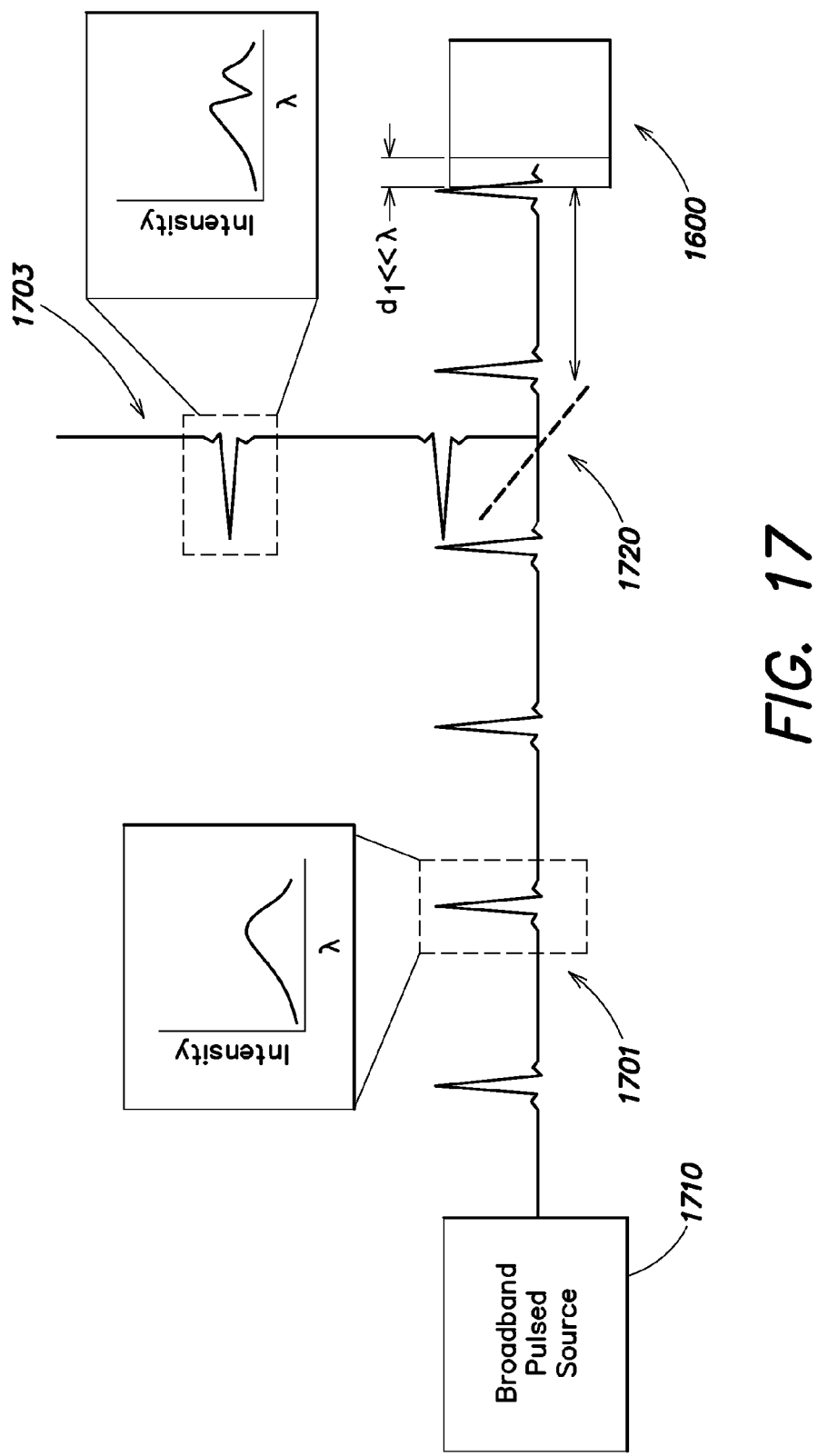
FIG. 17 shows a schematic setup of a pulse shaping system that uses the tunable absorption filter of FIG. 16 to modulate an optical pulse train according to embodiments of the present invention.

FIG. 17 illustrates how the tunable filter 1600 of FIG. 16 can be used to shape or modulate short pulses of incident light. An optical pulse train 1701 (e.g., of picosecond, femtosecond, or attosecond pulses) from a mode-locked laser 1710 or other broadband pulse source illuminates the absorber via a beamsplitter 1720. When actuated, the absorber reflects some but not all of incident light, thereby changing the shape of the pulse. The absorber reflects the shaped pulse 1703 via the beamsplitter via the system's output.

An exemplary filter can also be controlled by the optical pulse train or by another beam of light. More specifically, by using a material for the thin absorbing layer that changes properties when illuminated by high intensity incident light (e.g., $VO_2$), the filter can be used as a saturable absorber mirror. If the filter operates at the perfect absorption condition, a sufficiently strong optical pulse triggers the dielectric material's phase transition, turning the sample from absorbing to reflecting at that wavelength. Thus, the filter can be used as a saturable absorber for the infrared, and can be used as a component for mode-locking mid-infrared lasers, such as quantum cascade lasers and $CO_2$ lasers.

In another embodiment, the articles described herein may be used as a filter and/or coloration. As illustrated in the schematic of FIG. 16, by engineering an absorption condition at a particular wavelength, one can make reflection filters, which colors the material. The wide resonance could be helpful when dealing with very short pulses (which means a broad spectrum). Thus, As shown in the schematic in FIG. 17, in one embodiment the absorber may be made to absorb picosecond pulses efficiently, and could be used for the pulse shaping of femtosecond/attosecond pulses.

Figure 18:
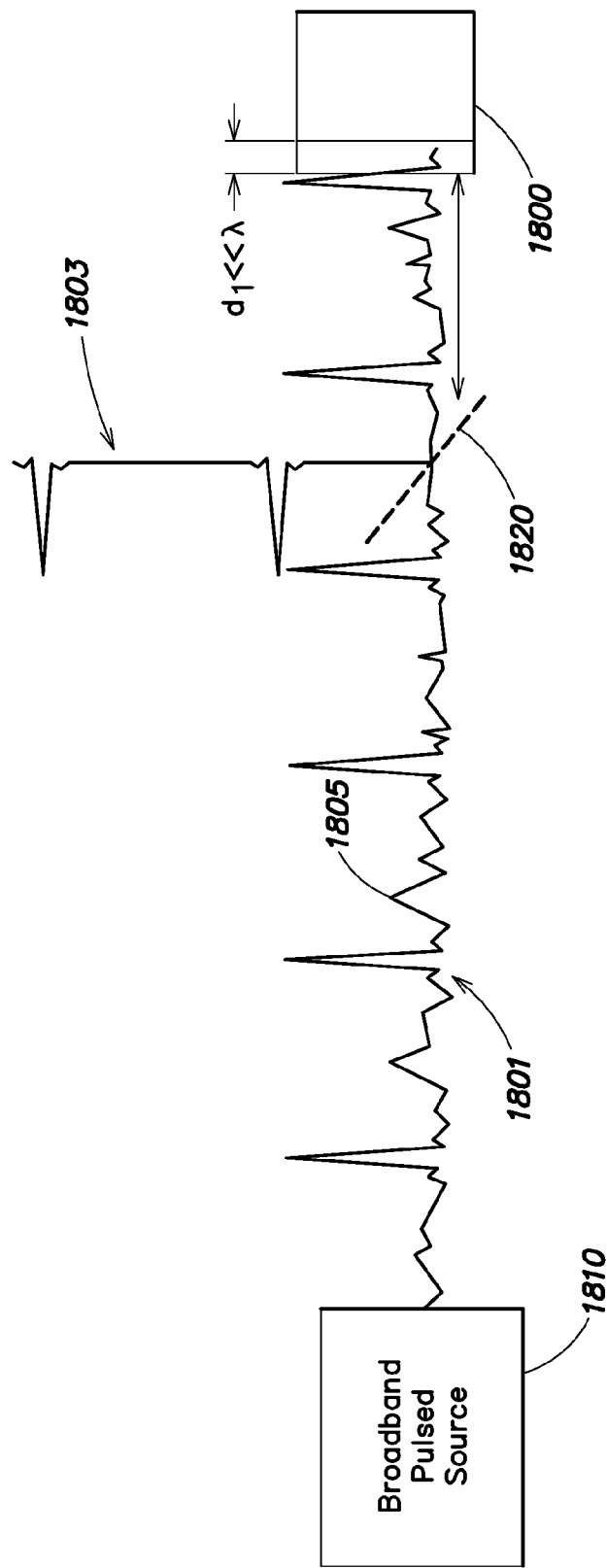
FIG. 18 shows a schematic setup of using the article provided in one embodiment as a saturable absorber and modulator.

In some embodiments, by using a material for the thin absorbing layer that changes properties when illuminated by high intensity incident light (e.g. $VO_2$, or other nonlinear optical materials, etc), the structure may be used as a saturable absorber mirror 1800 (or a saturable reflector mirror), as shown in FIG. 18. A broadband pulse source 1810 illuminates the saturable absorber mirror 1800 with one or more strong pulses 1801 via a beam splitter 1820. If the sample with $VO_2$ is operated at the perfect absorption condition, and a strong enough pulse 1801 is incident on the sample, the pulse 1801 triggers the phase transition, turning the sample 1800 from absorbing to reflecting at that wavelength, producing a reflected pulse 1803. The sample 1800 does not reflect pulses 1805 that are too weak to trigger the phase transition. Thus it may be used as a saturable absorber for the infrared, and can be used as a component for mode-locking mid-IR lasers such as quantum cascade lasers and $CO_2$ lasers.

Figure 19:
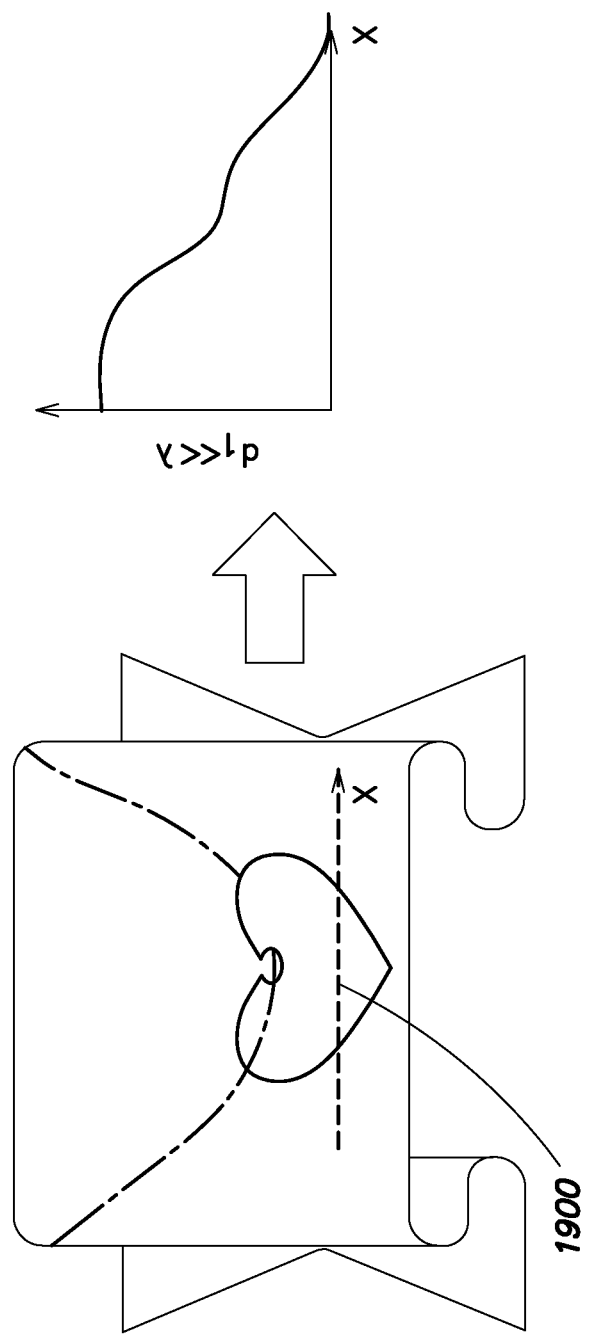
FIG. 19 shows a schematic setup of using the article provided in one embodiment as tunable optical coating for jewelry, windows, and other surfaces.

In some embodiments, the article described herein may be employed for a non-optoelectronic application. For example, the article may be used in art/jewelry applications, in which a metal article 1900 is colored by an ultra-thin coating, as shown in FIG. 19. If the coating is varied in thickness (by, for example, tilting the sample in a deposition chamber), then a gradient of colors can be achieved. In some embodiments wherein there is a change in reflectivity (e.g., as a result of a large change in incident angle), the optical coating may be used as filters that may be tunable to rotating them. Alternatively, the coating may be used for art/jewelry that changes color when the coating is observed from different sides/angles. In another embodiment, one could pattern different parts with different thicknesses to obtain a multicolor image on the reflector layer.

In addition to optoelectronic applications, the filter can be used for decorative and aesthetic applications as well. For instance, it can be used as a window shade than turns on or off, or as part of a billboard or screen that switches between reflective and non-reflective states, e.g., so as to display different images. It can also be used in various jewelry/art applications in which metals (or other substances) are colored by an ultra-thin coating whose color changes in response to heat, voltage, current, or a magnetic field.

In one embodiment, the optical coating described herein may be used to improve the performance of a light bulb (e.g., incandescent light bulb). For example, not to be bound by any theory, but due to Kirchhoff's law of thermal radiation, the absorptivity of a device is proportional to its emissivity. Thus, by creating incandescent light bulbs with filaments coated with an ultra-thin coating as described herein may significantly enhance absorption in the visible spectral range, thereby increasing the efficiency of these bulbs because they are thermal emitters in the visible, operating at temperatures around 1000-4000 K. This approach can also be used to create incandescent light bulbs/thermal emitters for the UV ("black lights") and the near-IR.

The equations describing the behavior of light incident from air ($n_1=1$) onto a lossy film with thickness h and complex refractive index $\tilde{n}_2=n_2+ik_2$, deposited on a metallic substrate with complex index $\tilde{n}_3$ (FIG. 7) are described below. FIGS. 7A-7D show schematics of incident light from medium I (air) being reflected from structures 710, 720, 730, and 740 comprising dielectric and/or metallic media. FIG. 7A shows a perfect electric conductor (PEC) metal 714 and a lossless dielectric 712; since there is no absorption and no penetration into the metal, the reflectivity R=1. FIG. 7B shows an absorbing dielectric 722 on a PEC substrate 724 that supports an absorption resonance for $h\sim\lambda/4n_2$ assuming that the losses ($k_2$) are relatively small, but no resonance exists for smaller h. FIG. 7C shows a lossless dielectric 732 on a substrate 734 with finite optical conductivity (e.g. gold at visible light frequencies) that may support a resonance for $h\ll\lambda/4n_2$, but the total absorption is not large since the only loss mechanism is the finite reflectivity of the metal. FIG. 7D shows an absorbing dielectric 742 on gold 744 at visible frequencies may support an ultra-thin (h $\lambda/4n_2$) resonance with widely tunable absorption. In one embodiment, for a given wavelength of operation and a given set of materials (dielectric and imperfect mirror), a thickness may be chosen that such that the reflectivity in Eqn. (1) approaches zero. Alternatively, if a thickness is given then (n,k) of the materials may be determined to solve Eqn. (1). Alternatively, if the materials and thickness are given, wavelength may be determined. Note that existence of a zero may not be guaranteed if there is only one free parameter. In contrast to the conventional Fabry-Perot resonator, the thickness in some of the embodiments described herein is much smaller (e.g., μ/4n).

For a particular values ($n_2$, $k_2$) of the dielectric, the absorption may reach unity, indicating critical coupling to the thin film resonator. The reflection coefficient for TE (s-polarized) light incident at an angle $\theta_1$ is $$\tilde{r} = \frac{\tilde{r}_{12} + \tilde{r}_{23} e^{2i\beta}}{1 + \tilde{r}_{12}\tilde{r}_{23} e^{2i\beta}} \quad (1)$$

where $\tilde{r}_{mn}=(\tilde{p}_m-\tilde{p}_n)/(\tilde{p}_m+\tilde{p}_n)$, $\tilde{p}_m=\tilde{n}_m \cos(\tilde{\theta}_m)$, $\tilde{\beta}=(2\pi/\lambda)\tilde{n}_2 h \cos(\tilde{\theta}_2)$, and $\tilde{\theta}_m=\sin^{-1}(\sin(\theta_1)/\tilde{n}_m)$ which is the complex-valued form of Snell's law. For TM (p-polarized) light, $\tilde{p}_m$ is replaced by $\tilde{q}_m=\cos(\tilde{\theta}_m)/\tilde{n}_m$. The total reflectivity is given by $R=|\tilde{r}|^2$, and because the substrate is assumed to be metallic such that there is no transmission, the absorption of the structure may be written as A=1−R. One noteworthy example is the quarter-wave film (h $\Box\lambda/4n_2$), which in the presence of moderate losses serves as an absorbing optical cavity (in the absence of loss (FIG. 7A), such a cavity functions as a phase-shifting element called a Gires-Tournois etalon). Such asymmetric Fabry-Perot structures (typically comprising quarter-wave or thicker films) have been used for reflection modulation, resonant cavity enhanced (RCE) photodetection and emission, ferroelectric infrared detection, and other applications.

For a metal substrate in the perfect electric conductor (PEC) limit, $n_3\to\infty$ and $k_3\to\infty$, thus $\tilde{r}_{2,3}=-1$, corresponding to complete reflection with a phase shift of π (FIGS. 7A and 7B), which makes $h=\lambda/4n_2$ the lower limit on the thickness of a resonant cavity. See the Working Example section for more information. However, at optical frequencies, metals have finite conductivity and therefore their complex index is finite (similar complex indices may also be found in a variety of non-metallic materials at longer wavelengths— e.g., indium-tin-oxide in the near-IR, sapphire in the mid-IR, etc.) Thus, the reflection phase shift at the metal interface may vary (FIG. 7C). Likewise, if a dielectric film has large optical losses ($k_2\sim n_2$), the reflection and transmission phase shifts at the boundary between the film and the air are not limited to 0 or π as in the case for lossless dielectrics, but rather depend on the degree of optical losses (FIGS. 7A and 7D). The presence of finite loss in layers 2 and 3 therefore creates additional degrees of freedom for designing the absorption and reflectivity of the structure. By combining these interface phase shifts, the phase accumulated through propagation, and the attenuation of the wave as it propagates through the lossy medium, a different type of optical coating, in comparison to the convention coating, is provided herein. See FIG. 7D.

The approach of using ultra-thin, absorptive dielectrics as optical coatings may be applied to a wide array of applications across a range of light frequencies (and, alternatively, wavelengths), starting with simple absorbers and color filters. For example, in addition to the standard filter applications for optical systems, the coloring of metals with nanometer-thick films of inexpensive material may be useful in various aspects of optical device design and visual arts. The large change in optical properties for relatively small changes in material thickness may be used for sub-nanometer optical thickness monitoring of the deposition of semiconductor films (or films of other types of materials, as described above).

The high degree of absorption in semiconductors makes them excellent candidate materials for these ultra-thin coatings, potentially enabling new types of solar cells and photodetectors with enhanced efficiencies that could demand orders of magnitude less semiconductor material, significantly decreasing the material cost and growth time (compared to, e.g., resonant-cavity enhanced (RCE) photodetectors which have an absorbing layer inside a wavelength-scale Fabry-Perot cavity). In photodetectors, a thin layer of highly absorbing material could decrease the detector response time, while solar cell applications could benefit from the large spectral bandwidth of the absorption resonances. Furthermore, in solar cells there is a tradeoff between thickness and material purity which is related to charge carrier lifetimes in materials with defects; making ultra-thin highly-absorbing layers could relax this purity constraint, further reducing costs. Finally, when applied at infrared, millimeter and longer wavelengths, absorbing coatings backed by a reflector may be components of bolometer-type detectors and stealth technology.

Partial Wave Explanation of Resonance

Figures 12A, 12B:
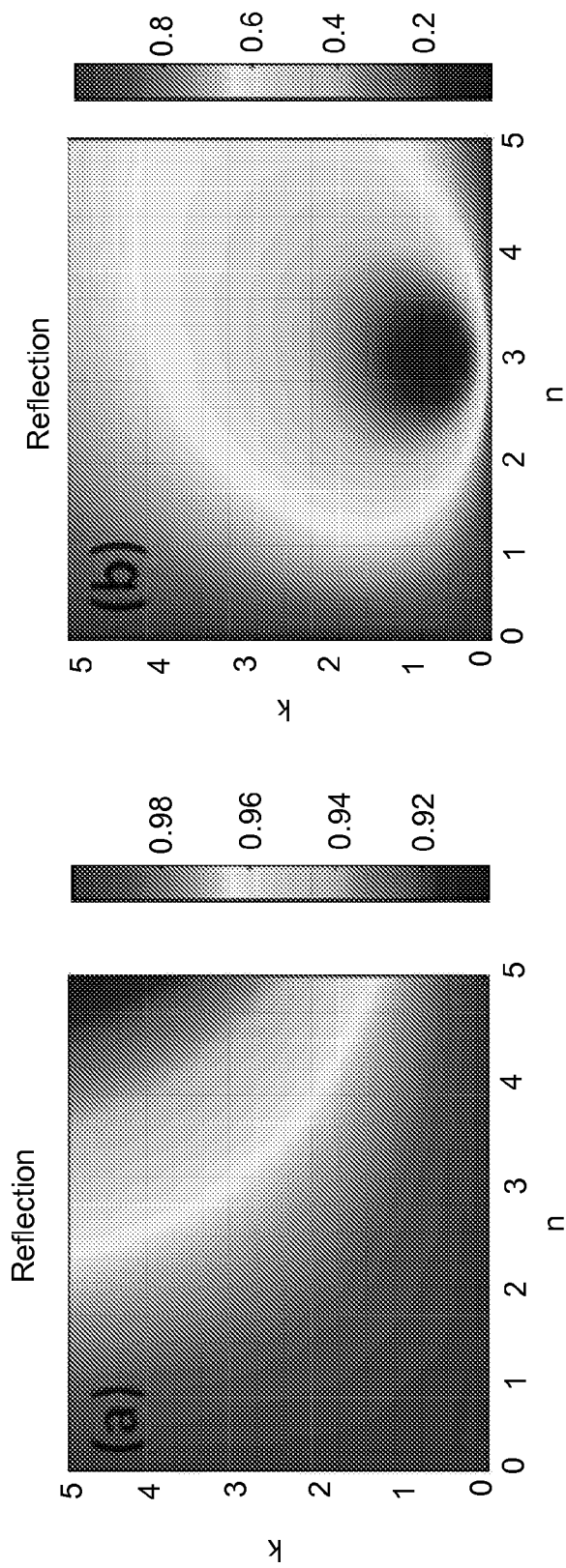
FIGS. 12A and 12B show reflectivity for a film with complex index n+ik and h=10 nm and 50 nm, respectively, on a PEC substrate, at $\lambda=532$ nm.

This section focuses on the physical mechanism of the ultra-thin film resonance and explains the conditions in which it may occur. The total reflectivity from a structure like that in FIG. 7B was first analyzed, where medium 2 has complex refractive index n+ik and medium 3 is a PEC. The reflectivity was plotted at λ=532 nm as a function of n and k in FIGS. 12A and 12B. It was found that for a film with h=10 nm, the reflectivity stays close to 1 for all values of (m, k) from 0 to 5, but for h=50 nm a zero in reflectivity occurs at 2.81 +0.61i, which corresponds roughly to the λ/4n (quarter-wave) film. This may be understood as a critical coupling condition to the lossy Fabry-Perot cavity. No absorption resonance exists for a film thinner than this with a PEC substrate.

Figure 13:
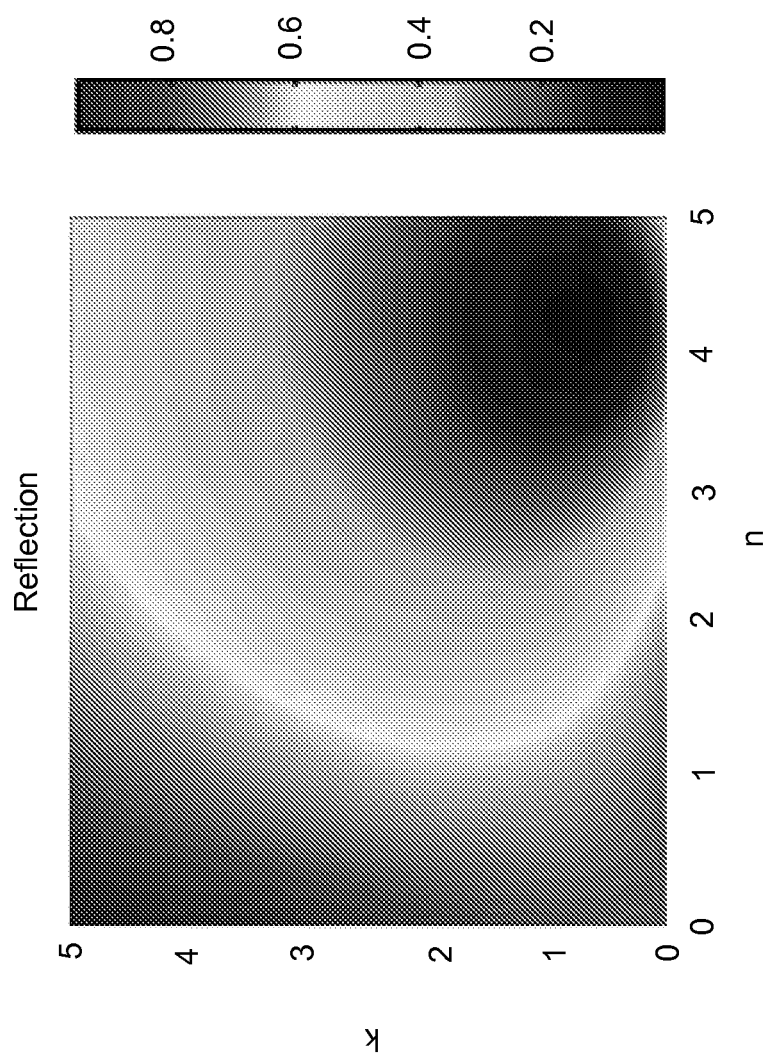
FIG. 13 shows reflectivity for a film with complex index n+ik and h=10 nm on a gold substrate at $\lambda=532$ nm.

When the conductivity of the substrate becomes finite, however (as is the case for metals at visible frequencies (FIG. 7D), the situation changes significantly. For example, FIG. 13 shows the reflectivity vs (m, k) of the films given that the substrate is Au at λ=532 nm ($n_3$=0.44+2.24i). It was observed that when the index of the film is 4.3+0.71i, the reflectivity drops to zero even though the film thickness is only 10 nm, corresponding to ~λ/12n.

To better understand the mechanism leading to the reflectivity minimum at 4.3+0.71i, Eqn. (1) is expanded into partial waves to get $$r = \sum_{m=0}^{\infty} r_m$$

where $r_m = t_{12} r_{23}{}^m r_{21}{}^{(m-1)} t_{21} e^{2mi\beta}$ for m>0 and $r_{pq} = (\tilde{n}_p - \tilde{n}_q)/(\tilde{n}_p + \tilde{n}_q)$, $t_{pq} = 2\tilde{n}_p/(\tilde{n}_p + \tilde{n}_g)$, and $r_0 = r_{21}$. With this formulation, the reflectivity may be plotted taking into account only the first m' partial waves to see how the reflectivity evolves as more and more partial waves are included. This is reflected in FIGS. 14A and 14C, where it was assumed that the substrate is a PEC or Au at 532 nm, respectively, h=10 nm, and $n_2$=4.3+ik where k may vary from 0 to 2.1 (see legend).

Figure 14D:
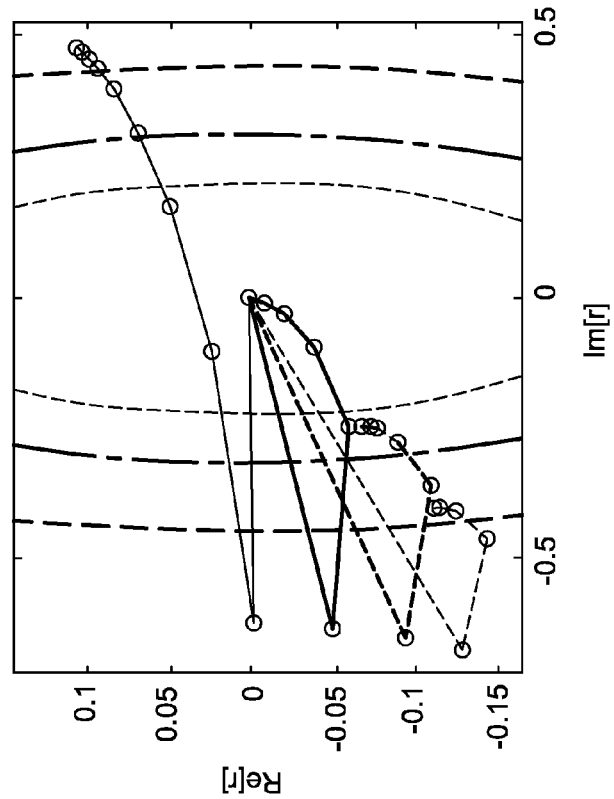
Figure 14C:
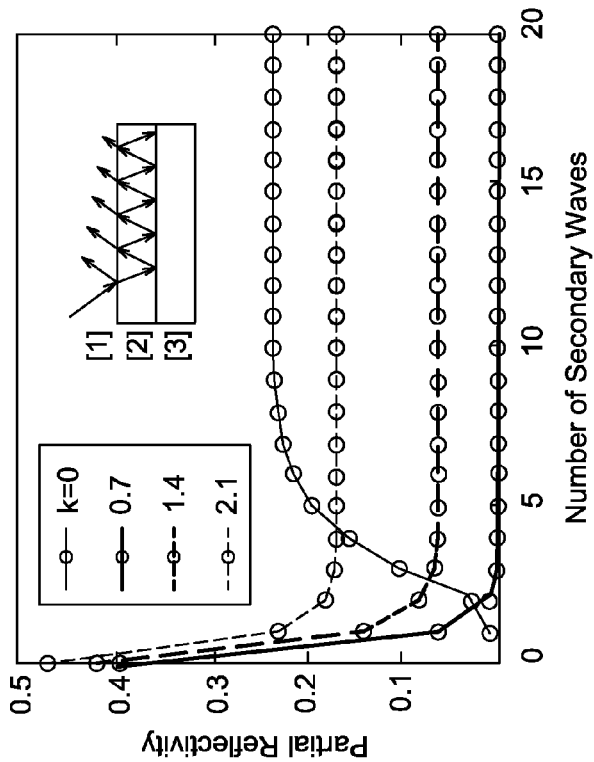

FIG. 14A shows partial reflectivity from the sample taking into account the initial reflection between mediums 1 and 2, and also 0, 1, . . . secondary partial waves where the first partial wave comes from a single round trip through medium 2, the second from two round trips, etc. The substrate is a PEC, with $n_3$=∞+i∞. Medium 2 has index 4.3+ik, where k is given in the legend of (b), λ=532 nm, and h=10 nm. FIG. 14B shows phasor diagram corresponding to (a), showing graphically how all values of k within the range of 0-2.1 lead to roughly the same overall reflection coefficient R (close to 1). The circles each represent a particular reflectivity (R=1: solid line, R=0.2: dashed line, R=0.1: dot-dashed line, R=0.05: dotted line), which is reached if the phasor trajectory terminates on a particular circle. FIG. 14C shows partial reflectivities as in (a), but with $n_3$=0.44+2.24i, the complex index of Au at 532 nm. FIG. 14D shows phasor diagram corresponding to FIG. 14C. The resulting values of R may be calculated by using the circles as a reference. In particular, the k=0.7 trajectory ends up at the origin, yielding R=0.

In the PEC case the final reflectivity is close to 1 for all values of k. Counter-intuitively, the partial reflectivity goes above 1 when only the first 1-2 secondary waves are taken into account, but the value drops back down below 1 when the other partial waves are included, preserving energy conservation. In the case of Au, however, the reflectivity changes significantly with changing k, even reaching precisely 0 at approximately k=0.7. Note that for all cases with significant loss (k>>0) the partial reflectivity reaches its final value only after 3-4 partial waves are accounted for (corresponding to 3-4 passes through the lossy medium), whereas for the lossless case the first 8-10 partial waves all contribute.

Since the partial waves are all complex quantities, they are plotted in the complex plane, where each partial wave is represented as a vector (these vectors are referred to as "phasors") (FIGS. 14B and 14D). The first phasor $r_0$ begins at the origin, $r_1$ begins at the end of $r_0$, etc. The total reflectivity R is the magnitude-squared of the final value of the phasor trajectory in the complex plane (R is zero if the trajectory returns to the origin). In the case of the PEC substrate, the first few partial waves all move away from the origin, indicating constructive interference and therefore a large final value of R (FIG. 14B). With the Au substrate, however, the phasor trajectory makes a sharp turn after the first partial wave, a result of the near-zero phase shift that the light experiences reflecting from a lossy dielectric into a low-optical-conductivity metal (such as Au at 532 nm), opening the possibility that the complex sum of the secondary partial waves could partially or totally cancel $r_0$.

In the phasor diagrams in FIGS. 14B and 14D, we drew circles centered on the origin corresponding to reflectivities R=1, 0.2, 0.1, and 0.05 (solid line, dashed line, dot-dashed line, dotted line, respectively). This allows visual identification of the reflectivity by using the circles as references; for example, since the k=1.4 (red) trajectory terminates between the dotted and dot-dashed circles, we know that R is between 0.05 and 0.1. It was observed that sweeping over possible values of k results in a wide range of reflectivities. In particular, the k=0.7 trajectory terminates precisely at the origin, resulting in R=0 (corresponding to 100% absorption). The reflectivity minimum in n–k space is very broad (FIG. 13), so even when the values do not precisely match those of the minimum-reflectivity condition, a significant absorption resonance may still be observed. This is what happens for evaporated Ge films in the experiments as described above (FIGS. 8B and 8C). While the R =0 condition may not be achieved with the Ge/Au material system in the visible light range at normal incidence due to the limited degrees of freedom ($k_2$ and $n_2$ may be adjusted by controlling the incident wavelength, but not independently of each other), such a condition may be found for some incident angles. For example, the reflectivity in FIG. 9B drops to 0 for θ~70° and λ~535 nm.

Articles with Graded and/or Patterned Highly Absorbing Layers

Figure 20:
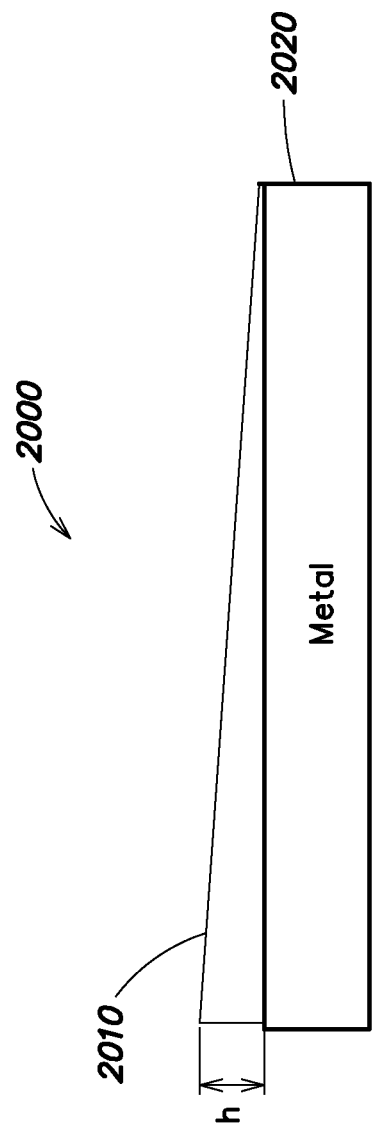
FIG. 20 shows an article comprising a graded absorbing film coated onto a reflective layer (e.g., for "analog" coloring) according to embodiments of the present invention.

In addition to continuous coatings, single- and multi-color coatings can be created by combining the deposition of ultra-thin absorptive films with lithographic or other patterning and printing techniques, such as photolithography, electron beam lithography, interference lithography, nanoimprint lithography, inkjet printing, and other such techniques. For example, FIG. 20 shows an article 2000 with a graded film 2010 of highly absorptive material (e.g., Ge) deposited on a metal (e.g., Au) substrate 2020. The graded film's thickness varies linearly from a maximum height of a few nanometers (e.g., 5 nm, 10 nm, 15 nm, etc.) to a minimum height which may be anywhere from 0 nm to 1 nm, or otherwise less than the maximum height. The article shown in FIG. 20 can be fabricated by evaporation where a mask is slowly moved across the metal during the deposition process, for example, or using any other suitable technique.

Although the film shown in FIG. 20 is graded linearly, other articles may be graded exponentially, superlinearly, sublinearly, logarithmically, or according to any other suitable function. Still other articles may be coated with highly absorbing films whose thicknesses may increase and decrease as a function of position in either one or two dimensions (e.g., sinusoidally, as a Bessel function, in a faceted fashion, etc.).

Figure 21:
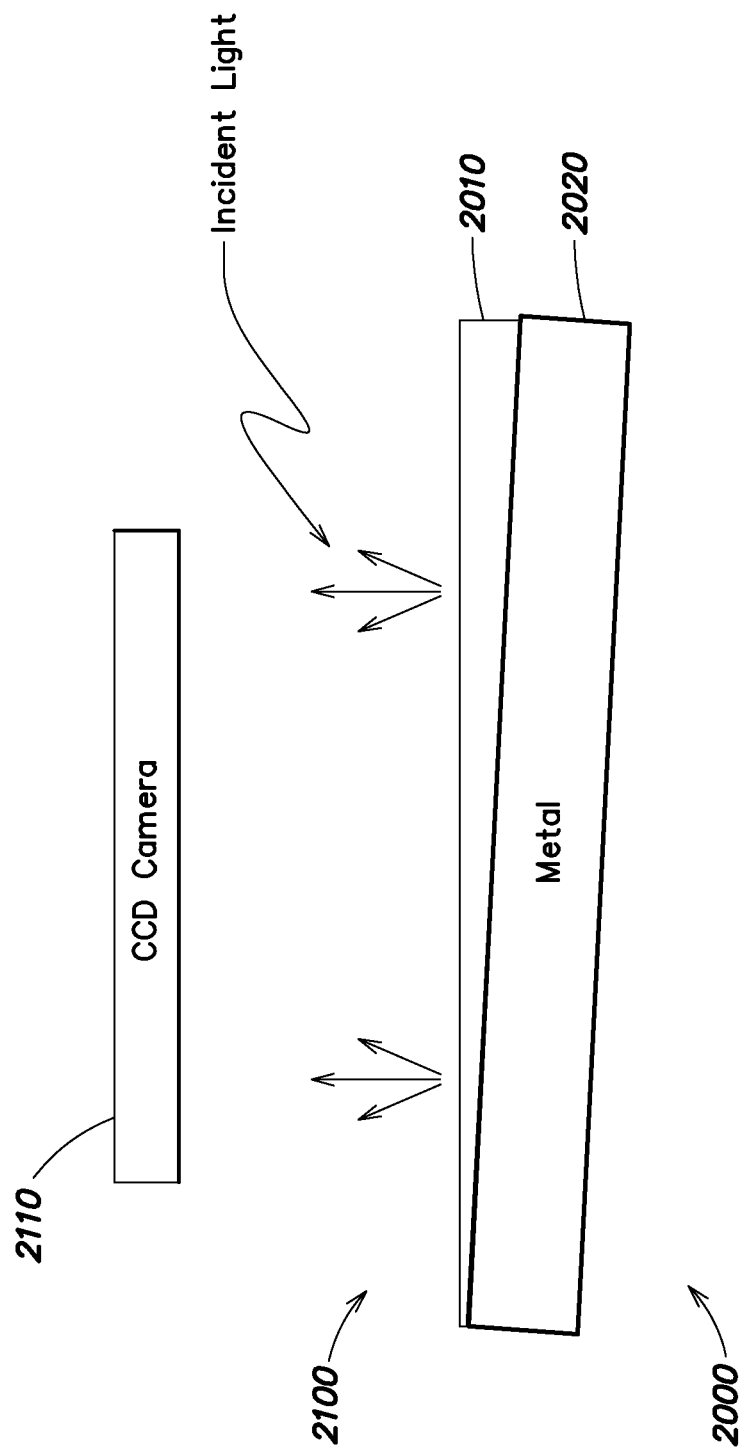
FIG. 21 shows a spectrometer using the article shown in FIG. 20.

FIG. 21 shows a spectrometer 2100 that includes an article 2000 with a graded, highly absorbing film 2010 deposited on a piece of metal 2020 and a charge-coupled device (CCD) camera 2110 (or other suitable detector), which images the surface of the article. The article absorbs light in different bands of the spectrum at different positions because the height of the highly absorbing varies as function of position. The metal reflects those colors that are not absorbed by the graded coating. As a result, the article reflects different colors (spectral components) at different positions along its surface. If the reflection spectrum is known for each position on the article's surface, it is possible to calculate the incident light spectrum from the image of the surface captured by the CCD camera.

This spectrometer's operation is similar to the operation of a grating spectrometer, except that the grating is replaced by the graded ultra-thin film. Unlike the grating, however, the article reflects different colors at different positions instead of diffracting different colors in different directions. Because the FIG. 21 spectrometer separates colors by position, not angle, the thin film (i.e., the article) does not have to be in the far field as it does for a grating spectrometer or prism spectrometer. Instead, it can be close to the detector. In fact, the graded absorbing layer can even be coated onto the active areas of the detector elements, e.g., on top of a transparent metal layer or directly onto the active area(s) provided the active areas are sufficiently reflective. In some cases, the graded coating may be patterned as described below, e.g., so that only the active areas are coated.

Figure 22B:
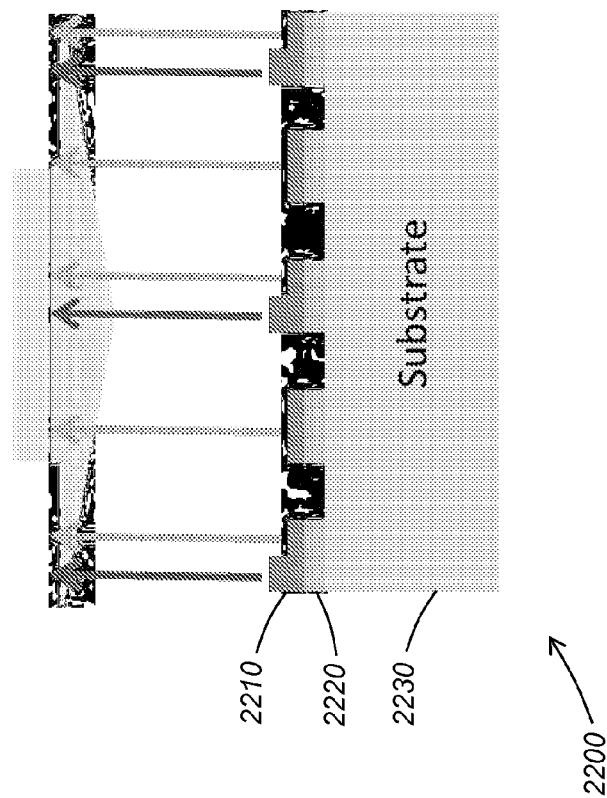
FIG. 22B is a color photograph of an article with a logo formed by a patterned highly absorbing film coated onto a patterned reflective layer.
Figure 22A:
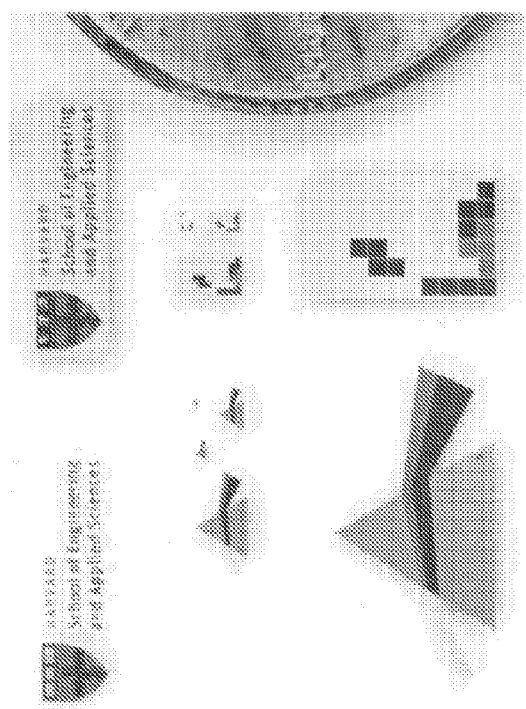
FIG. 22A shows an article comprising a patterned highly absorbing film coated onto a patterned reflective layer, which in turn is deposited on a substrate according to embodiments of the present invention.

FIG. 22A shows an article 2200 comprising a substrate 2230 coated with a patterned ultrathin, highly absorbing layer 2210 (e.g., a Ge layer) on top of a patterned metal layer 2220 (e.g., a layer of Au). As explained above, the wavelength of the highly absorbing layer/metal layer combination's peak reflectivity depends on the thickness of the highly absorbing layer. Varying the thickness of the highly absorbing layer produces a surface that reflects different colors at different spatial positions. The metal layer can also be etched away or selectively deposited to expose the surface of the substrate as shown in FIG. 22A.

If desired, the highly absorbing layer can be patterned to represent an image (e.g., a logo), a spectrally selective one- or two-dimensional bar code (e.g., a "red" bar code interleaved with a "green" bar code), a spatially varying anti-reflection coating, an alignment mark, or any other suitable spatially varying arrangement. For instance, the absorbing layer could be coated onto different pixels of a detector array or onto different sensing elements on a single chip at different thicknesses to create a detector (or group of detectors) with spectral response that varies with pixel (or detector) position. It can also be patterned to form a grating with periodic or variable (e.g., chirped) spacing between adjacent grating rules. In particular, a loss-coupled (also known as a complex-coupled) diffraction or feedback grating can be realized. In such a grating, the loss is periodically modulated along a given direction.

The highly absorbing layer and/or reflecting layer can also be patterned to include sub-wavelength features, e.g., to form planar photonic crystals, or other planar nanostructures for beam steering and other applications. Sub-wavelength patterning allows one to engineer the effective optical properties of the ultra-thin film, which opens up another degree of freedom. For example, mixing sub-wavelength regions of semiconductor with sub-wavelength regions of air yields a less absorptive layer, changing the optical properties of the layer. This can be seen as an example of a "metamaterial" or "metasurface."

Figure 35:
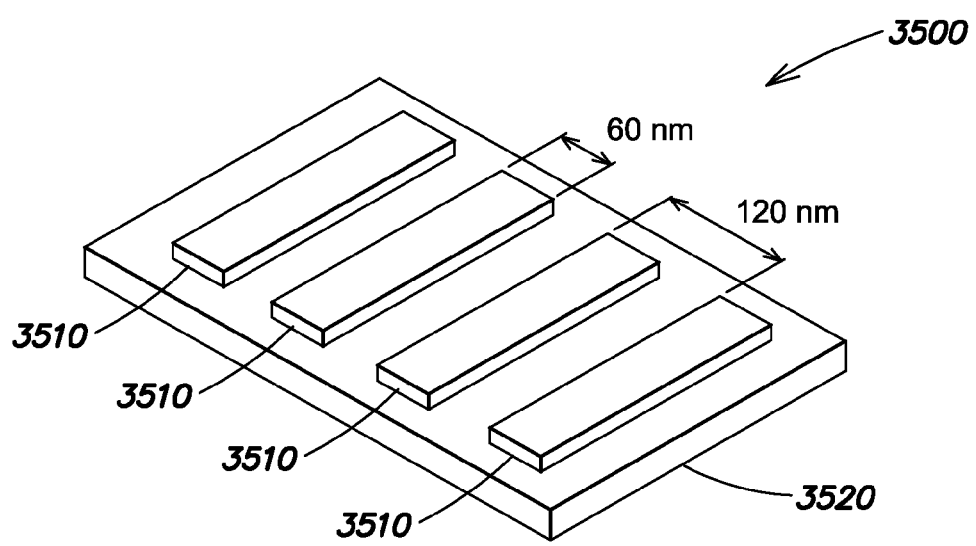
FIG. 35 illustrates an article with a form birefringent ultrathin coating according to embodiments of the present invention.
Figure 36A:
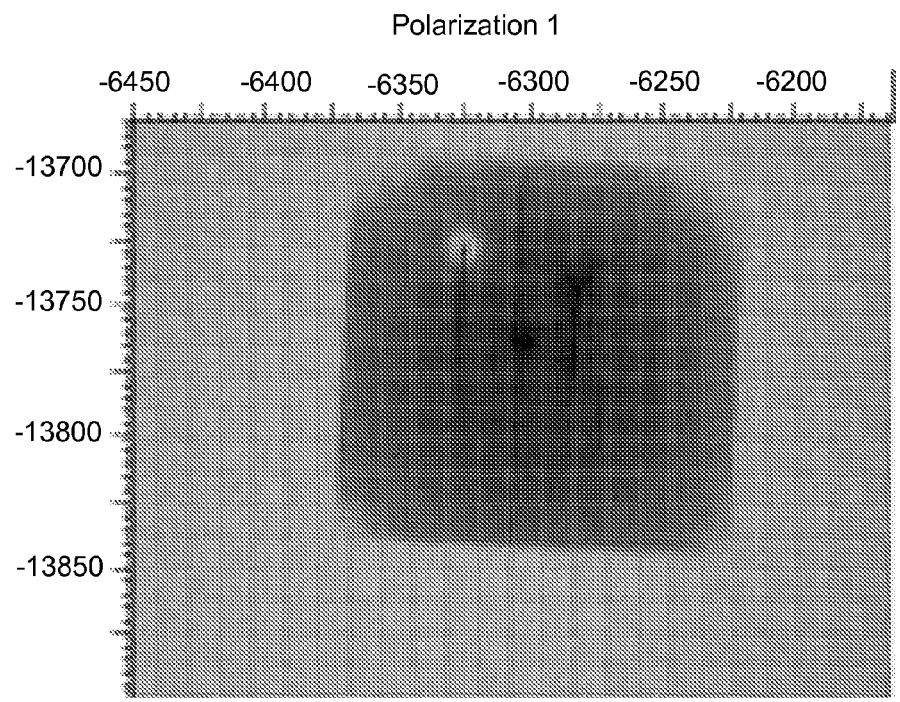
FIGS. 36A and 36B illustrate performance of the article shown in FIG. 35.
Figure 36B:
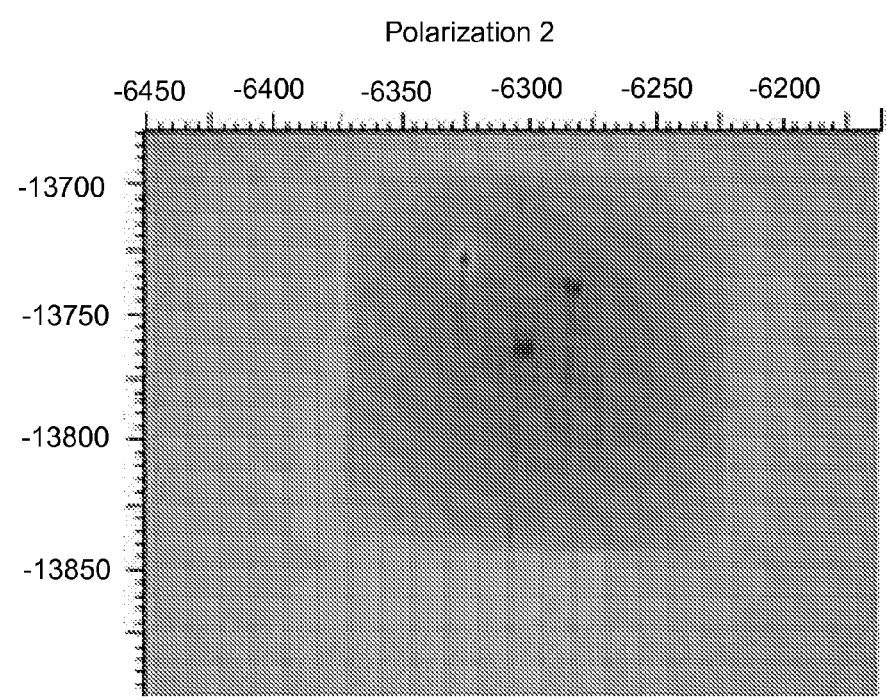

FIGS. 35, 36A, and 36B illustrate how the orientation of sub-wavelength patterning may be selected to provide a desired "form birefringence." An example would be sub-wavelength patterning with a particular orientation (e.g., lines much longer than a wavelength with a periodicity much shorter than the wavelength) to provide a response (e.g., a variable reflectivity) that depends on the polarization, wavelength, and position of the incident beam. For instance, FIG. 35 shows a form-birefringent structure 3500 with 120 nm pitch and a duty cycle of 0.5, comprised of evaporated Ge (10 nm-thick) 3510 on an opaque Au substrate 3520. FIGS. 36A and 36B are microscope images for two different polarizations of the form-birefringent structure shown in FIG. 35.

Patterning thicker films (such as optical coatings that are thicker than $\lambda/4$ or other thick layers) can be challenging because of the high aspect ratios involved. Conversely, in the ultrathin structures disclosed herein the aspect ratios are very low because the thicknesses are on the order of nanometers or tens of nanometers, easing fabrication requirements.

FIG. 22B is a photograph of color images generated via multi-step patterning of ultra-thin Ge films, with the edge of a United States penny included for size comparison. Five steps of photolithography with alignment are used to selectively deposit an optically-thick layer of Au on a glass slide, followed by Ge layers of either 7 nm, 11 nm, 15 nm, or 25 nm. This yields light pink, purple, dark blue and light blue colors, respectively. (Among the demonstrated patterns are the logo and shield of the Harvard University School of Engineering and Applied Sciences; these are a trademark of Harvard University, and are protected by copyright; they are used here with permission.)

Figure 23:
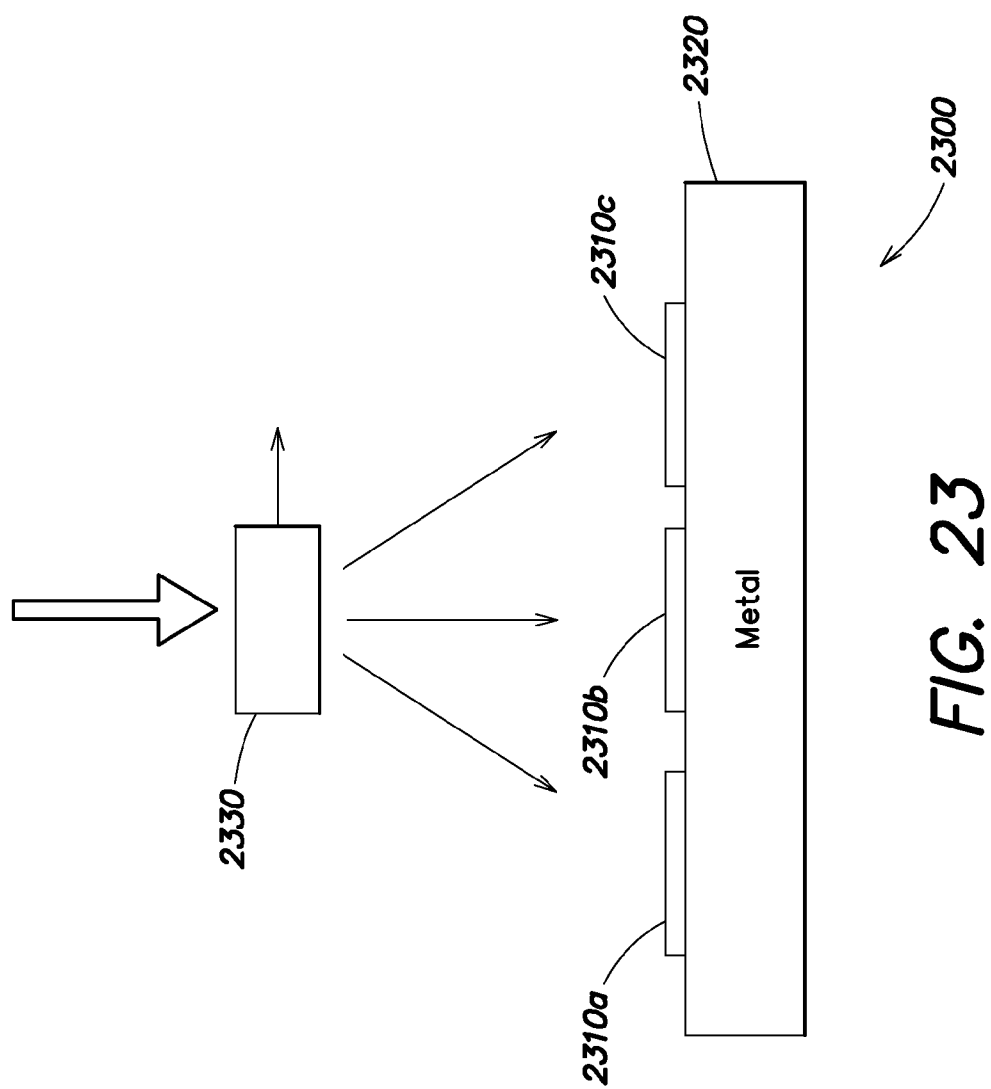
FIG. 23 shows an effectively planar structure having different areas coated with different highly absorbing film/reflective layer coatings according to embodiments of the present invention.

FIG. 23 shows a device 2300 with several active areas optically coupled to a frequency splitter 2330 (e.g., a prism or a dichroic beamsplitter). Each active area represents a solar cell, photosensor, or other photoelectrically active region, and each active region is coated with a separate ultrathin, highly absorbing film (films 2310a, 2310b, and 2310c; collectively, films 2310) on a metal substrate 2320. These film coatings 2310 can be selected to transmit light at a particular frequency or frequency band, including those dispersed by the frequency splitter. For example, the active areas might comprise arrays of detectors each sensitive to a different wavelength of light, with all detectors on a single chip. These areas could be arranged as red-green-blue pixels, like a Bayer filter in a digital camera, or as an on-chip spectrometer. These areas could also be different devices, such as a solar cell on one part of chip, and a detector on another, with the solar cell providing a bias voltage for the detector.

Because these coatings are so thin (e.g., less than $\lambda/4n$), they can be treated as "effectively planar" and used in device applications involving effectively planar structures. That is, even though the different coatings may have different thicknesses, the differences are small that they do not matter very much—the coatings are not strictly planar, but are thin enough that they can be considered planar. This is valuable for optoelectronic integrated circuits and other integrated optics, including optoelectronic circuitry on a single silicon substrate. For instance, an effectively planar coating may be used to form one or more diffraction gratings, each of which has a different period and different modulation depth. As understood by those of skill in the art, the period and modulation depth can be selected to achieve a particular diffraction angle and diffraction efficiency at a given wavelength or set of wavelengths.

Such a diffraction grating can be made using patterns of ultra-thin films such that there are multiple periodicities present, with each periodicity being sensitive to a particular color. In FIG. 22, for example, the 1-layer coating of absorbing material has a period L, and the 2-layer coating has a period 2 L. In this example, the pink light is strongly scattered by the 1-layer coating with period L, whereas the violet light is strongly scattered by the 2-layer coating with period 2 L.

Figure 24:
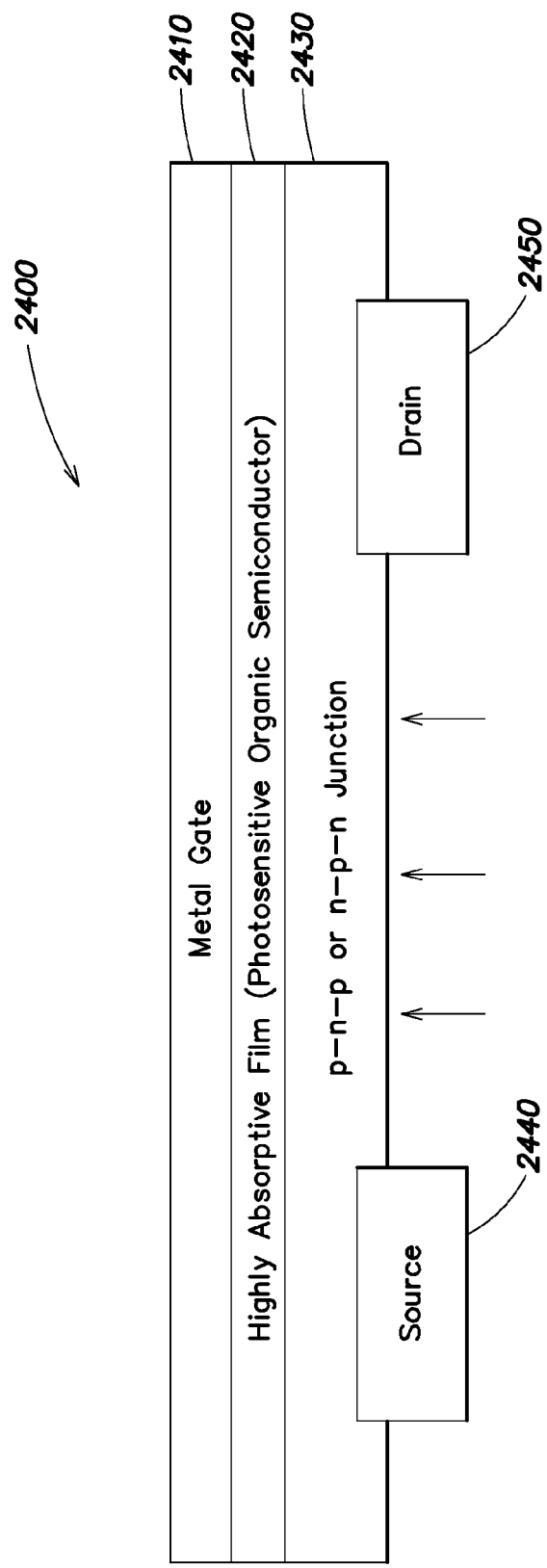
FIG. 24 shows a thin-film transistor that can be coated with different and/or patterned highly absorbing film/reflective layer coatings according to embodiments of the present invention.

FIG. 24 illustrates a thin-film bipolar transistor (TFT) 2400 with a thin absorptive film 2430 on a metal reflector 2410 that can be used for photo-detection. In this case, the gate 2410 of the TFT acts as the metal reflector. The TFT 2400 also includes a source 2440 and a drain 2450 on the thin absorptive film 2430. A thin, high-K dielectric 2420 acts as an insulator between the semiconductor p-n-p or n-p-n junction and the gate. This insulator material may be transparent and thin (e.g., less than $\lambda/4n$). Its thickness as well as the thickness of the semiconductor in which the p-n-p (or n-p-n) junction is formed can be tuned to form the absorption resonance discussed above. The semiconductor material can be chosen (or modified by appropriate doping) to have high optical absorption. As light impinges on the structure and is absorbed, photo-carriers are generated, which affects the off-state current of the transistor and its turn-on voltage, hence allowing detection (and measurement). The gate can be used to tune the detector response.

Embodiments of the present invention use an ultra-thin film resonance to enhance the efficiency of various existing types of light detector. This ultra-thin film resonance can be achieved with a sub-quarter-wave-thickness lossy film on top of a metal with finite AC conductivity or its optical equivalent (e.g., k>n, but not k>>n)). A metal with finite AC conductivity or its optical equivalent may be referred to herein as a "finite-σ metal." In the visible portion of the electromagnetic spectrum, finite-σ metals include but are not limited to Au, Al, tin nitride (TiN), etc.

FIGS. 37A and 37B show a design for a photoconducting detector 3700. A "finite-σ metal" pad 3720 is defined on an insulating substrate 3710 (such as fused silica, or another type of glass, for example) used as the back reflector. A very thin (e.g., sub-5 nm, but could be thicker such as sub 30 nm) insulating layer 3730 is put down, which could for example be hafnium oxide ($HfO_2$) or aluminum oxide ($Al_2O_3$) deposited by ALD or other means. The next layer is the ultra-thin semiconducting material 3740 to be used as the photoconducting layer. As discussed elsewhere in this document, this could be amorphous silicon (a-Si), germanium, or other material. Then a metal 3750 is used to define contacts (e.g., source 3760 and drain 3770) on top of the photoconducting layer, for example with aluminum (Al). This contact may be an ohmic contact or a Schottky barrier. The contacts could be side-by-side pads. The contact also be interdigitated as shown in FIG. 37B (the top view). In the interdigitated case here, the arm spacing should be significantly bigger than the wavelength of light (at least 5-10 times) to avoid diffraction/edge effects. This device works by enhancing the percentage of absorbed light impinging from the top within the photoconducting layer. When the photoconducting layer absorbs light, its resistivity changes, and a change in resistance can be measured between the contacts. This can be done, for example, by putting a bias voltage between the contacts and measuring the current which flows the leads.

Figure 38:
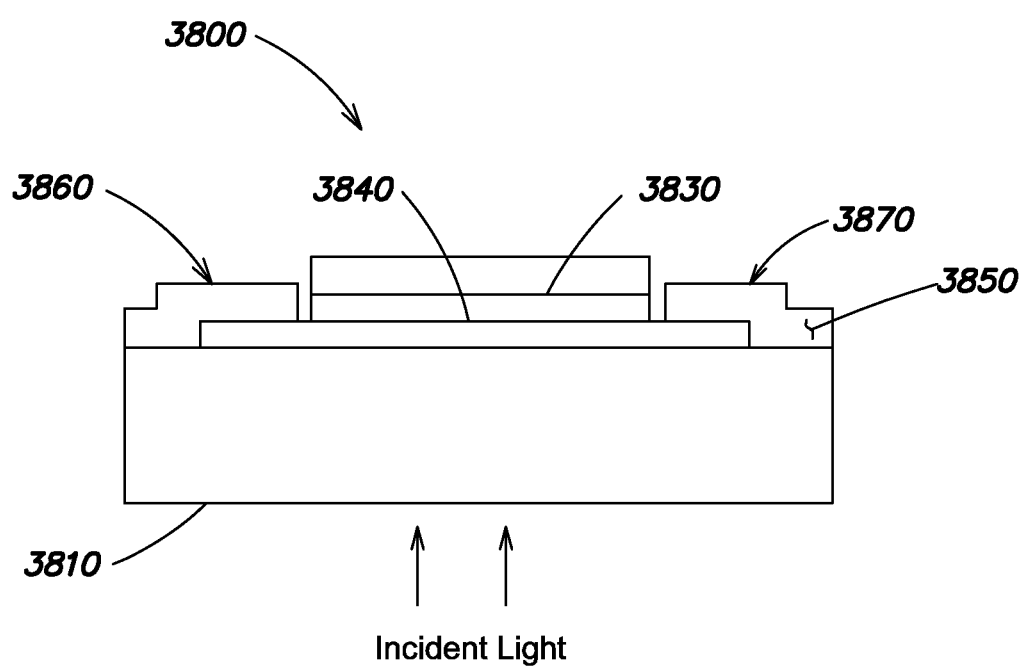

FIG. 38 shows a detector 3800 that is conceptually similar to that of FIGS. 37A and 37B, but the structure is inverted. This detector 3800 includes an insulating, transparent substrate 3810 coated with an ultrathin photoconducting layer 3840, which in turn is coated with a thin insulating layer 3830. Contact metal 3850 on the thin insulating layer 3830 forms a source 3860 and a drain 3870. The substrate 3810 transmits light incident on the bottom of the device 3800.

FIGS. 39A and 39B show a photoconducting detector 3900 similar to the detectors shown in FIGS. 37A, 37B, and 38. In this case, the electrical contacts 3950 (source 3960 and drain 3970) are coated on an ultra-thin photoconducting layer 3940, which is on an insulating, transparent substrate 3910, and act as a back-reflector. In this design, the electrodes are interdigitated but unlike in the design on FIGS. 37A and 38, the interdigitated fingers are much thinner than the wavelength of light the detector is designed to sense, and the separation between them is much smaller than the wavelength as well. As a result, the patterned metal on top of the photoconductor can be viewed as a metamaterial, and the effective complex refractive index can be engineered not just by the choice of material but also by the spacing between the arms and the duty cycle (ratio between the arm thickness and period). As a result, even metals which are otherwise not suitable for the ultra-thin film interference effects (those metals that too close to the perfect electric conductor limit) can be made suitable (similar optically to "finite-σ metal") by the right patterning.

Figure 40A:
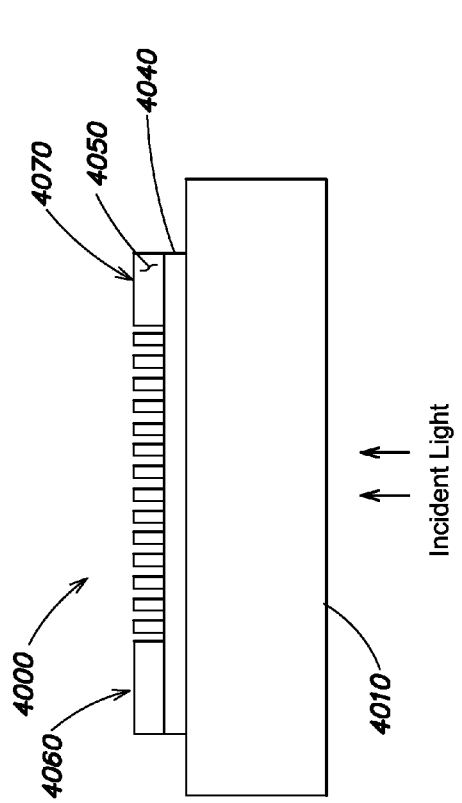
Figure 40B:
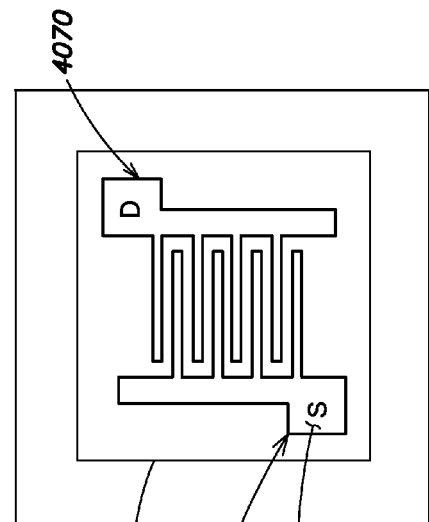
Figure 40C:
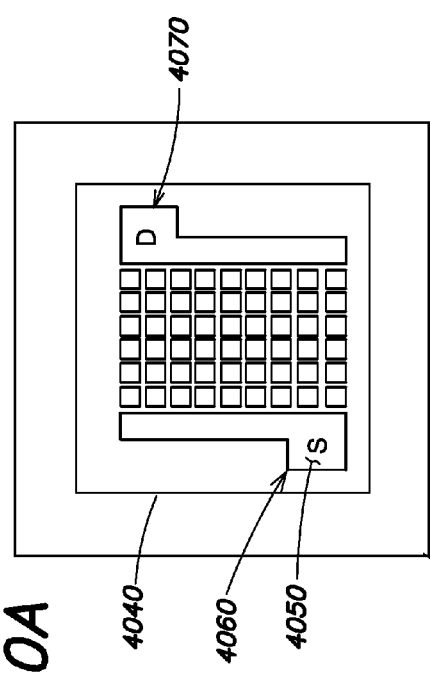

FIGS. 40A, 40B, and 40C show a photoconducting detector 4000 similar to the detector 3900 shown in FIGS. 39A and 39B. As above, the detector 4000 includes a patterned metal 4050 on top of a photoconducting material 4040 (which is on an insulating, transparent substrate 4010) that operates as a metal with effective optical properties. In this case, the metallic pattern 4050 is not necessarily connected to the electrical contacts (source 4060 and drain 4070) on the side, and can be interdigitated (FIG. 40B) or pixelated (FIG. 40C).

Figure 41:
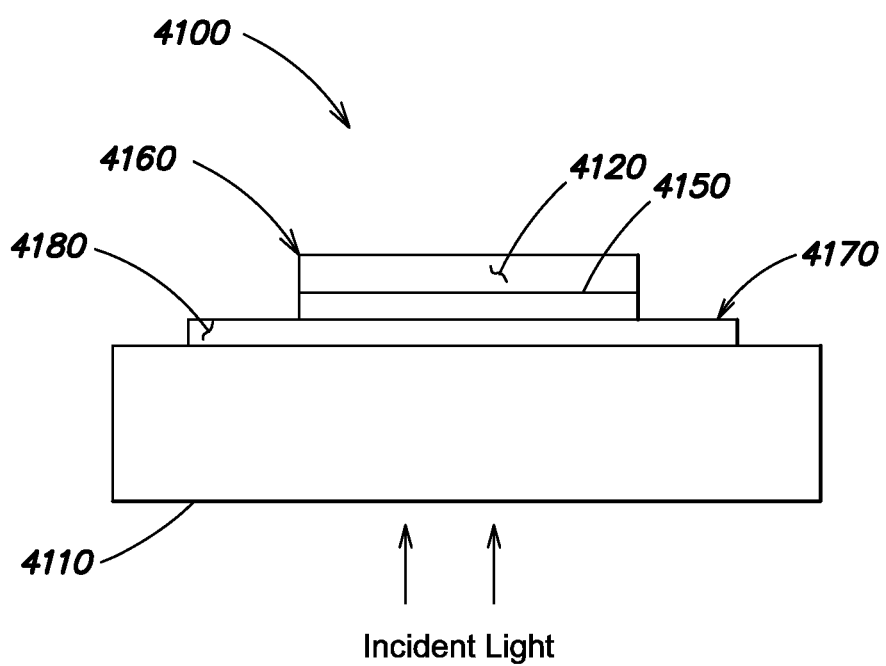

FIG. 41 shows a detector 4100 based on a vertical Schottky barrier. A source 4160 is formed in a metal layer 4150 are on the top of a semiconductor layer 4140, and a drain 4170 is formed in a transparent conductor 4180 between the semiconductor layer 4140 and an insulating, transparent substrate 4110. The metal layer 4150 and transparent conductor 4180 are both conducting, but have (substantially) different work functions such that one is an ohmic contact, and the other a Schottky contact. The bottom contact consists of a transparent conductor (such as indium tin oxide (ITO) or another transparent conducting oxide (TCO)) whereas the top contact is the metallic reflector layer ("finite-σ metal") as described previously. Light is incident from the transparent substrate side.

Figure 42A:
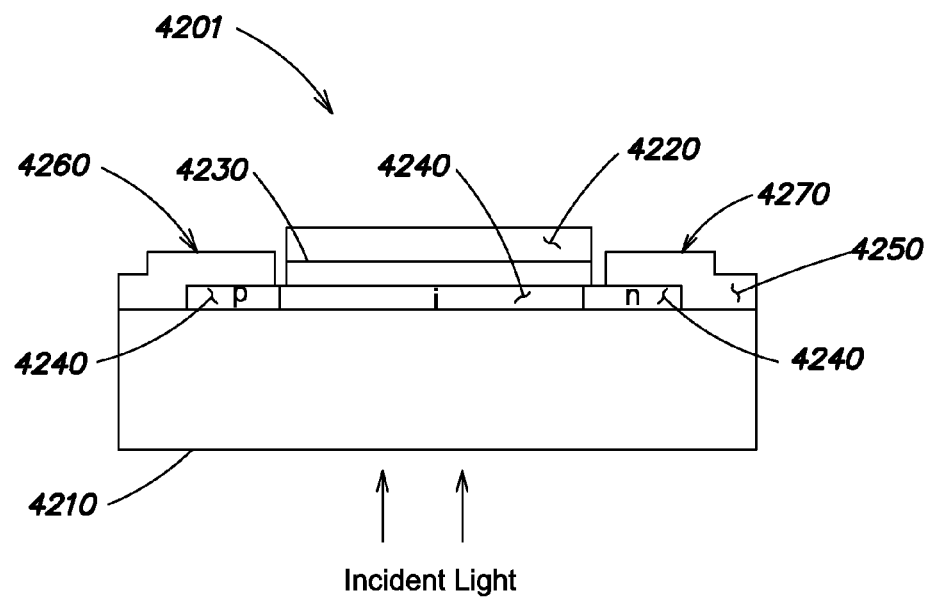
Figure 42B:
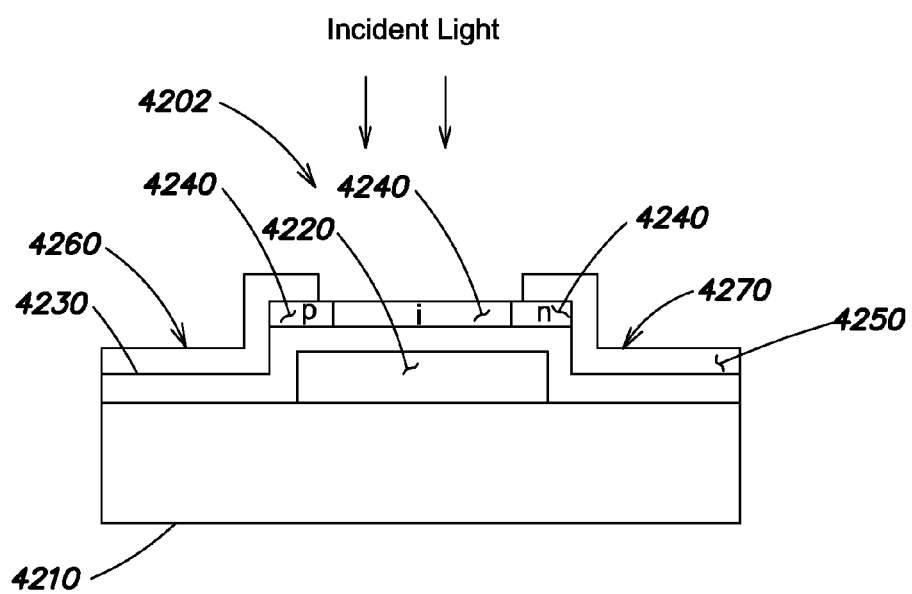

FIGS. 42A and 42B show two types of horizontal (lateral) photodetectors 4201 and 4202 based on a p-i-n junction. In type 1, the p-i-n layer is formed of appropriately doped semiconductor material 4240 placed directly on a transparent, insulating substrate 4210. The p and n sections are contacted with ohmic contacts (e.g., source 4260 and drain 4270), and the intrinsic region is covered with a very thin insulator layer 4230 as described above with respect to FIGS. 37A and 37B, and followed by the reflecting ("finite-σ metal") layer 4220. In this case, light is incident from the bottom through the transparent substrate. Alternatively, the structure can be inverted (Type 2), with light impinging on the p-i-n junction from the top.

Figure 43:
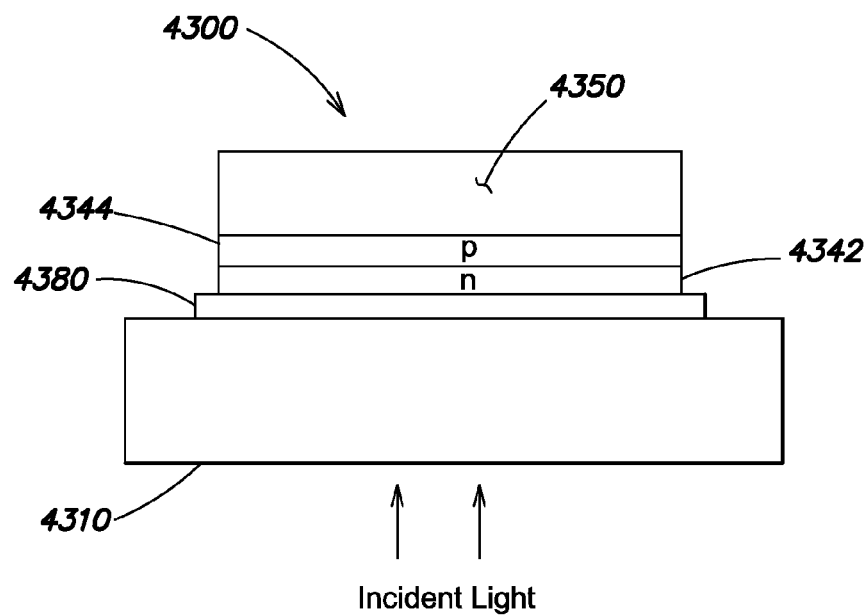

FIG. 43 shows a vertical p-n junction detector 4300. In this case there is no intrinsic layer, because the entire junction is ultra-thin (sub-quarter-wave). In this case, a transparent conductor 4380 (ITO or another TCO) is used as the bottom contact, and a back-reflector 4350 ("finite-σ metal") on top serves as the top contact. Light is incident from a transparent substrate 4310, gets absorbed within the p-n region (semiconductor layers 4342 and 4344), and the split carriers are collected from the contacts.

Figure 44:
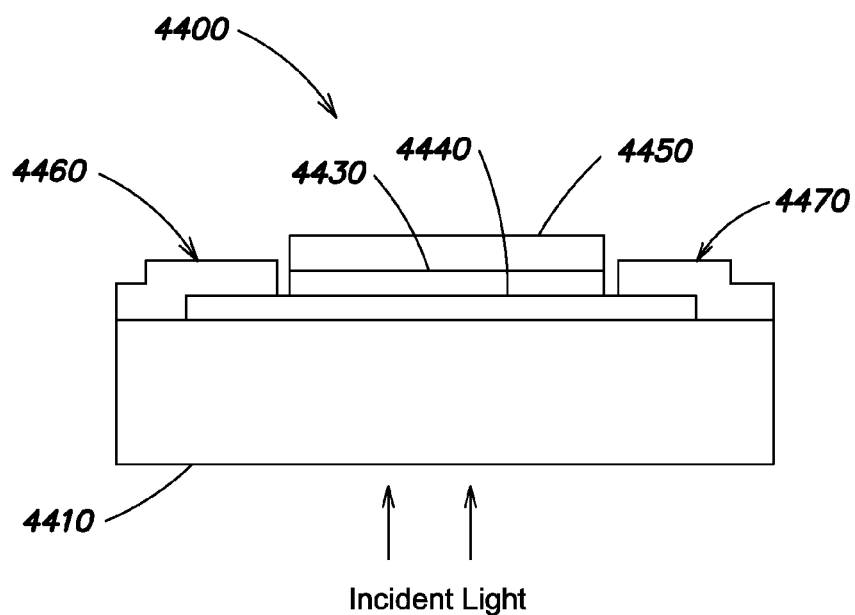

FIG. 44 shows a lateral Schottky barrier photodiode 4400. In this case, an ultra-thin semiconductor layer 4440 is disposed directly onto a transparent substrate 4410, and contacted by contacts of two different metals such that one creates a Schottky barrier 4470 and the other creates an ohmic contact 4460. The middle part of the semiconductor layer 4440 is then covered by a thin insulator layer 4430 and a reflector 4450 ("finite-σ metal"), as described above, to enhance absorption in the semiconductor region.

Optical Coatings on Transmissive Substrates

In alternative examples, the metal layer can be thin enough to transmit incident light. For instance, an alternative spectrometer may include a graded (or patterned) coating deposited directly on the active areas of the detector elements (or perhaps on a transparent metal layer deposited on the detector elements) as described above. Other examples include colored transmission spatial filters, as well as various "stained glass"-like images.

Figure 32A:
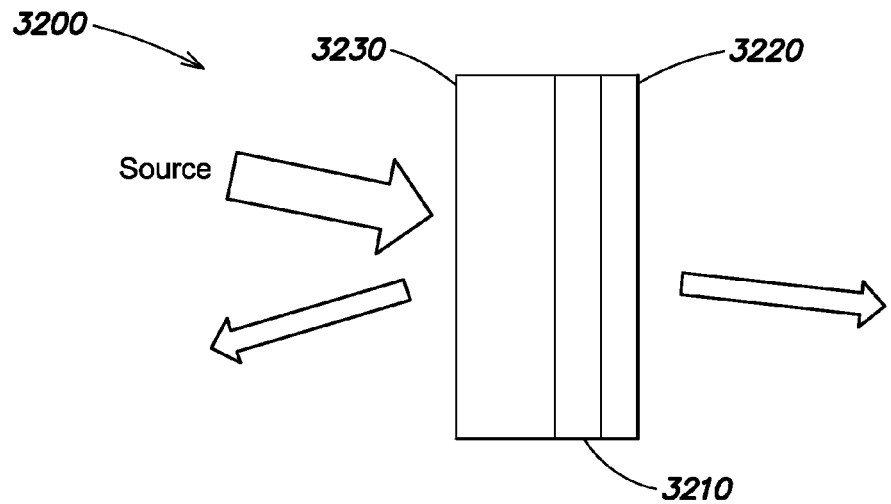
FIGS. 32-34 illustrate transparent and partially transparent substrates coated with ultrathin, highly absorbing layers according to embodiments of the present invention.
Figure 32B:
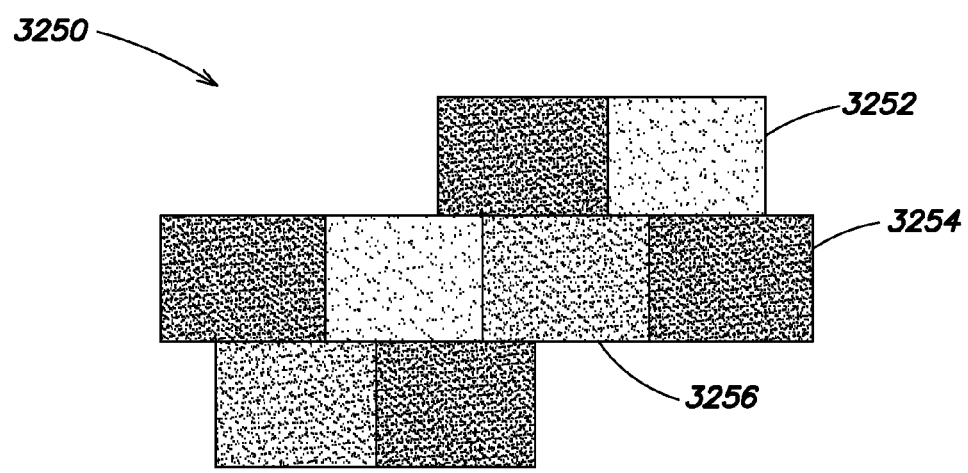

Furthermore, the substrate need not necessarily be completely opaque. In the case of a semi-transparent or transparent substrate, new functionalities can be obtained from ultra-thin coatings. As an example, using the example material system of Ge and Au, a set of optical filters 3200 operating in transmission mode can be created by depositing a thin semi-transparent layer 3220 of Au (e.g. 5 to 80 nanometers) on glass 3230 or another transparent material, and then depositing the ultra-thin layer 3210 of Ge as shown in FIG. 32A. Each filter's transmission wavelength can be set to a different value by selected the appropriate layer thickness and composition. If desired, multiple filters (e.g., filters 3252, 3254, 3256) can be used to create a transmissive display 3250 resembling "mosaics" or "stained glass" (e.g. those found in church/cathedral windows) whereby the light coming in from the outside gets filtered to create colorful patterns as shown in FIG. 32B.

Figure 33A:
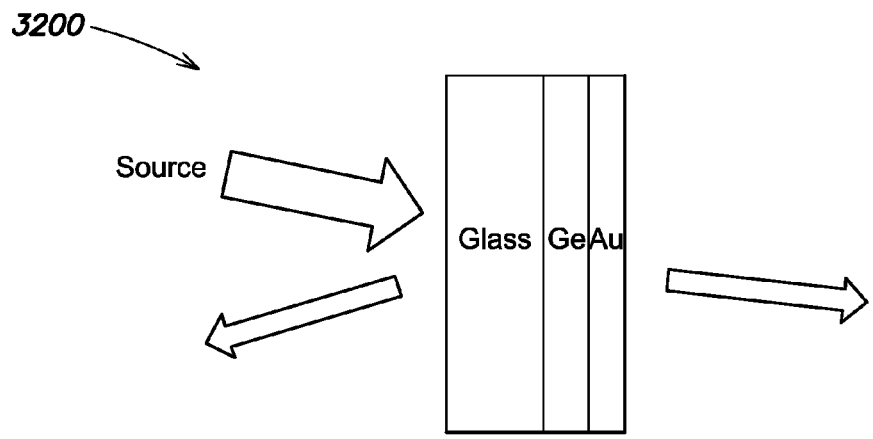
Figure 33B:
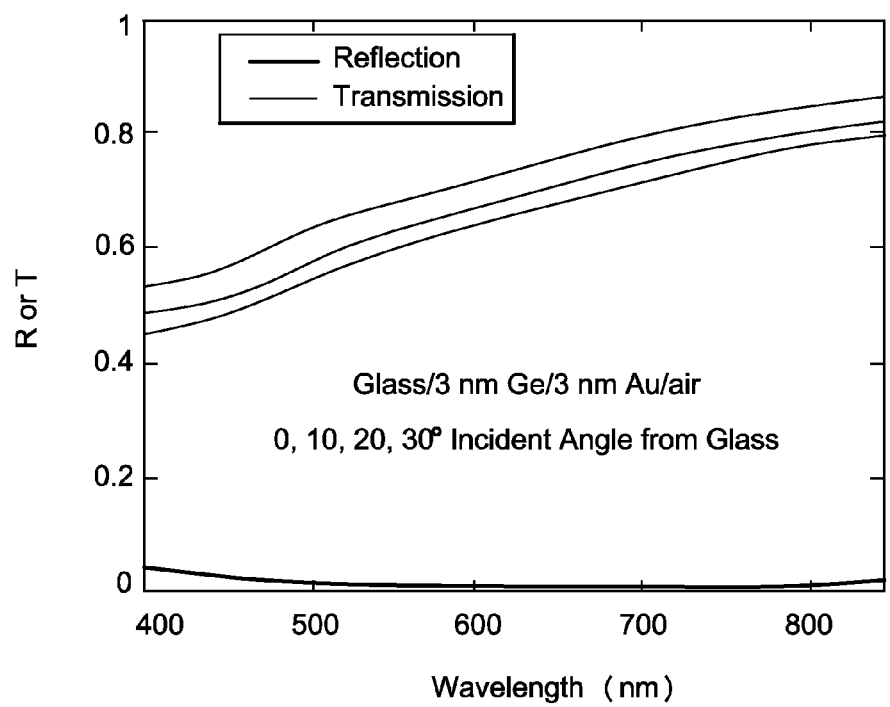

FIGS. 33A and 33B illustrate how these coatings on semi-transparent or transparent substrates can be used to create anti-reflection behavior, which may in certain applications augment or replace conventional anti-reflection coatings. As a particular example, homogeneous films of Ge and Au, 3 nm thick each, deposited on a glass slide creates an anti-reflection coating, designed to operate for light incident from the glass side as shown in FIG. 33A. This structure has a broadband anti-reflection feature centered at 650-700 nm and extending across most of the visible spectrum as shown in FIG. 33B.

Figure 34:
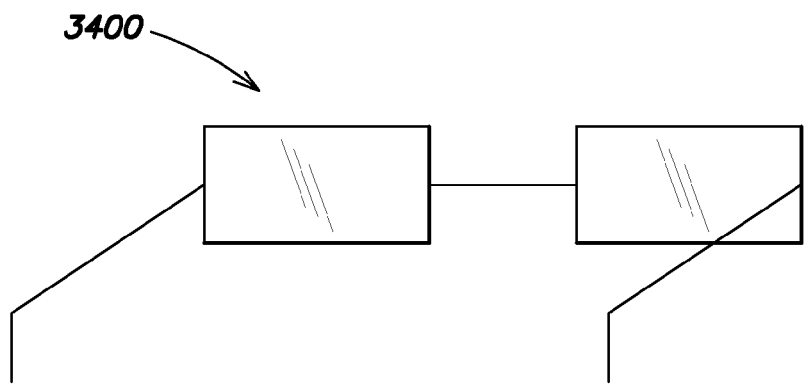

For substrates with higher index than that of glass (n~1.45), the Ge and Au layers should be slightly thicker. For example, to obtain anti-reflective features in the visible for light incident from the substrate side where sapphire (n~1.75) is the substrate, a thickness of 5 nm for Ge and 6 nm for Au can be used. This form of anti-reflective coating has several features: (1) it is significantly thinner than conventional anti-reflection coatings; (2) it is relatively angle-insensitive, so it works for a wide range of incident angles; (3) it is generally broadband, that is suppressing reflections at more than one frequency; (4) it is "one way" in that the reflectivity properties are different when illuminated from the substrate side compared to the other side (air or otherwise); and (5) unlike conventional anti-reflection coatings, the transmitted intensity is decreased compared to the situation without the coating (without the Ge and Au). The suppression of reflection enables a variety of optical devices; for example to decrease unwanted reflection feedback (into a laser cavity, e.g.), to reduce glare, to use as a beam-stop for stray beams. As one particular example, the suppression of reflection and the decrease in transmission of these coatings can be used to create glare-reducing sunglasses/visors 3400 like those shown in FIG. 34.

These anti-reflection coatings are not limited to the visible range or the Ge/Au material system described above. Other material combinations may be used at longer wavelengths, where having an anti-reflection coating much thinner than the wavelength of light may offer advantages. For example for a mid-infrared wavelength of 10 μm, a conventional quarter-wave antireflection coating assuming a refractive index between 1.5 to 3 may be between about 800 nm to about 1600 nm in thickness. For a terahertz wavelength of 100 μm, however, a conventional quarter-wave antireflection coating may be between 8 μm and 16 μm in thickness. These thicknesses may be challenging to achieve with physical or chemical vapor deposition processes.

Conversely, an ultra-thin antireflection coating at a wavelength of 100 μm may be 1-2 μm in thickness, which is less challenging to achieve with physical or chemical vapor deposition. These coatings can be made with highly lossy dielectrics and metals with limited AC conductivity in the infrared and terahertz, for these two respective frequency ranges. This can be accomplished by doping semiconductors: for example, doping typical semiconductors such as Si, Ge, GaAs, InP, etc to doping densities of $10^{16}$ cm$^{-1}$ to $10^{17}$ cm$^{-1}$ creates highly absorptive dielectrics in the terahertz, whereas doping densities above that may create metals with limited AC conductivity. Therefore, an anti-reflection coating can be grown using even a single material system with various doping levels using CVD or MBE, for example.

Fabrication Techniques

Figure 25:
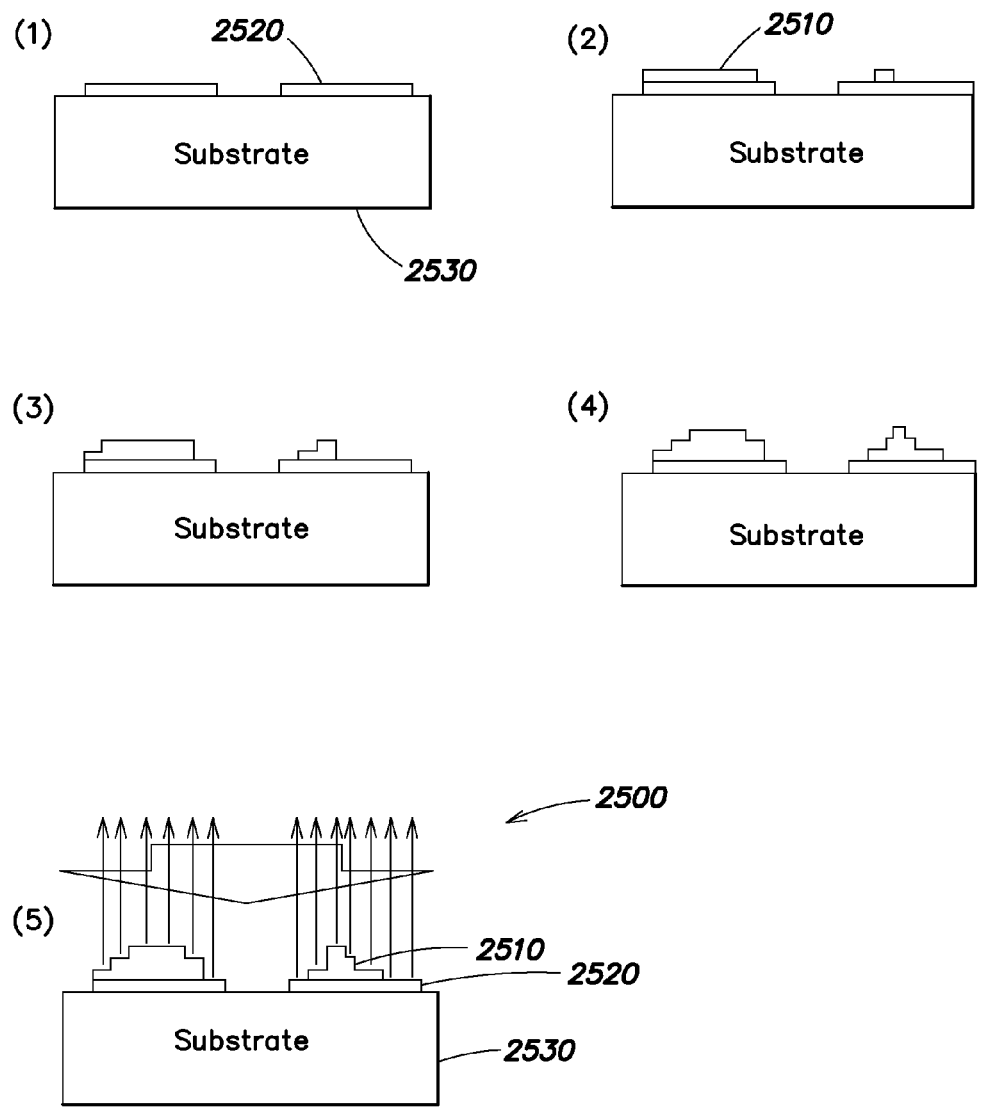
FIG. 25 illustrates a sample process for making an article with a patterned highly absorbing film coated onto a patterned reflective layer according to embodiments of the present invention.

FIG. 25 illustrates a contact photolithography process with alignment for making an article such as those shown in FIGS. 22A and 22B. Photoresist (e.g., Shipley S1813 photoresist) is spun onto a glass slide (e.g., at 4000 rpm), exposed through chrome-coated glass photomasks using a mask aligner (e.g., a Karl Suss MJB4 mask aligner), and then developed (e.g., using CD-26). In (1), a metal film 2520 (e.g., Au) is deposited on a substrate 2530 through the resulting mask, with the excess material removed via liftoff in acetone with ultrasonic agitation. Next, in (2), a highly absorbing film 2510 (e.g., Ge) is deposited onto at least part of the metal surface through the mask, and the excess material is removed. Depositing additional highly absorbing material in (3) and (4) in a selective fashion yields a structure 2500 (5) that reflects different colors at different locations on its surface. (In actuality, the thicknesses of the layers shown in FIGS. 22A and 25 are much smaller than the layers' lateral dimensions; the scales shown in these figures are exaggerated for ease of presentation)

Figure 26:
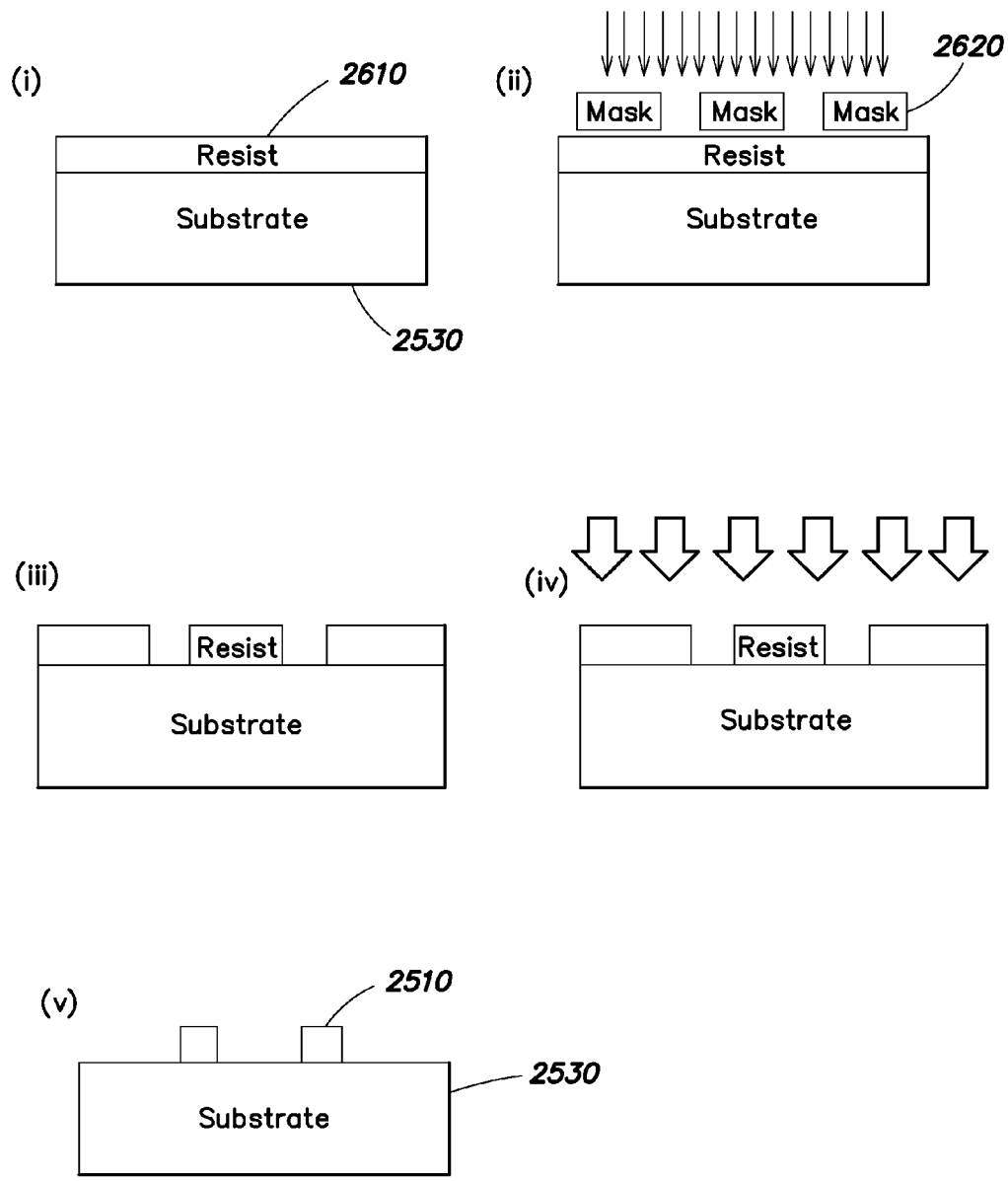
FIG. 26 illustrates subcomponents of the patterning steps shown in FIG. 23.
Figure 27:
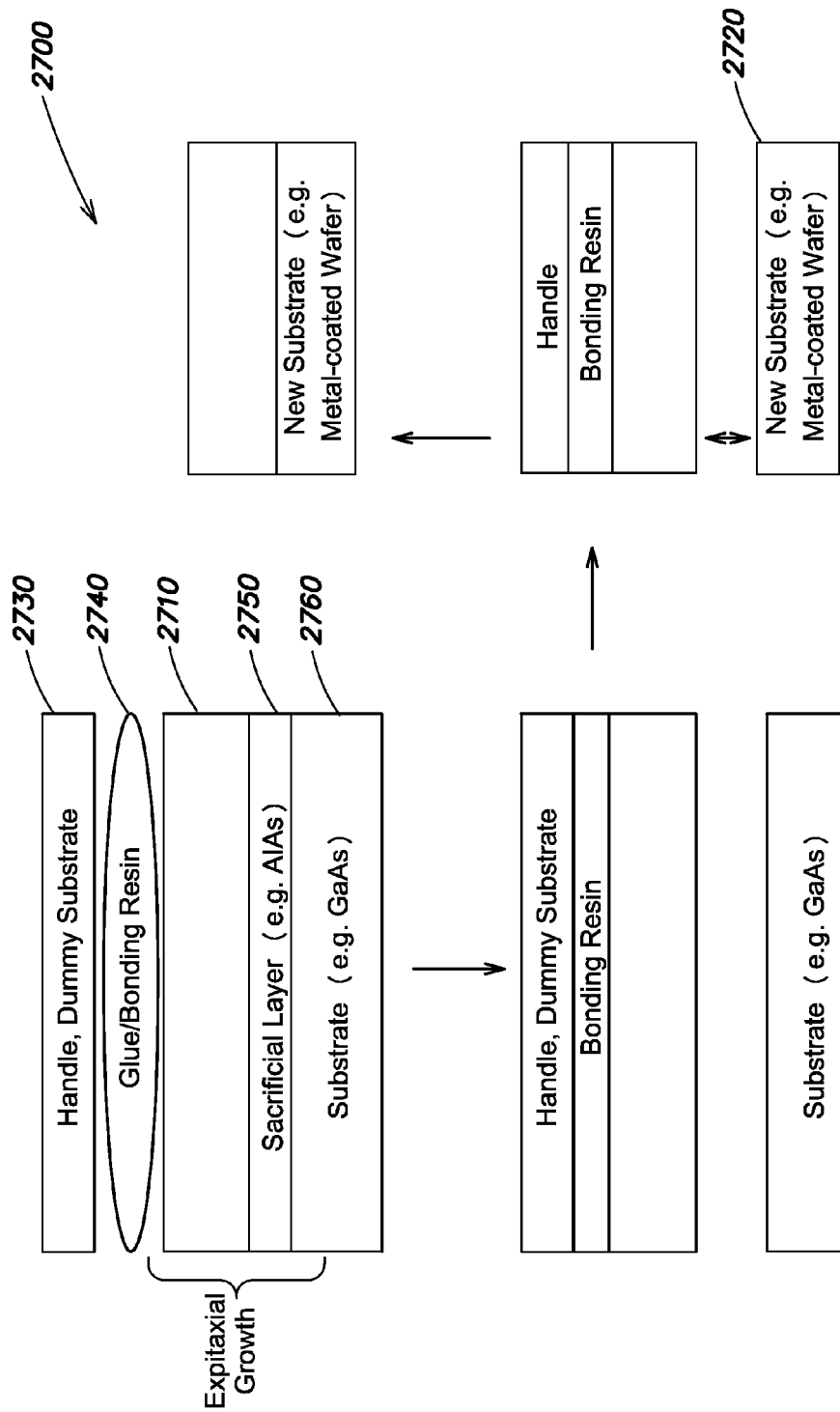
FIG. 27 illustrates an epitaxial lift-off process for making an article with an ultrathin, highly absorbing layer on a reflective layer according to embodiments of the present invention.
Figure 28:
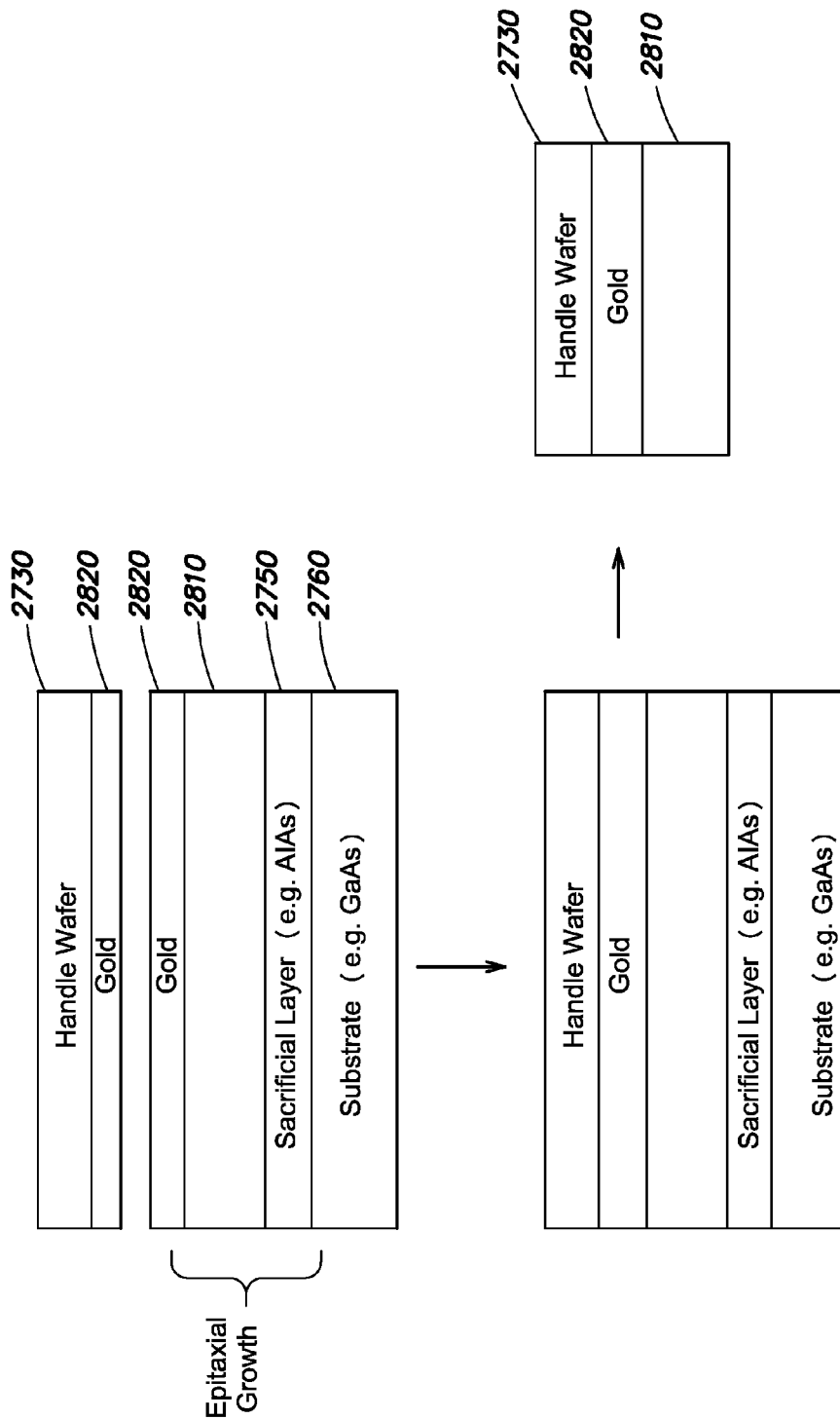
FIG. 28 illustrates a wafer bonding process for making an article with an ultrathin, highly absorbing layer on a reflective layer according to embodiments of the present invention.
Figure 30:
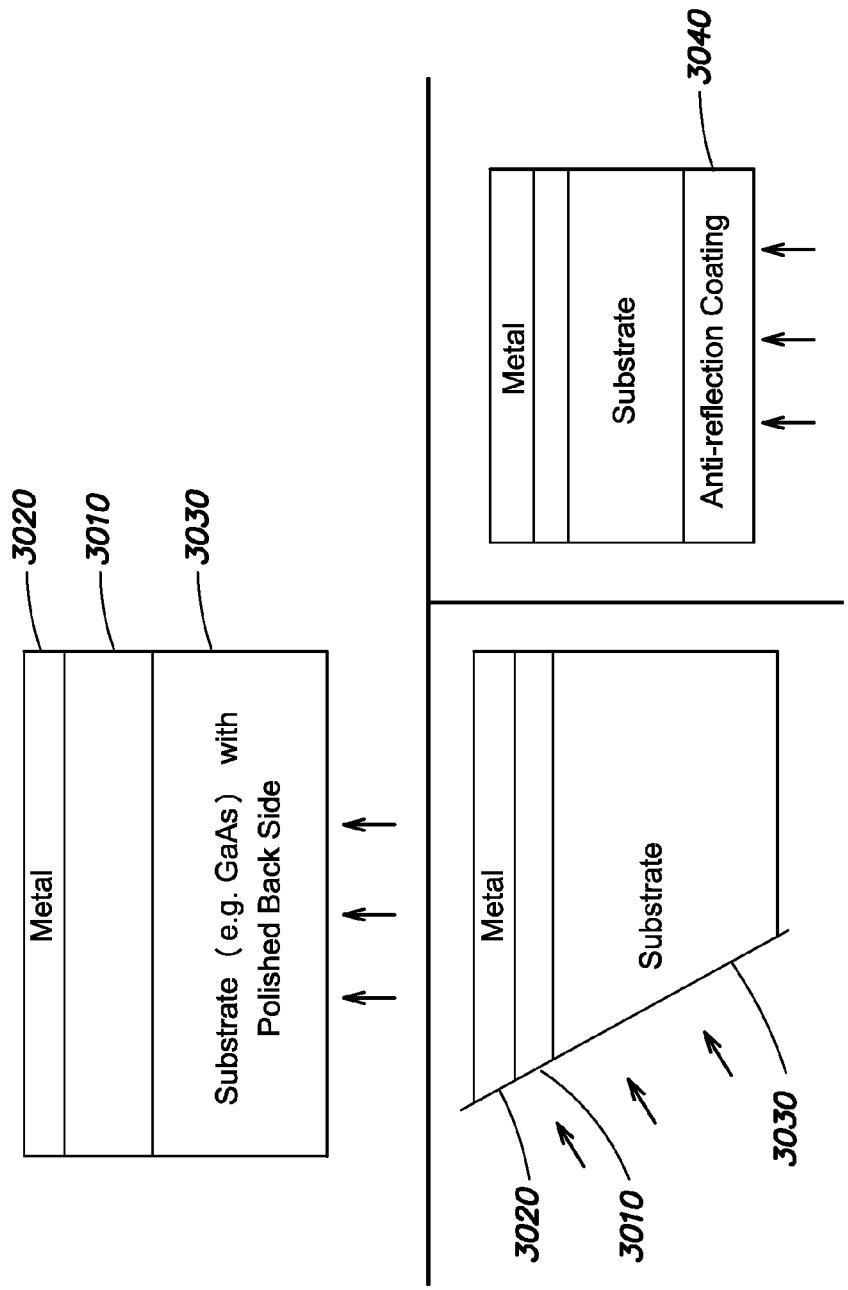
FIG. 30 illustrates a process for making an article with an ultrathin, highly absorbing layer on a reflective layer suitable for backside illumination according to embodiments of the present invention.

FIG. 26 illustrates the material deposition shown in (1)-(4) of FIG. 25 in more detail. In (i), the substrate 2530 is coated with resist 2610. Next, in (ii), the resist 2610 is exposed through a photomask 2620 in a mask aligner or stepper or with direct writing. The exposed resist is developed in (iii) to form a negative image of the desired pattern. (Negative resists would also work.) Material (e.g., Ge 2510 or Au 2520) is deposited through the resist onto the exposed portions of the substrate 2530 as shown in (iv). Once deposition is complete, the resist is removed in (v).

Those of skill in the art will readily appreciate that the articles illustrated in FIGS. 20-22 can be fabricated using a variety of suitable techniques. For example, an exemplary article can be created by depositing continuous layers of highly absorbing material and metal (e.g., by evaporation, CVD, MOVPE, epitaxial growth MBE, or MOCVD), then lithographically patterning and etching the layers (e.g., using reactive ion etching, wet etching, or focused ion beam milling) to selectively remove sections of material.

FIGS. 27-31 illustrate fabrication techniques suitable for making the articles and devices described above. The thin film(s) can be fabricated using any suitable technique, including but not limited to: electron-beam evaporation, thermal evaporation, atomic layer deposition, chemical vapor deposition (CVD, PECVD), epitaxial growth (MBE, MOCVD, . . . ), chemical bath deposition, and printing. Furthermore, several patterning techniques can be used, including but not limited to: photolithography, extreme ultraviolet lithography, interference lithography, electron beam lithography, soft lithography, "stamping" techniques (e.g., nanoimprint lithography, which may be particularly suitable for thin flexible films), etc.

One advantage of using very thin films is the possibility of epitaxially growing materials with a greater lattice mismatch with the substrate. This is because thin epitaxial films can accommodate more strain (without dislocations) than thick epitaxial films. FIGS. 27-30 show suitable epitaxial growth techniques using dummy substrates (also called "handles") 2730 bonded to thin absorbing films 2710, 2810, 3010 using resin 2740 or gold 2820. The thin absorbing films may themselves be grown on substrates 2760, 2960 via sacrificial layers 2750 or etch stop layers 2970, then removed from the substrate and placed on a metal-coated substrate 2720. Alternatively, metal 3020 can be deposited on a thin absorptive film 3010 which is coated on a substrate 3030. The substrate 3030 can be polished (e.g., at an angle) and/or coated with an anti-reflection coating 3040.

Figure 31:
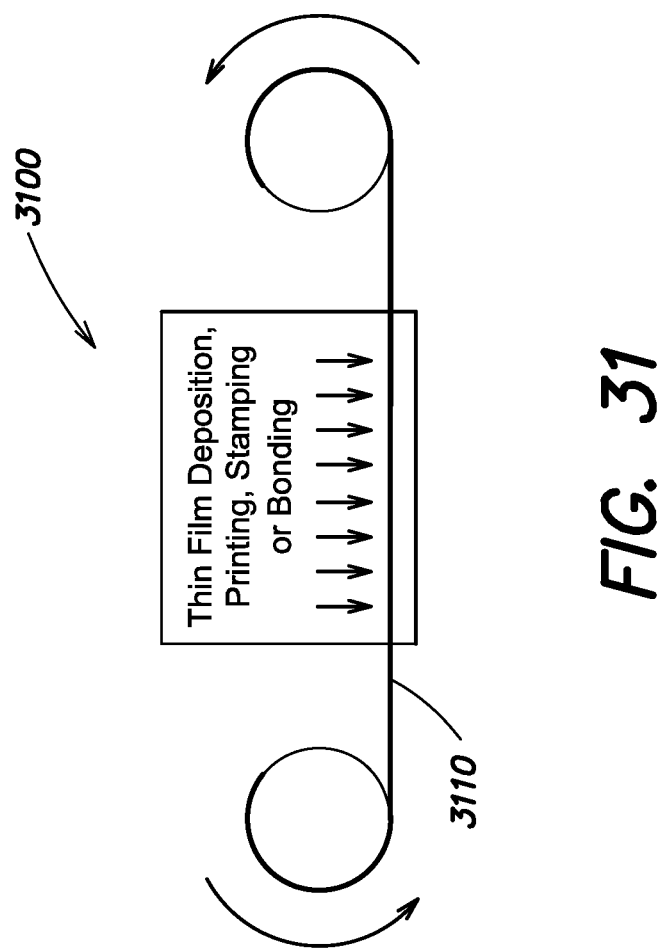
FIG. 31 illustrates roll-to-roll processing for making an article with an ultrathin, highly absorbing layer on a reflective layer according to embodiments of the present invention.

FIG. 31 shows how roll-to-roll processing 3100 can be used for coating large areas. In this process, the substrate may be a thin flexible sheet 3110, and both the metals and absorbing layers are deposited on it as described above. Ultra-thin absorptive films can also be deposited onto thin flexible sheets (e.g. nitrocellulose, polyamide or thin silicon sheets) to form deformable membranes. Such a deformable membrane can be stretched and glued or otherwise affixed onto a frame for use in an optical device. For instance, reflective optical device can be made by depositing a thin metal layer on a membrane. Diffractive optics can be made as well, for example by patterning a polymer membrane to achieve a binary thickness profile, or one with continuously varying thickness. The shape of the membrane can be tuned using a back electrode and applying a voltage between the membrane and this electrode. Using thin absorptive films on top of these components can lead to functionalities such as tunable filters, absorbers, and polarizers without compromising the advantages of membrane optics, namely small weight, flexibility, tunability, and the potential for large scale.

Spectrometers Based on Ultra-Thin Films

A spectrometer is a device that measures the frequency spectrum of optical radiation. Spectrometers are used to in a large number of applications, such as identification and detection of chemicals, and color measurement.

Compact spectrometers in the visible spectral range are often based on diffraction gratings. A collimated beam illuminates a grating, which diffracts the beam's spectral component in different directions. A lens (or curved mirror) then Fourier transforms the diffracted spectral components to convert this directional information into position information: different directions are focused in different positions where different detectors measure the intensity, thus recording the spectrum. Linear arrays of detectors (such as CCD arrays) are typically used. It is also possible to use a single detector to detect diffraction from a rotating grating, such that different spectral components (frequencies) are detected by the detector at different times.

The resolution is given by the number of elements in the array of detectors, assuming that the grating and size of the interferometer are chosen appropriately. The size of the spectrometer, the grating period and size, and the imaging lens may be chosen appropriately in order to have spatial discrimination between frequencies spaced by the resolution limit desired. The spatial resolution is the pixel pitch of the linear detector array. Ultimately, there is a trade-off for grating spectrometer between resolution and size. There is also a trade-off between resolution and sensitivity since high resolution typically translates to a small aperture at the input of the spectrometer. Furthermore, an increase of resolution may be equivalent to a decrease of the spectral bandwidth of the light that arrives on each detector element in the detector array(or on a single detector at a given time, in the case of a rotating grating spectrometer). In other words, assuming constant spectral power density, increasing resolution leads to a decrease in the signal strength measured by each detector element in the detector array.

Grating spectrometers are not widely used for infrared spectroscopy. One reason for this is that in a grating spectrometer, the different spectral components are separated in such a way that they are detected by separate detectors (or they are detected by a single detector at different times in the case of a rotating grating). As a result, often times only a small intensity reaches the detector(s) due to the trade-off between resolution and sensitivity. Conversely, in Fourier-transform infrared interferometers, which are widely used for infrared spectroscopy, all wavelengths contribute to the signal measured by the detector for every position of the scanning interferometer mirror. In some situations, this leads to increased signal to noise ratios and sensitivities.

Spectroscopy Using Ultra-Thin Films

Figure 45:
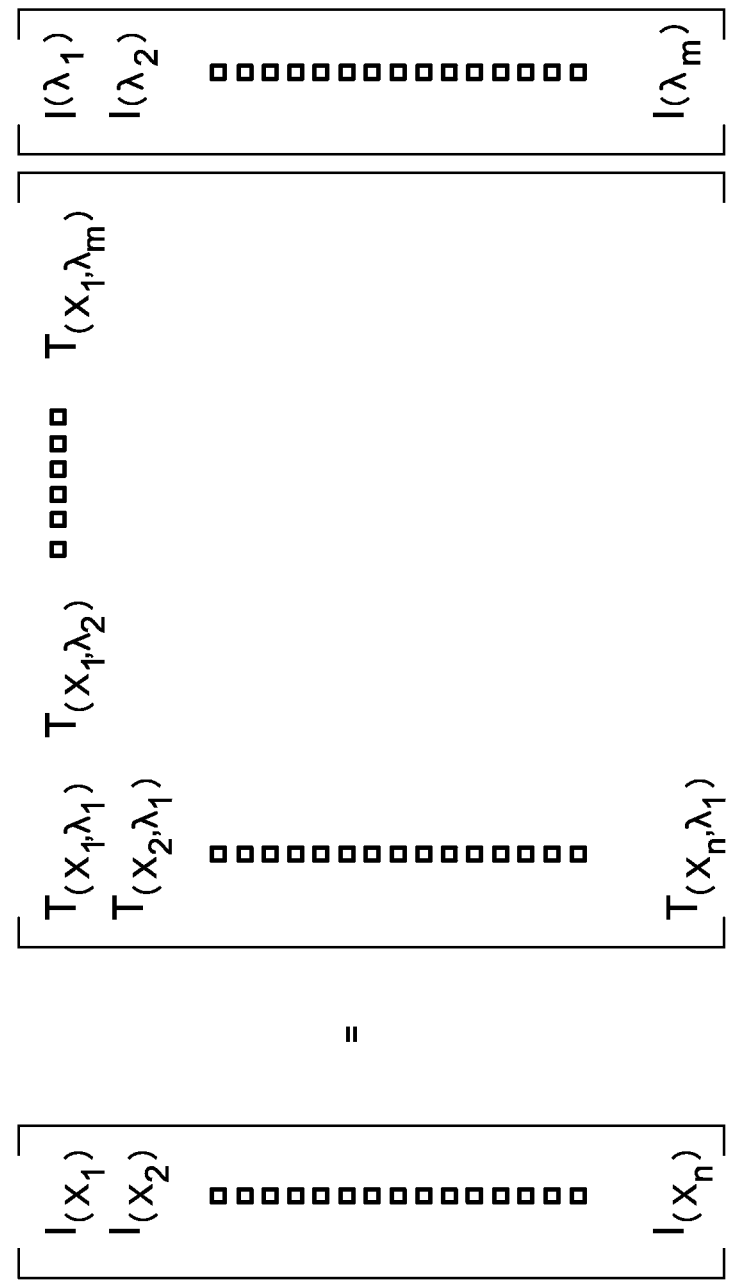
FIG. 45 illustrates a transfer matrix T of a substrate, coated with an ultrathin film of varying thickness, suitable for use as a spectral encoder in a spectrometer according to embodiments of the present invention.

Spectroscopy can also be performed using a substrate or object with a spatially varying spectral response in transmission, reflection, or absorption. This component can be called an "encoder" because it encodes the spectral intensity information $I(\lambda)$ into spatial intensity information $I(x)$. The encoder can be fully characterized by a matrix T such that: $I(x)=T.I(\lambda)$, where T is the transfer matrix of the encoder. Assuming that $I(\lambda)$ and $I(x)$ are column vectors, the lines of the matrix T are the transmission (or reflection or absorption) spectrum of the encoder at different positions: at a given position x1, I(x1) is the integral over the frequency domain of the transmission (or reflection) spectrum of the system at position x1. See FIG. 45 for a schematic illustration of an exemplary transfer matrix T.

Figure 46:
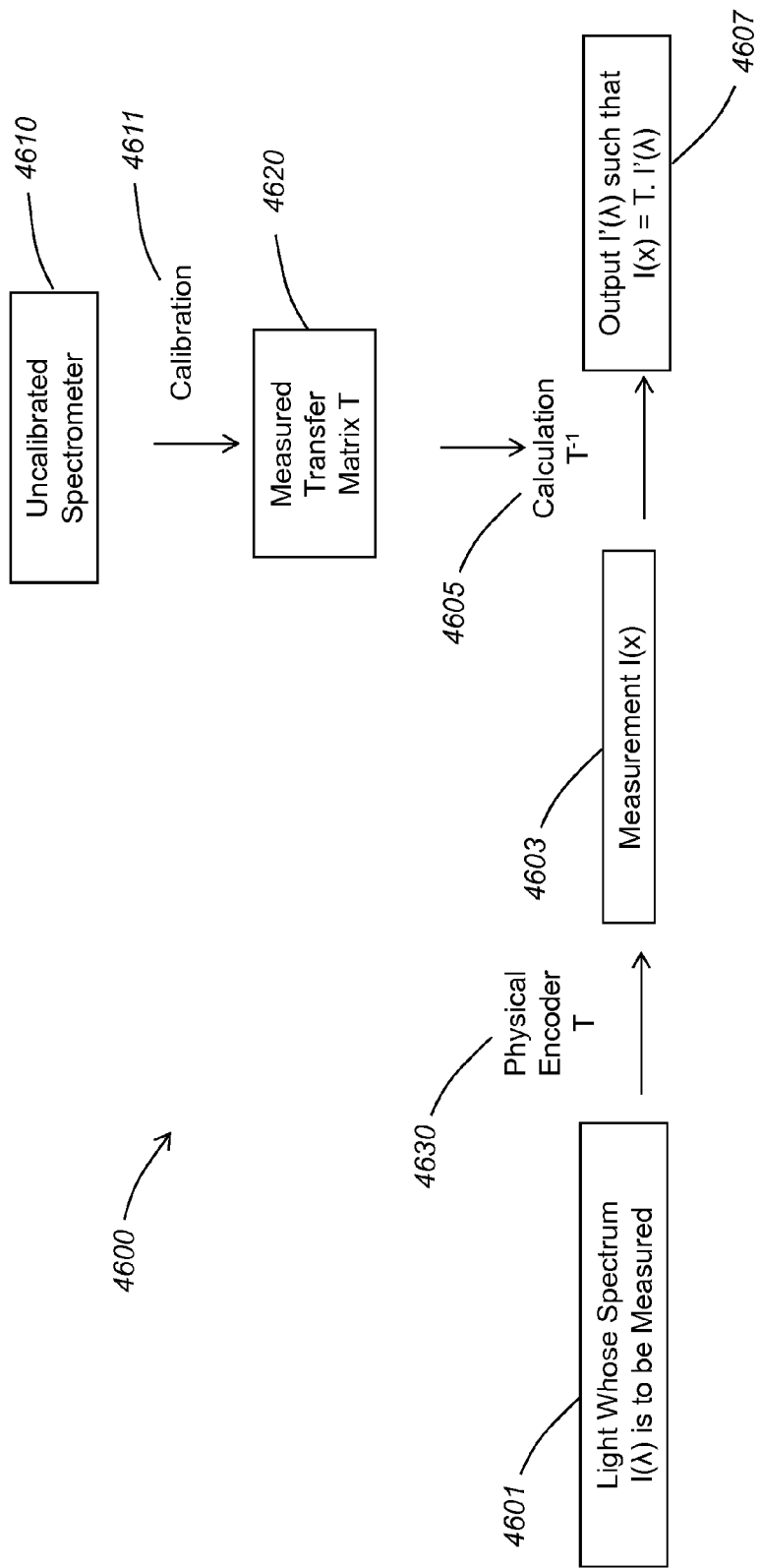
FIG. 46 illustrates a spectral measurement process using the transfer matrix T of FIG. 45 according to embodiments of the present invention.

FIG. 46 illustrates a spectroscopy measurement process 4600 with a spectrometer 4610 that comprises an encoder 4630 characterized by a transfer matrix T, properly characterized with a calibration step 4611 (i.e. the matrix T is measured and known), a light source (not shown) to illuminate the encoder with a reproducible illumination pattern (e.g., uniform illumination), and a detector or a detector array (not shown) to make a measurement of the intensity transmitted, reflected, or absorbed at the different points of the encoder. Once the matrix T is measured (i.e., the system is calibrated) and known, one can illuminate the encoder with a light source of unknown spectrum 4601 and make a measurement 4603 of I(x), which is the reflected, transmitted or absorbed intensity at different points on the encoder. One can then calculate (step 4605) an output 4607 representing the spectrum $I(\lambda)=T^{-1}.I(x)$, where $T^{-1}$ is the inverse transfer matrix and represents a "decoder." The matrix T should be selected to ensure that the error on the measurement I(x) does not propagate unfavorably during multiplication of the measurement I(x) by $T^{-1}$.

Figure 47:
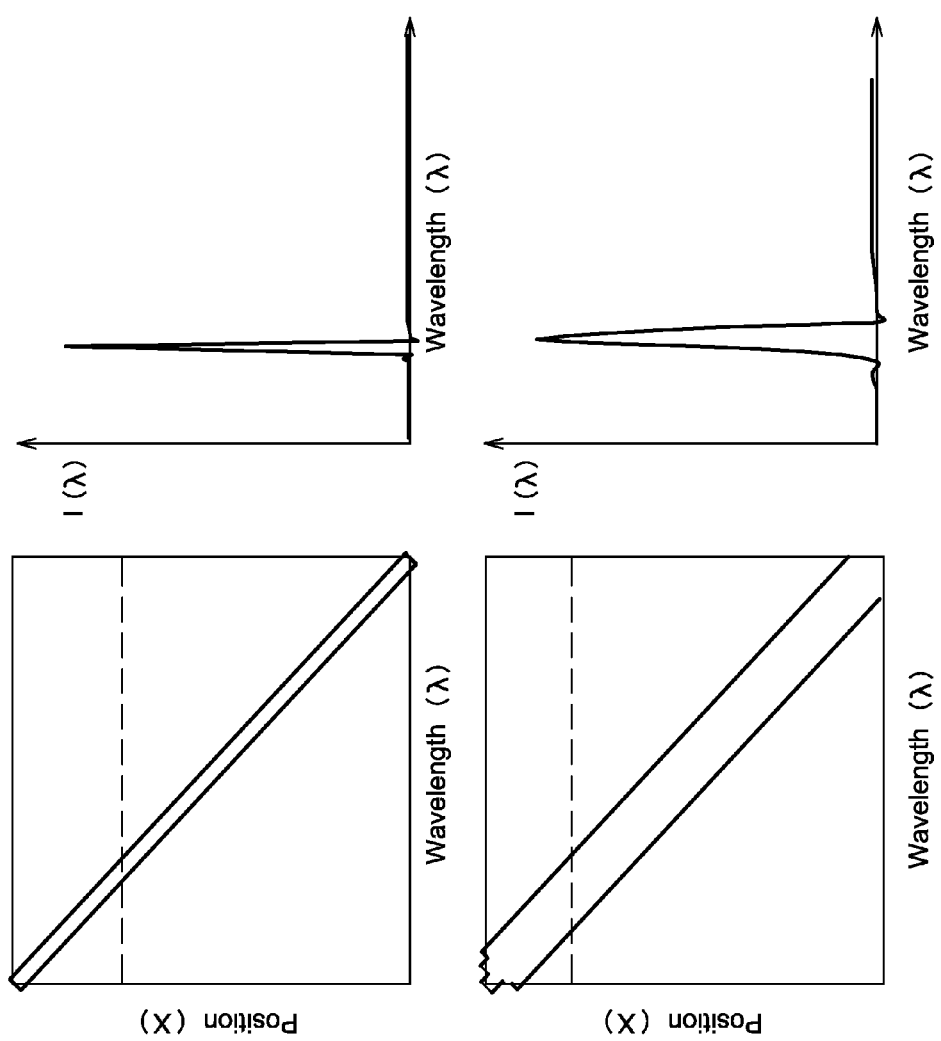
FIG. 47 illustrates a spectral measurement process using an invertible transfer matrix T.

To understand the process shown in FIG. 46, consider the problem of measuring spectra between $\lambda_1$ and $\lambda_2$ with a resolution of $\Delta\lambda$, one could use $N=(\lambda_2-\lambda_1)/\Delta\lambda$ narrow pass-band filters. Illuminating all the filters uniformly with the light whose spectrum is to be measured, and recording the transmitted intensity through each filter, yields N points of the spectrum I($\lambda$), at the central wavelengths of the different filters. In this case, the encoder is the set of transmission filters (positioned at different points in space) and the matrix T is quasi-diagonal: each line is the narrow transmission spectrum of a different filter. See FIG. 47 for an illustration of the matrix T in this case.

At first glance, it may appear that T must be invertible to calculate $I(\lambda)=T^{-1}.I(x)$ from the measurement of I(x) and the known calibrated matrix T. For this reason, conventional spectrometers employ encoders (e.g., gratings) characterized by quasi-diagonal matrices T that are easily invertible, through the use of filters that have a finite (but narrow) bandwidth. The problem of inferring I($\lambda$) from the measurement of I(x) is what is usually referred to as an inverse problem. One issue with inverse problems is that noise on the measurement I(x) is generally greatly amplified upon computation of $T^{-1}.I(x)$. This problem is limited if the matrix T has limited 'smoothing' properties. In the context of spectroscopy, this may mean that the fewer frequency components involved in the integral resulting in I(x), the better. For this reason, prior art focus on quasi-diagonal matrices, or more generally, on matrices whose rows have a limited number of non-zeros elements. Essentially, these matrices are sparse. The problem of noise propagation can also be addressed.

Using regularization algorithms, however, makes it possible to use encoders characterized by non-invertible matrices. Thus, the matrix T does not have to be quasi-diagonal, invertible, or square. The encoder may have arbitrary spectral features that vary with position in an arbitrary manner, as long as enough information is encoded by the encoder such that the spectrum can be back calculated, either directly by inversion of the transfer matrix T, or using regularization algorithms or other mathematical methods.

In some cases, these algorithms exploit prior knowledge of the solution. For example, regularization algorithms assume that the solution is smooth. Such knowledge is often available to the spectroscopist. For example, absorption spectra of liquids have often broad features that will be readily computed by regularization algorithms.

If the matrix T is diagonal, quasi-diagonal, or sparse, the encoder achieves spectral discrimination at each point of the encoder and the system may thus be equivalent to a grating spectrometer in the sense that a detector only detects one spectral component at a time. Such a system may have performance similar to that of a grating spectrometer in terms of signal to noise ratio and sensitivity. A trade-off between resolution and sensitivity exists for these systems.

If the reflection, transmission or absorption spectra of the different points of the encoder are more complex (e.g., if they have broad spectral features), then the intensity reflected or transmitted at each point of the encoder may be represented as the integral over the reflected or transmitted different spectral component. This may lead to larger signals and larger signal to noise ratios. In other words, at every point of the encoder, many or most wavelengths of the incident light contribute to the signal measured. This is a difference between the spectrometer described here and conventional spectrometers that use spatial or angular encoding of the spectrum. Noise propagation upon inversion may be an issue (common to the general field of 'inverse problems'). One way to deal with this noise propagation is to overdetermine the system of equations, e.g., by using a more complex encoder and by measuring more points on the more complex encoder.

Implementation—Examples of Encoders

In one sense, the encoder is or comprises an object or an interface having a reflection, transmission or absorption spectrum that varies at different points. Spectral features can be obtained using for example stacks of dielectric and/or metallic coatings, patterned interfaces, metallic or dielectric particles of varying sizes, dispersive optical fibers and waveguides, suspensions of dielectric or metallic particles in liquids, and combinations thereof.

Figure 48:
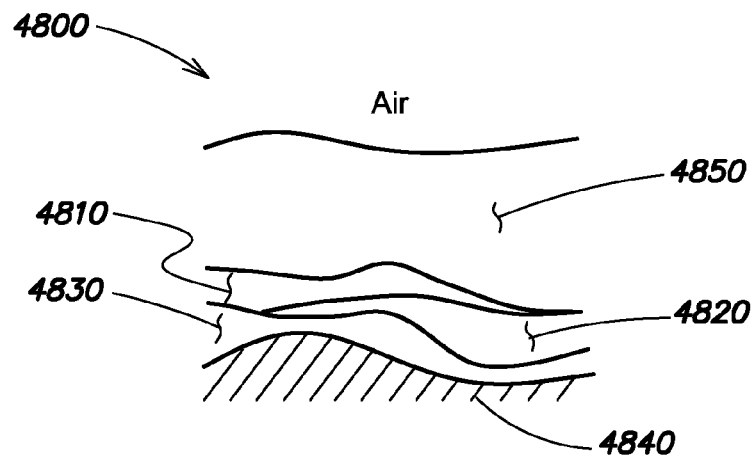
FIGS. 48 and 49 show articles coated with one or more ultrathin films suitable for use as spectral encoders according to embodiments of the present invention.

FIG. 48 shows an encoder 4800 that includes a stack of thin (dielectric or metallic) films 4810, 4820, and 4830 on a substrate 4840 and coated with an optional protective layer 4850. The films' total thickness is smaller than or on the order of the wavelength of light (in the spectral region of interest) in the material. Each thin film 4810, 4820, and 4830 composing the stack has a thickness that varies with position, as illustrated in FIG. 48.

Figure 49:
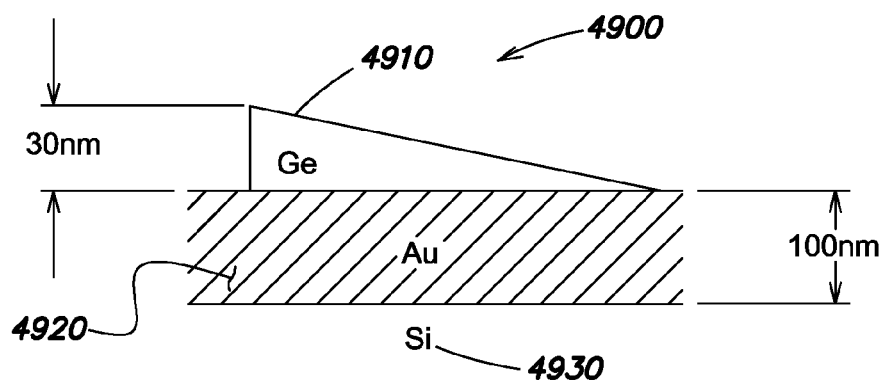

A simple example of a thin film encoder 4900 in the visible range, shown in FIG. 49, is constituted by a single thin layer 4910 of germanium with a thickness gradient from 0 to 30 nm on a layer 4920 of gold (gold thickness ~100 nm), which in turn is on a silicon substrate 4930. The reflection matrix T (i.e., reflection versus thickness and wavelength) is shown in FIG. 50B. This system exhibits spectral features related to an absorption resonance in the thin, lossy film of germanium. These features are general to ultra-thin (e.g., subwavelength) lossy dielectric films on metals with finite conductivity. The broad absorption resonance, which is observed as a dip in reflection varies sharply with small variations of the germanium film thickness. As a result, the reflection spectrum of such a sample varies with position (e.g., for different germanium film thickness in the case of a sample with a thickness gradient) and thus constitutes an encoder for a spectrometer, as described here.

The matrix T is not quasi-diagonal since the spectral features at each position are very broad. Furthermore, the matrix T is rank deficient, i.e., its rows and/or columns are not all linearly independent from each other. As a result, the matrix is not invertible. This means that if one measures I(x), there are many possible spectra I($\lambda$) such that I(x)=T. I($\lambda$). In other words, some information may be lost during the encoding process. However, one can use regularization algorithms (such as singular value decomposition) to sort through all the possible solutions and find for example the "smoothest" one. Additionally, a limited amount of filters can be used to dramatically increase the rank of T (and thus the amount of information encoded by T) as described below.

Figure 51:
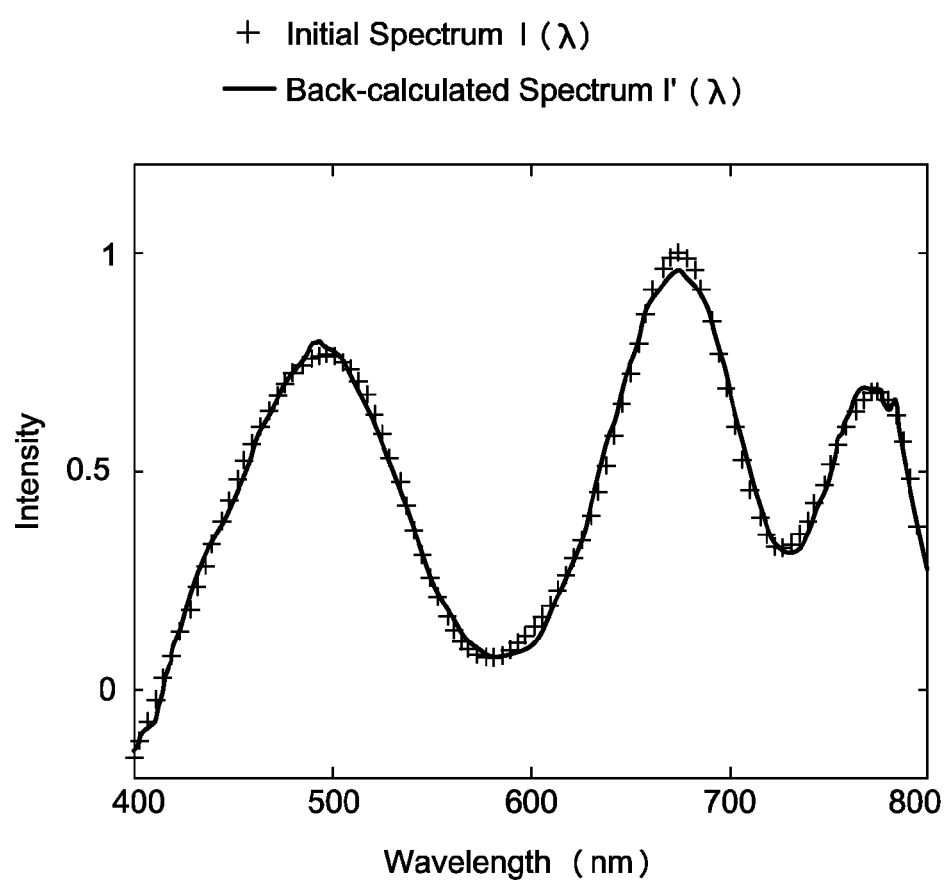
FIG. 51 is a plot of an initial spectrum (crosses) and a back-calculated spectrum (line) according to embodiments of the present invention.

FIGS. 50A, 50C, and 51 illustrate results calculations performed using the matrix T shown in FIG. 50B. For these calculations, a smooth test spectrum I($\lambda$) is randomly generated (shown in FIG. 50A). Calculating I(x)=T. I($\lambda$) yields the measured signal plot in FIG. 50C. Using a regularization algorithm (truncated singular value decomposition) on the measured signal yields a smooth solution I'($\lambda$) (plotted in FIG. 51) to the inverse problem (i.e. such that I(x)=T. I'($\lambda$)). The performance of the hypothetical spectrometer can be evaluating by comparing I($\lambda$) and I'($\lambda$).

This shows that in the absence of any noise, the matrix T, or a similar matrix, could be used to encode a spectrum.

However, as soon as noise is introduced into the measurement $I(x)$, it may be challenging to determine the spectrum $I(\lambda)$ without making assumptions about the shape of the spectrum. If such knowledge is not available, a larger matrix T may be used to describe a more complex spatial pattern of the thin-film structure. (If desired, the encoder may be made more complex by stacking more thin films and/or varying the thickness(es) of the film(s).) In other words, the transfer matrix T may be expanded to include more rows, e.g., by over-determining the system's spectral characteristics.

Figure 52A:
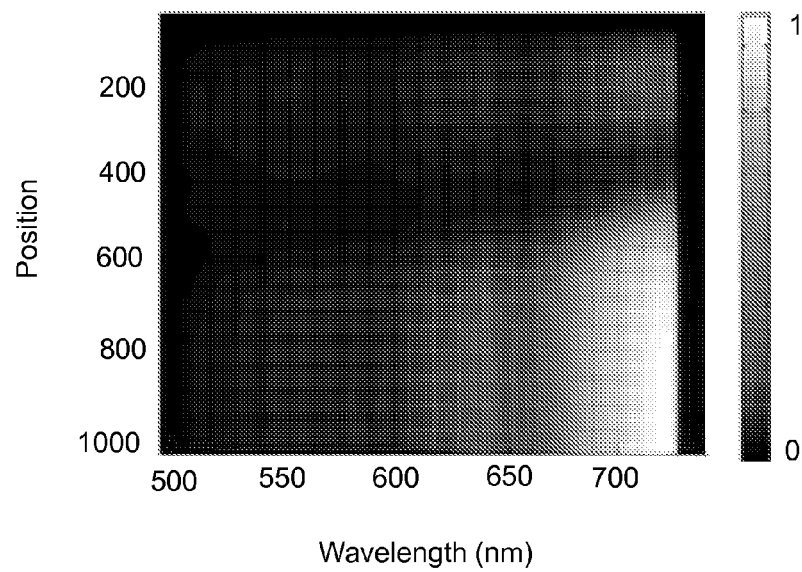
FIGS. 52A and 52B are plots of, respectively, a transfer matrix and an initial spectrum (crosses) and a back-calculated spectrum (line) according to embodiments of the present invention.

Unlike conventional spectrometers, which use arrays of narrow band filters, the inventive spectrometers use arbitrary spectral features (here, very broad spectral features for examples) to encode spectral information. Additionally, reproducible experimental defects can actually increase the amount of information encoded by the spectrometer. For example, consider experimentally measuring the matrix T corresponding to the reflection spectra at different positions of a thin film of germanium deposited on gold with a graded thickness (from ~0 nm to ~30 nm) as described below. The matrix is shown in FIG. 52A.

Figure 52B:
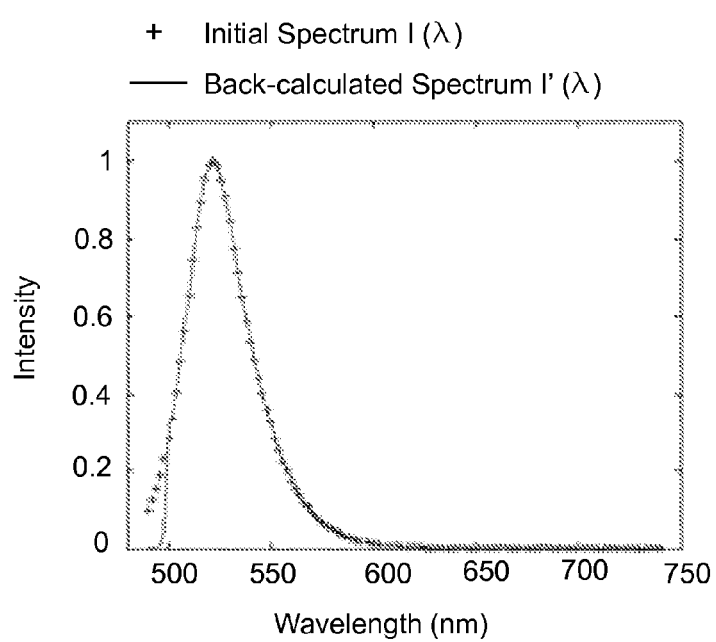

FIG. 52B shows results of a calculation of $I(x)=T. I(\lambda)$, where $I(\lambda)$ the experimentally measured emission spectrum of a green LED (measured with a commercial visible spectrometer). This measured emission spectrum is used to find a smooth solution $I'(\lambda)$ to the inverse problem (i.e. such that $I(x)=T. I'(\lambda)$) using a regularization algorithm (truncated singular value decomposition)). As can be seen on FIG. 52B, the back calculated spectrum $I'(\lambda)$ agrees almost perfectly with the original spectrum $I(\lambda)$. Interestingly, almost all the singular values of the singular value decomposition are used to calculate $I'(\lambda)$, indicating that the matrix T encodes most of the information, showing improved performance compared to the calculated matrix T of FIG. 50B.

In the above example, the gradient of thickness is loosely defined to be a thickness (and thus a reflection spectrum) that varies with position. This variation can take a complex arbitrary shape, and does not necessarily need to be controlled precisely during fabrication. Once the full system is assembled, calibration (measurement of the matrix T) may yield the information for measuring spectra. This calibration measures the spectral responses of the encoder, the detector(s), and the other optical elements that may be integrated into the full spectrometer system, such as lenses, windows, diffusers, thin film coatings, etc. The thickness range chosen here (from 0 to 30 nm) corresponds to the strongest spectral features for this particular system (germanium on gold) across a particular spectral region of interest (400 nm to 800 nm). The range of thicknesses has to be adjusted for each material system chosen and spectral region of interest.

The example above focuses on the measurement of spectra over the 400 nm to 800 nm wavelength range. However, inventive spectrometers may operate at any frequency range, with the proper choice of materials and thicknesses. In the long wavelength range (infrared or terahertz range for example), one may use thin films, or dielectric or metallic particles, optical antennas, or corrugated surfaces and metasurfaces in order to create the spectral features for encoding the spectrum. In general, anything resulting in a spatially varying frequency response can be used.

Exemplary spectrometers may include other elements used on, beneath, or around the encoder, for other purposes than encoding. For examples, a window or varnish can be deposited on the encoder to act as a protective layer, e.g., as shown in FIG. 48. In general, different elements can be present along the optical path as part of the packaging. Even though the principal function of these elements is not to encode the incident spectrum, they may have some spectral features (in transmission, reflection or absorption). Proper calibration of the full system (including these elements) may incorporate these spectral features into the full system's transfer matrix T. For instance, in the germanium thin-film encoder described above, the reflection features are used. If the substrate is transparent, e.g. glass in the visible spectrum, and the gold film is thin (e.g., ~15 nm), the transmission through the sample could be used to encode the information instead.

Using extremely thin films leads to low angle dependence of the transmission and reflection spectra. Other types of encoder should preserve this quality: even though in principle the concept does not require the encoder to have angle independent properties (i.e. matrix T independent of the angle of incidence of the light to be measured), angle independence improves knowledge of the matrix T (through proper calibration). If the system has strong angle dependence, the light to be measured may be collimated and transmitted through one or more apertures to select a single angle of incidence on the encoder in a reproducible fashion.

The trade-off between size and resolution which guides the design of grating spectrometers is not necessarily present in the inventive spectrometers. The reflectivity spectrum of the different points of the encoder can be varied over very small length scales. In the example above of a germanium thin film on gold, the information is encoded by a thickness range of 30 nm, which can be achieved over a very small scale, e.g., on the order of 100 nm or more. The resolution limit $\Delta\lambda$ is given to first approximation by the spectral range covered divided by the rank of the matrix T. It may ultimately be limited by the spatial resolution of the imaging system measuring $I(x)$. An inventive spectrometer can thus be made much more compact than a conventional grating spectrometer.

Fabrication Techniques for Encoders Coated with Graded Thin Films

Figure 53:
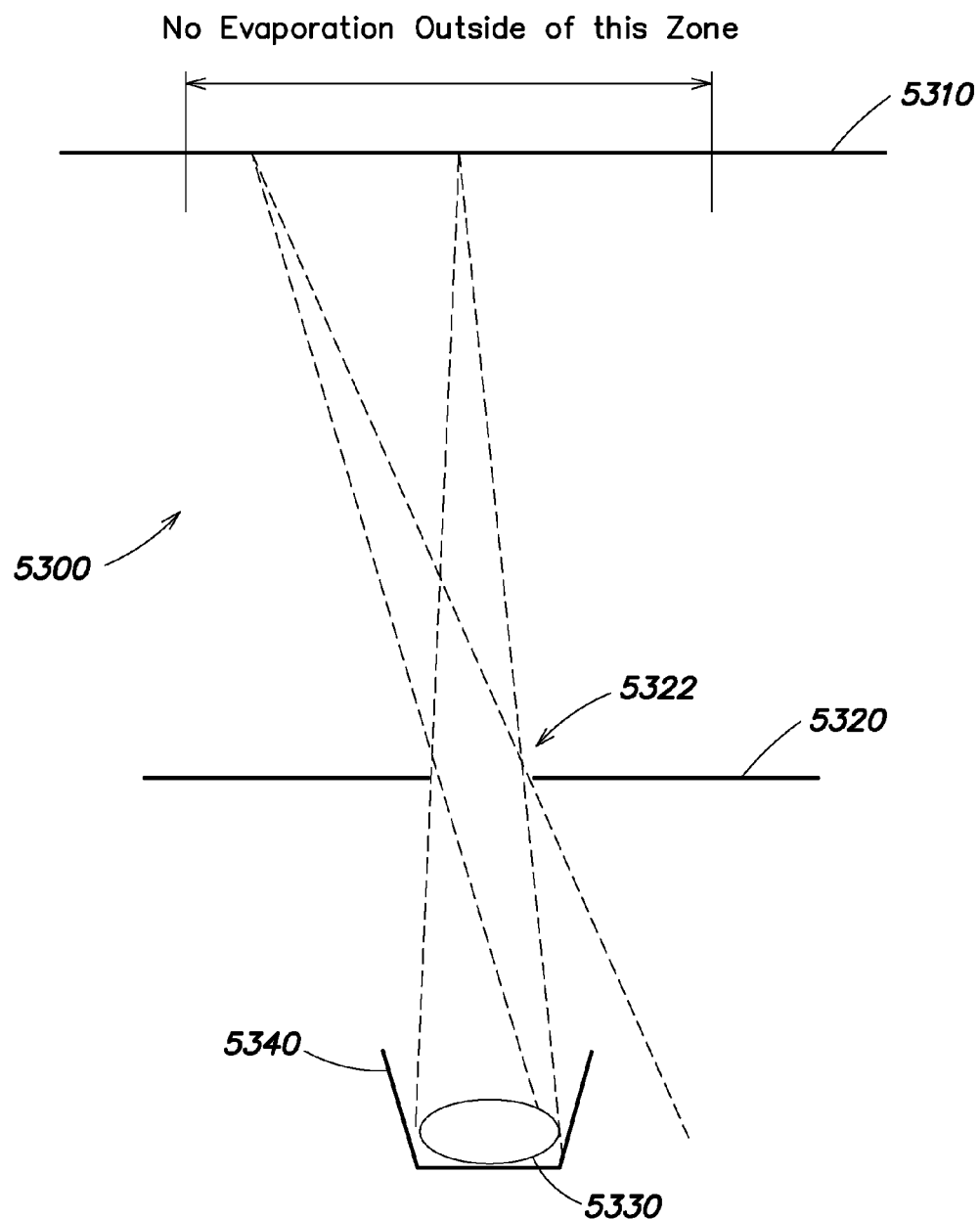
FIG. 53 illustrates an apparatus and method of making a spectral encoder according to embodiments of the present invention.

FIG. 53 shows a fabrication setup 5300 for a thin film with non-uniform thickness, using an electron beam evaporation, a thermal evaporation, or any other deposition technique in which the path of the deposited material follows to first approximation a straight path between the source and the sample. For this technique, a material source (e.g., melted material 5330 in a crucible 5340 or on an evaporation boat) is wider than a point source. A screen 5320 with an aperture 5322 is inserted between the source and a sample 5310 as shown in FIG. 53. The screen creates a shadow: it blocks the path between certain points of the source and certain points of the sample. The different points of the sample do not see the same area of the source, resulting in varying deposition rates. At the extreme edges, in the complete shadow of the screen, no material is deposited.

Measurement Configurations

Imaging Reflection Mode

Figure 54:
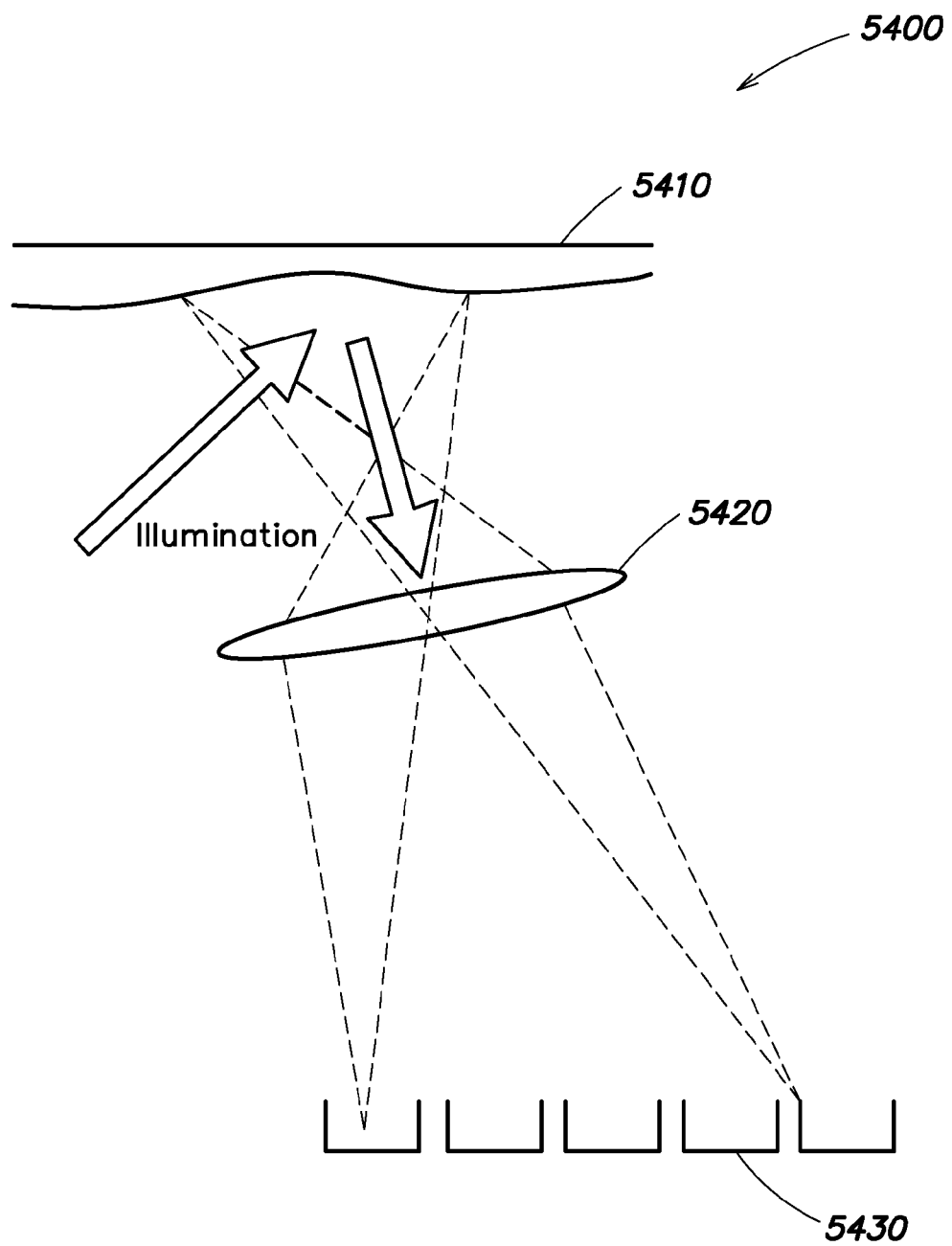
FIGS. 54 and 55 illustrate imaging spectrometers according to embodiments of the present invention.

In the configuration shown in FIG. 54, the light whose spectrum is to be measured illuminates an encoder 5410 and an optical system 5420 images the encoder 5410 onto a detector array 5430. The different pixels of the detector array 5430 measure the reflected intensity at different points of the encoder 5410.

Figure 55:
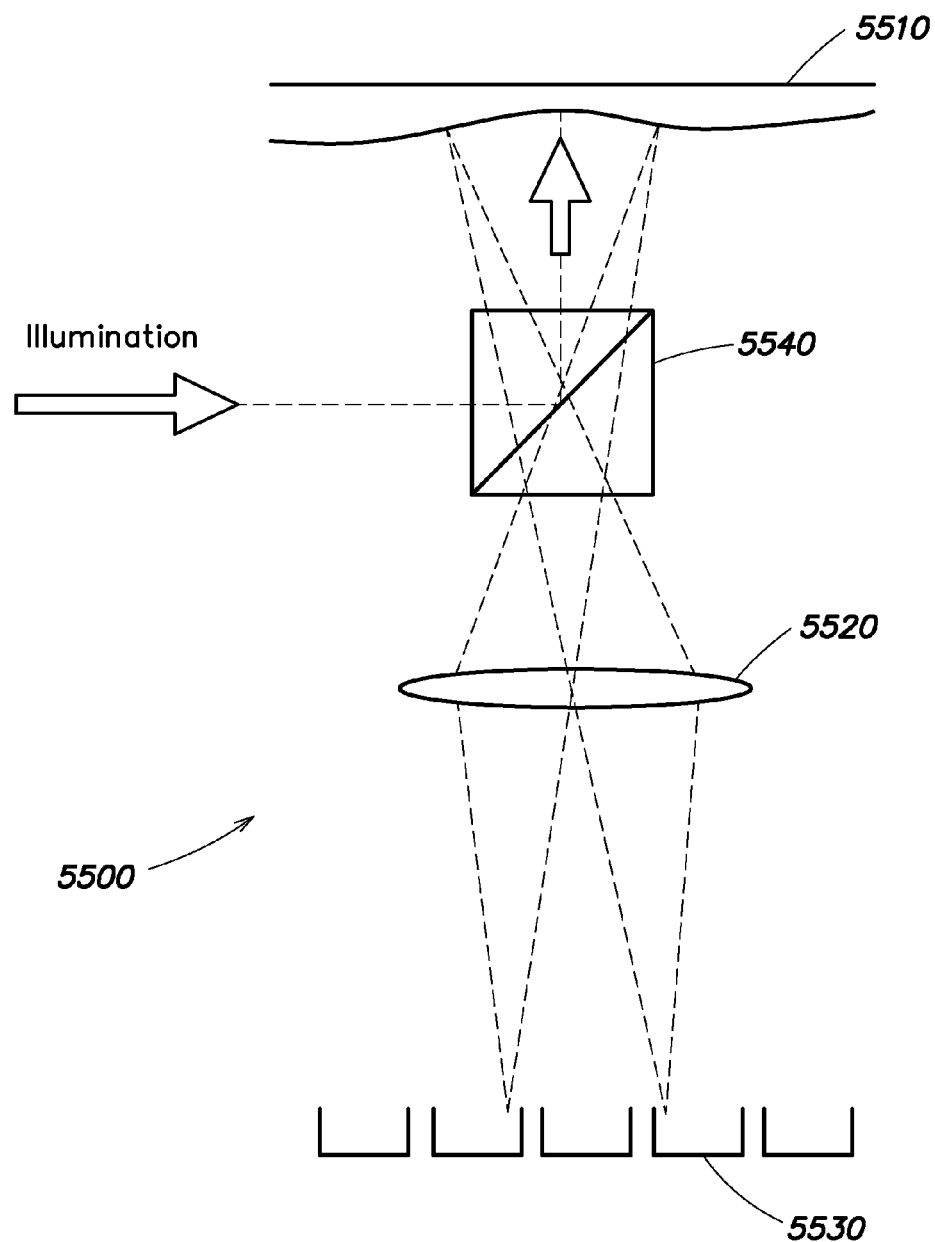

FIG. 55 shows a spectrometer 5500 with a beam splitter 5540 that allows the illumination and imaging beam to propagate along an axis normal to the encoder plane. Alternatively, the illumination and imaging axes can be at an angle with respect to the normal to the encoder 5510. The reflection measured in not necessarily specular reflection onto the encoder, but can be at a different angle with respect to the normal to the encoder. The optical system 5520 can include one or more lenses that image the encoder's surface onto a detector array 5530. The imaging system can be designed to have a magnification other than one (1). This can be used to increase the spatial resolution of the imaging system if the encoder's reflection spectrum varies on a small spatial scale.

The information measured is I(x), i.e., an image of the encoder as illuminated by the illumination source. If the illumination beam is not reproducible, I(x) will be corrupted. In other words, the detector array measures I(x)=$T_{illum}$·T·I(λ), where $T_{illum}$ contains the information about the illumination source (beam). If $T_{illum}$, is reproducible from experiment to experiment or from measurement to measurement, then one can calibrate the system and obtain an overall transfer matrix T'=$T_{illum}$·T that contains information about the encoder for use in measuring unknown spectra. However, if $T_{illum}$ varies from measurement to measurement (and is thus unknown), it may be difficult to accurately estimate I(λ) from a measurement of I(x) given this imperfect knowledge of the effective encoder.

Using a robust illumination scheme (and no stray light) reduces undesired variations in the illumination that might otherwise impede or impair operation of the spectrometer. In the imaging configuration presented here, robust illumination can be achieved using a small aperture 5620 at the entrance of the spectrometer to create a reproducible point source for the illumination system (see FIG. 56A). A small aperture can also be formed by the cleaved facet of an optical fiber 5650 as shown in FIG. 56B. Additionally, a moving diffuser (for example, a diffusing film on a rotating wheel) can be used to remove speckles in case of incident laser light. The illumination does not need to be uniform across the encoder. It should be non-zero at non-redundant points, and reproducible from experiment to experiment.

Imaging Transmission Mode

Figure 57A:
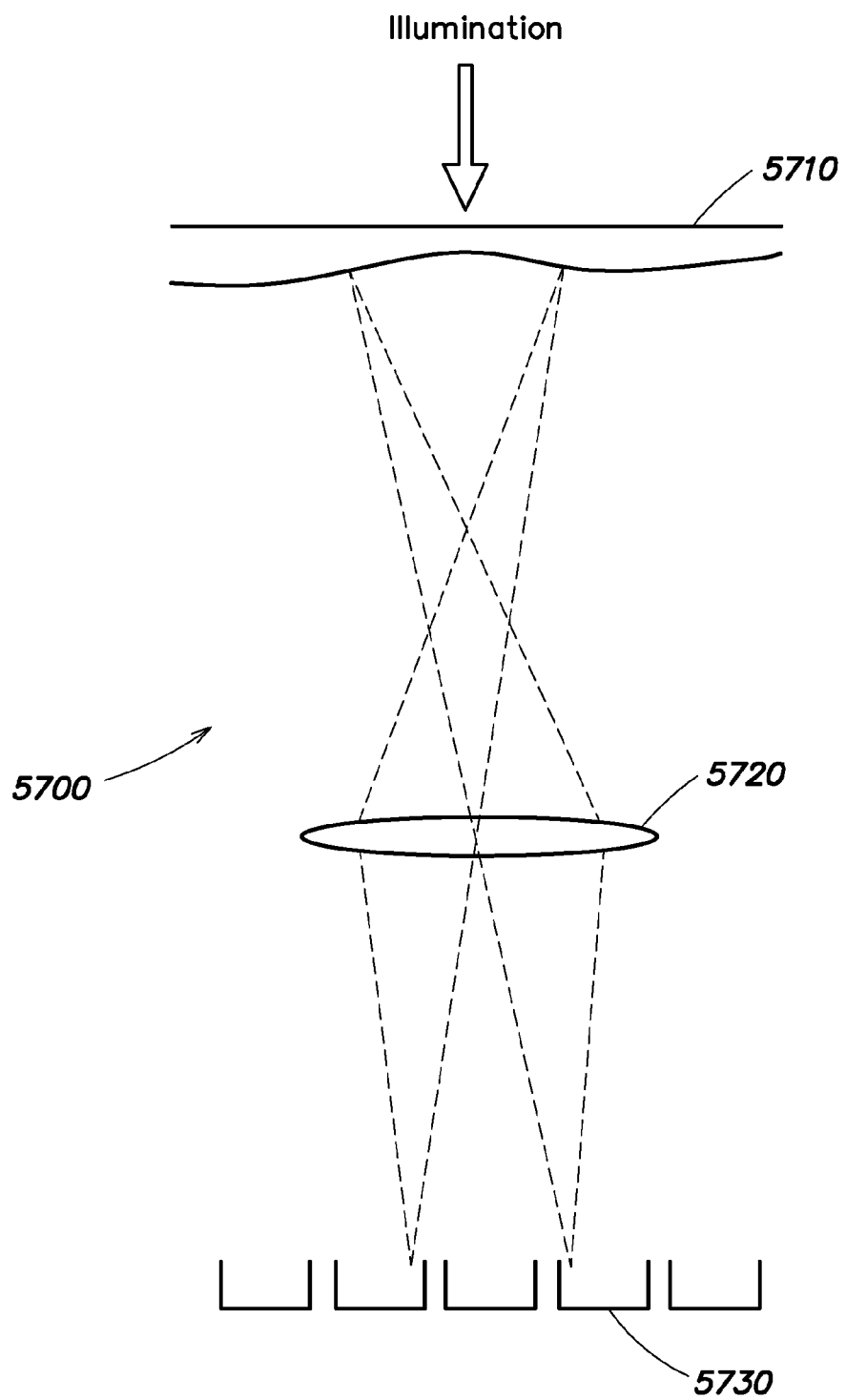
FIGS. 57A and 57B illustrate spectrometers with point-source illumination according to embodiments of the present invention.

FIG. 57A shows a spectrometer 5700 with a partially transparent encoder 5710. Light propagates through the encoder 5710 to an imaging system 5720 that images the encoder 5710 onto a detector array 5730. Like the other encoders, the spatial variations of the encoder's transmission spectrum make it possible to measure the spectrum of the incident beam by illuminating one side of the encoder and imaging the encoder from the other side, e.g., as described with respect to the encoder shown in FIG. 49.

Scanning Reflection Mode

As discussed above, an aperture can be used to provide reproducible illumination. However, this can come at the expense of power coupled into the spectrometer.

Figure 57B:
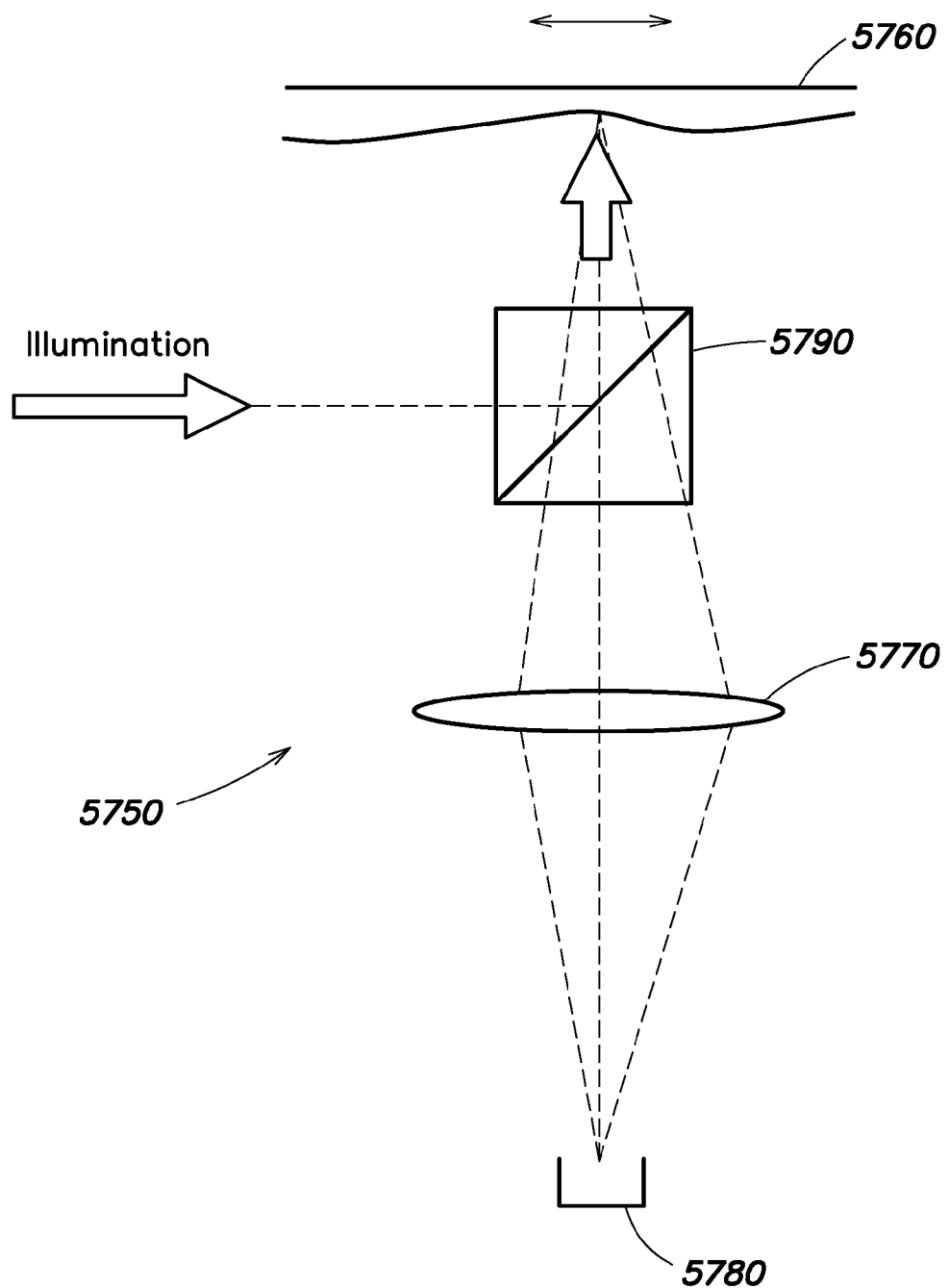

FIG. 57B shows a spectrometer 5750 that forms the image of a single point of a scanning encoder 5760 onto a single pixel detector 5780 via a fixed imaging system 5770 and a beam splitter 5790. Translating the encoder 5760 causes the imaging system 5770 to image different points of the encoder 5760 onto the detector 5780 at different times. In other words, the points of the encoder scan through the single focus of the imaging system. The measurement I(x) becomes I(t), where t is time, i.e. we measure the intensity on the single pixel detector as a function of time. A schematic of this configuration is presented in FIG. 57B.

In this configuration, the encoder is illuminated at the imaged point or in a small area containing this point. If the illumination is not uniform across this area, or features intensity patterns not reproducible from experiment to experiment, it impacts the overall intensity of the light measured. In mathematical terms, $T_{illum}$ is reduced to k·Id, where k is a constant depending on the experiment and Id is the identity matrix. In other words, this is equivalent to measuring kI(λ), where k is unknown but is simply a scaling factor. Not knowing this scaling factor k is not important, since it does not change the shape of the spectrum.

It is implied here that different illumination conditions do not change the measured reflection spectrum. In other words, T is not modified beyond a scalar scaling factor. In particular, this implies that if a sample with a spatially uniform reflectivity spectrum is scanned through the focus of the imaging system, there is no measured intensity variation. This may not be true if, for example, the sample does not have a constant orientation with respect to the illumination or imaging optical axis, or if the sample comes in and out of precise focus of the imaging system. Again, if such imperfections are reproducible, they can be taken into account in a properly calibrated matrix T. But if they are variable from experiment to experiment, they could corrupt the data.

With a robust architecture, one can assume that imperfections in the imaging system are reproducible. However, there may be problematic imperfections in the illumination system. These imperfections may be related to variations in the angle of incidence of the illumination beam, in the case where the encoder presents different tilt angles with respect to the optical axis of the imaging or illumination system, as it is scanned through the focus. Here again, one possible solution is to use a small aperture at the input of the spectrometer to create a robust and reproducible point source for the light to be measured, and thus have a constant alignment for the illumination system. This aperture could be formed, for example, by an iris (in the case of free space optical coupling into the spectrometer) or by the core of a cleaved optical fiber (in the case of a fiber coupled spectrometer). Alternatively, one could use a rough surface for the encoder, and collect light scattered by the encoder instead of specular reflection from a plane smooth encoder. Roughness averages out orientation imperfections of the illuminating beam.

There are many possible ways of scanning the different points of the encoder through the single focus of the imaging system. For example, one can use a linear translation stage to scan the encoder back and force in front of the imaging system. One can also attach an encoder 5810 to a rotation stage or a rotating wheel as in the spectrometer 5800 shown in FIG. 58A. The encoder itself can be rotated under an optical system 5820, such that the different points of the encoder scan through the focus and onto a single-element detector 5830, leading to a measured intensity I(t) periodic in time, with period equal to the rotation period of the rotating stage as shown in FIG. 58B.

In reflection mode, the illumination may use part of the optical system used to image a single point of the encoder. As described above, a beam splitter can be introduced in order to direct a collimated illumination beam onto a set of lenses creating a focused spot on the encoder. The same lenses can be used to form the image of the point of the encoder under the focus onto a single pixel detector. Alternatively, the optical systems used for illumination and imaging may be separate.

Figure 58A:
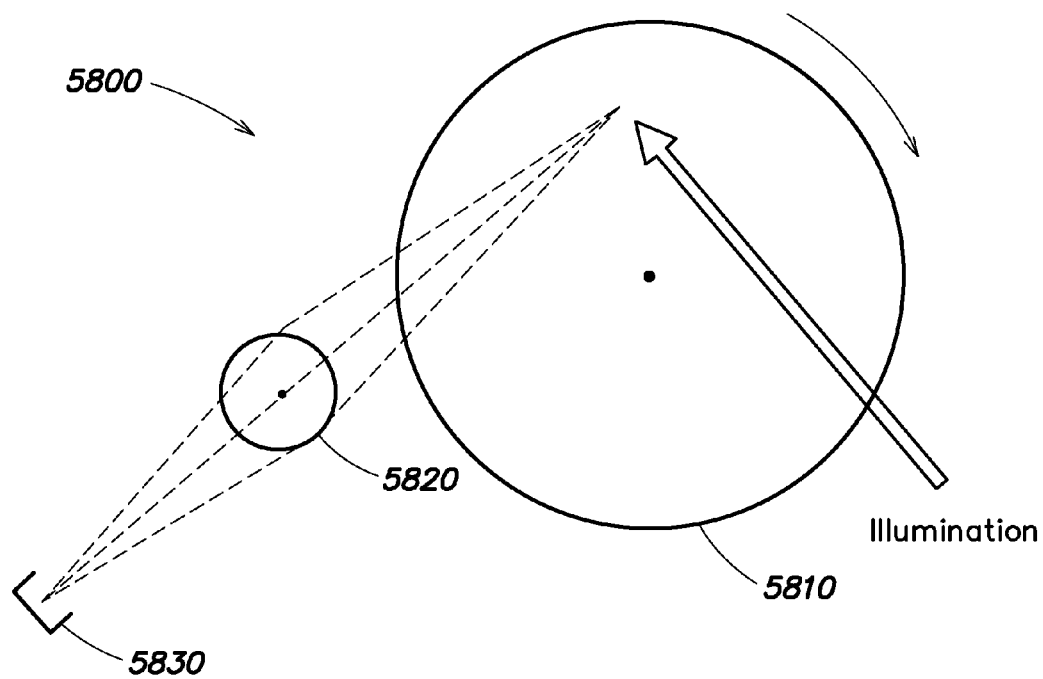
FIGS. 58A and 58B illustrate a spectrometer with a rotating spectral encoder according to embodiments of the present invention.
Figure 58B:
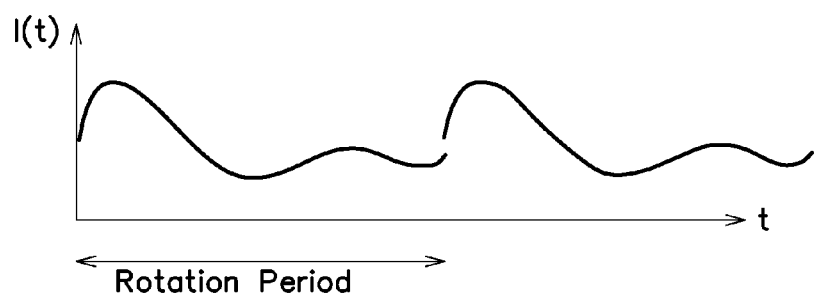

Since the spectrometer shown in FIG. 58A measures intensity as a function of time, the detector's speed (time response) should be chosen appropriately. In the case of a rotating encoder, a stable rotation may occur at a certain rotation speed, which in turn dictates the speed at which the information I(t) is recorded by the detector. In some cases, however, the desired encoder scanning speed may be slower than the lowest mechanically stable speed allowed by the system.

Figure 59A:
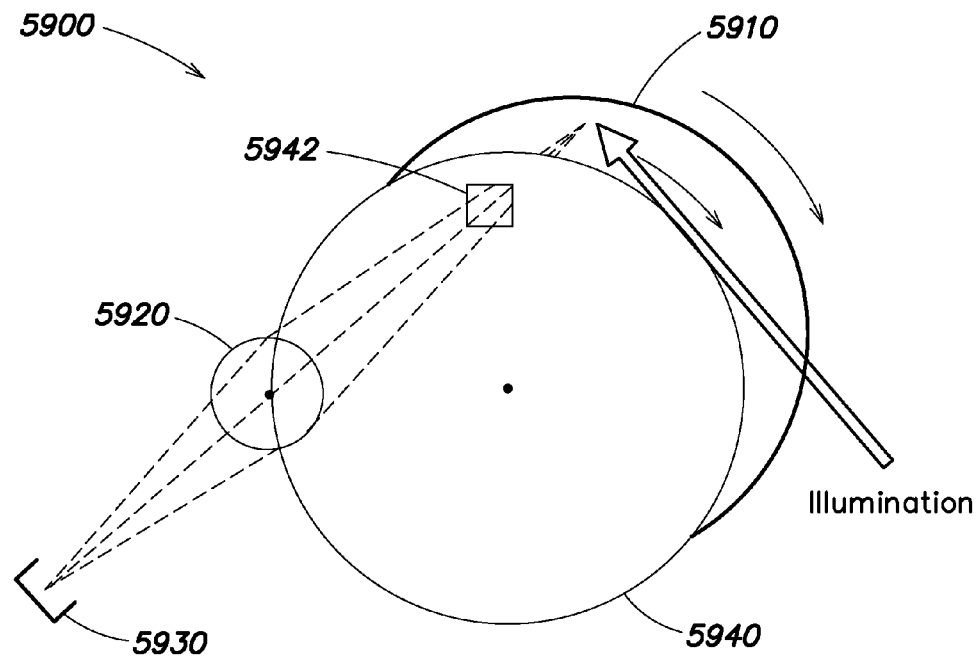
FIGS. 59A and 59B illustrate a spectrometer with a rotating spectral encoder according to embodiments of the present invention.
Figure 59B:
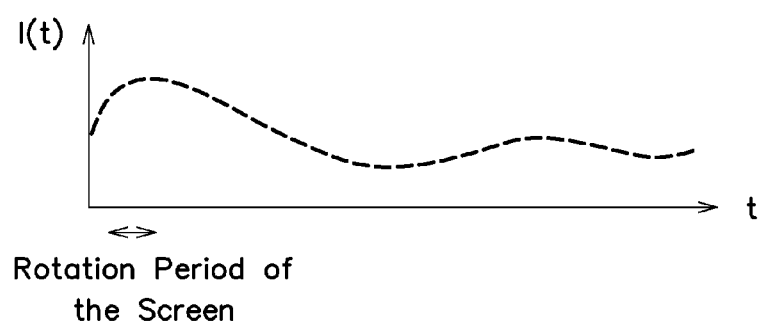

If desired, signal amplification, time integration, and/or lock-in techniques may be used for low-intensity measurements. One may also use a stroboscopic system 5900, as shown in FIGS. 59A and 59B. Taking the example of a rotating encoder 5910, one may use a secondary opaque wheel 5940 parallel to the encoder and spinning with the same axis of rotation as shown in FIG. 59A. A slit or an aperture 5942 opens into this secondary screen wheel 5940 such that light can only be collected by an imaging system 5920 and single-element detector 5930 for short time windows whenever this aperture 5942 crosses the optical path (is close to the focus) of the imaging system. If the encoder 5910 and the screen wheel 5940 rotate at the same speed, the same point of the encoder is imaged during each time window. However, if the two wheels rotate at slightly different speeds, the point being imaged moves slightly, corresponding to a slow scanning of the measured point.

The scanning speed may be controlled by adjusting the speed difference between the two wheels. It is independent of the speed of the wheels. The speed difference could be controlled, for example, by a precisely regulated voltage difference signal sent to the drivers of the two rotors. The modulation of the signal introduced by the aperture (at a frequency equal to the angular frequency of the screen wheel) could also be used to implement lock-in detection techniques or Fourier analysis of the measured signal. A low-pass electronic circuit can be used to obtain a smooth signal I(t) from the chopped measured signal, e.g., as shown in FIG. 59B.

If the scanning speed varies, the measurement I(t) may be distorted. This distortion may be avoided through proper control of the scanning speed or by measuring the scanning speed in order to be able to correct for its variations during post-processing of the data. Alternatively, feedback and circuitry could be used to stabilize the scanning speed.

Measurement of the actual scanning speed may be part of both a feedback loop and post-processing. It can be achieved for example using a feature on the encoder (or on the rotating stage to which it is attached) that has a strong variation of the transmission or reflection intensity. This variation in reflection or transmission intensity can be either at the wavelength of interest and be detected by the main measurement detector, or at another wavelength, in which case a secondary light source and detector can be used. A pair of near-infrared light emitting diode and photodiode is often used to provide a trigger signal in optical choppers. A similar solution can be employed here.

Filters or separate measurement wavelength and detector can be used to avoid corruption of the measured rotation speed signal. For instance, a wavelength-division-multiplexed beam outside the main detector's detection bandwidth may be used to sense a (nominally periodic) variation in the reflectively or transmissivity of the rotating screen or encoder. The rotation speed can be calculated from the frequency of the detected (periodic) signal. This signal can be used to provide a feedback mechanism to regulate the rotation speed. It can also be used as a trigger signal for the acquisition of the time trace I(t), or for other data acquisition electronics (e.g., buffers, etc.).

Scanning Transmission Mode

Scanning the encoder can also be implemented for the transmission mode, where a partially transparent encoder encodes the spectrum of the incident light through the spatial variations of its transmission spectrum. In such configuration, one can illuminate one side of the encoder, and image the encoder from the other side.

Figure 60:
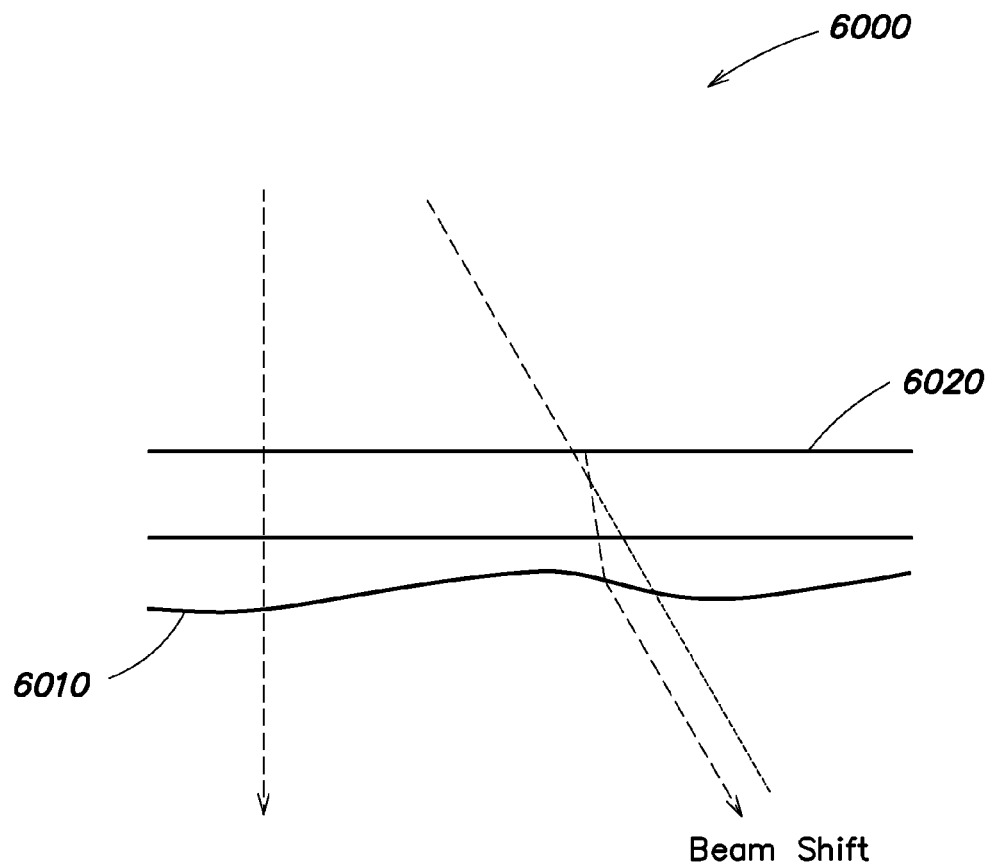
FIG. 60 illustrates a spectral encoder with a transmissive substrate according to embodiments of the present invention.

Variations of the illumination conditions or position-dependent tilt of the encoder could lead to unknown changes to the transfer matrix T of the encoder from experiment to experiment, preventing recovery of the spectrum I(λ) from the measurement of I(x) or I(t). The use of transmission mode with a scanning encoder further reduces the impact of these variations, since the encoder and its substrate can be designed in such a way as to minimize the angular dependence of the transmission spectrum at each point of the encoder. As mentioned above, the use of thin films for the encoder reduces the angular dependence of its spectral features (in reflection, transmission or absorption). For example, FIG. 60 illustrates a transmission-mode encoder 6000 whose transparent substrate 6020 is thin so as to reduce the beam shift upon transmission through the thin film 6010 in case the encoder is tilted.

Since in transmission mode illumination and imaging may be decoupled from one another, the two functions being on separate sides of the encoder, one has more flexibility in the design of the imaging system. In the case of a scanning encoder, only one point of the encoder needs to be imaged onto the single pixel detector. Optical systems comprising one or several lenses can be used to achieve this function. The optical system needs not be achromatic: the frequency response of the optical system can be included in a properly calibrated transfer matrix T.

Figure 61:
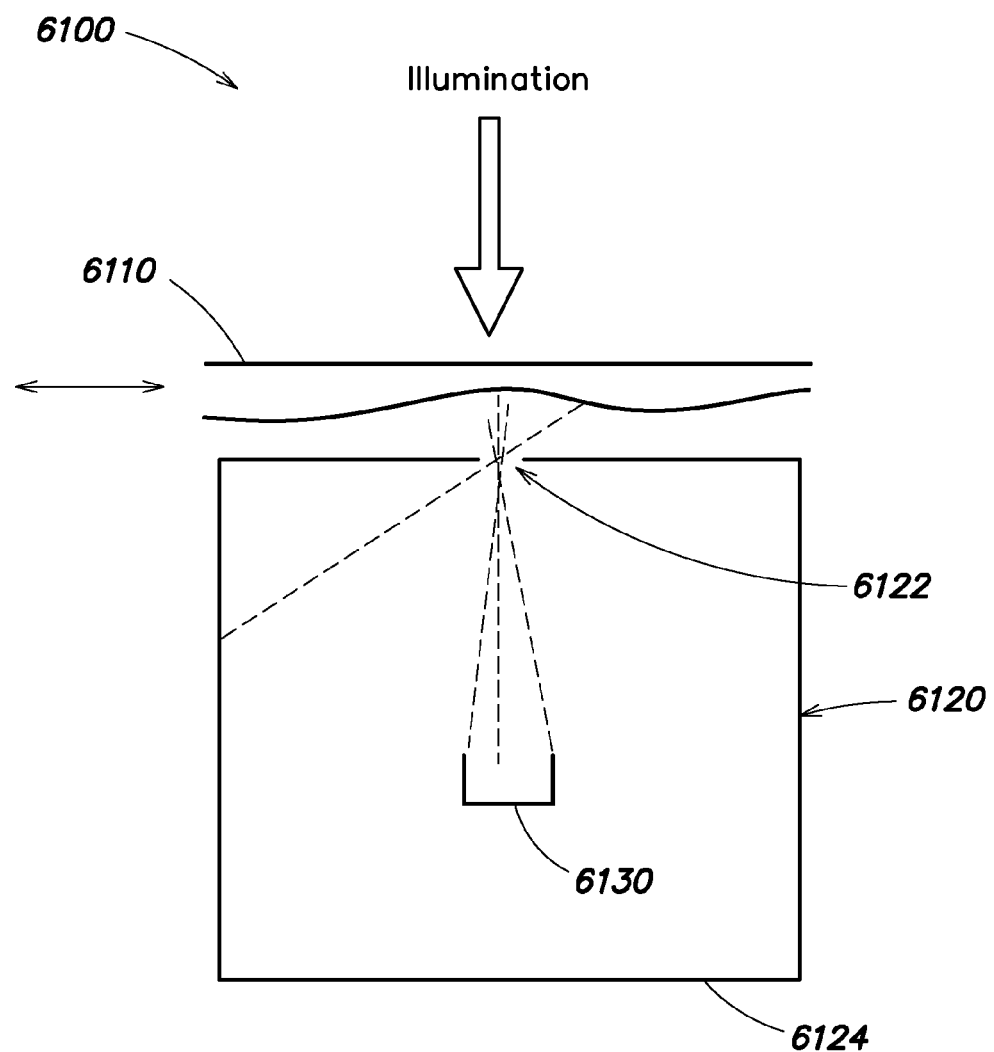
FIG. 61 illustrates a camera obscura type spectrometer with the spectral encoder of FIG. 60 according to embodiments of the present invention.

FIG. 61 shows a spectrometer 6100 with an imaging system without lenses—a camera obscura 6120. The camera obscura 6120 includes an opaque box 6124 in close proximity to a scanning encoder 6110. The box 6124 defines a single small aperture 6122 and contains a single-element detector 6130, so that the only light impinging on the detector 6130 is the light coming from the aperture 6122. The distance between the aperture and the detector, as well as the detector size, are chosen to reduce or minimize the solid angle over which the detector can be seen from the aperture. This solid angle gives the spatial resolution of the system; only the points of the encoder contained within that solid angle contribute to the measured signal. This imaging system is a camera obscura type imaging system.

Direct Read-Out Transmission Mode

Figure 62A:
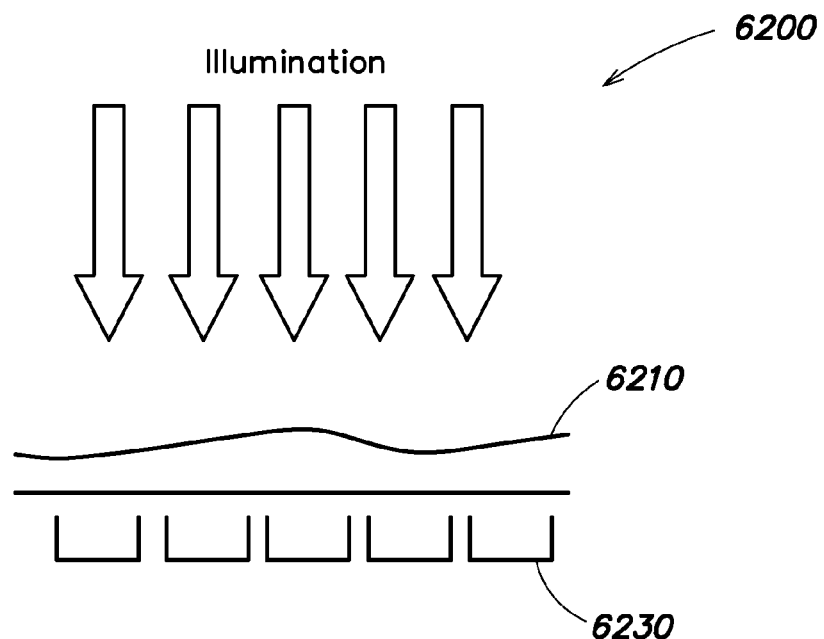
FIGS. 62A and 62B illustrate spectrometers formed by coating or layer ultra-thin films in transmission geometries with one or more detector elements according to embodiments of the present invention.
Figure 62B:
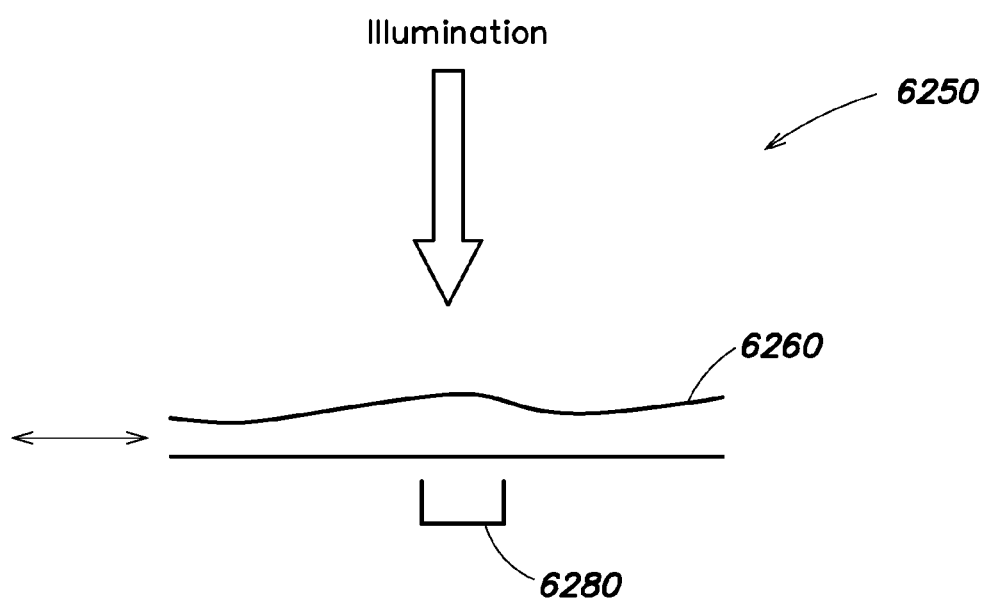

FIGS. 62A and 62B illustrate compact, transmission-mode spectrometers 6200 and 6250, respectively. In each spectrometer, the light to be analyzed illuminates an encoder 6210/6260, whose points have different transmission spectra from one another. However, instead of using an imaging system to measure the transmitted light, a detector array 6230 (FIG. 62A) is placed directly behind the encoder. The spatial resolution in this system comes from the small size of the detector and its limited detection solid angle. Imaging of the encoder can be achieved by integrating a detector array onto the encoder (FIG. 62A). Scanning is also possible by using a single detector 6280 and scanning the encoder 6260 between the detector and the illumination source (FIG. 62B).

In-Coupling and Illumination

As mentioned above, using an aperture at the input of the spectrometer to provide a fixed and stable point source for the illumination system may provide a robust (reproducible) encoder matrix T from experiment to experiment. One way to provide a fixed, stable point source is to use a fiber coupled input to the spectrometer. The cleaved facet of the input optical fiber forms such an aperture by confining the region of space where the light is originating from.

Fiber coupling further provide possibilities for remote sensing: one end of the optical fiber can be introduced into confined space that would be hard to access with bulky equipment, or into hazardous or extreme environments. The other end of the fiber is coupled into the spectrometer. A fiber collimator at the input end of the fiber can be used to point to a target object whose emission spectrum is to be measured. To illustrate the flexibility afforded by fiber coupling, consider carrying the spectrometer in a backpack or bag on an operator's waist. An optical fiber may couple the spectrometer to a fiber collimator positioned on a helmet or on goggles worn by the operator.

It may be beneficial to use an optical diffuser at the input of the spectrometer to homogenize the illumination conditions from experiment to experiment. Such a diffuser can be made of ground glass, Teflon, or one or more other translucent materials.

FIGS. 63A and 63B illustrate inventive spectrometers 6300 and 6350, respectively, for absorption spectroscopy measurements. In each case, an absorption cell or cuvette 6304/6354 is placed in the spectrometer's illumination path. A light source 6302/6352 can be integrated with the spectrometer to illuminate the sample to be measured. In FIG. 63A, the sample transmits light to an encoder and detector 6310; in FIG. 63B, the sample scatters light towards encoder and detector 6310. Different configurations can be used to measure transmission spectrum or scattering spectrum.

Spectrometer Systems

A spectrometer system may include some or all of the following elements: a) an in-coupling mechanism to receive the light to be measured; b) an imaging system to illuminate the encoder with the light to be analyzed (whose spectrum is to be measured); c) an encoder to convert the spectral information into a spatial intensity pattern; d) a scanning or rotation stage to move the encoder; e) an imaging system to image one or more points on the encoder onto one or more detector elements; f) a measurement or feedback system to control or measure the displacement of the scanning stage; g) an electronic system to read data from the detector and compute the spectrum from the date; h) an enclosure to block out stray light; i) a sample compartment, cuvette, or absorption cell in the optical path of the illumination system; j) one or several light sources to illuminate a sample or object; and k) other elements as desired. The system is characterized by a transfer matrix T which contains the information on the spectral response of the different points of the encoder, of the optical systems used, and of the detector(s) used.

Figure 64:
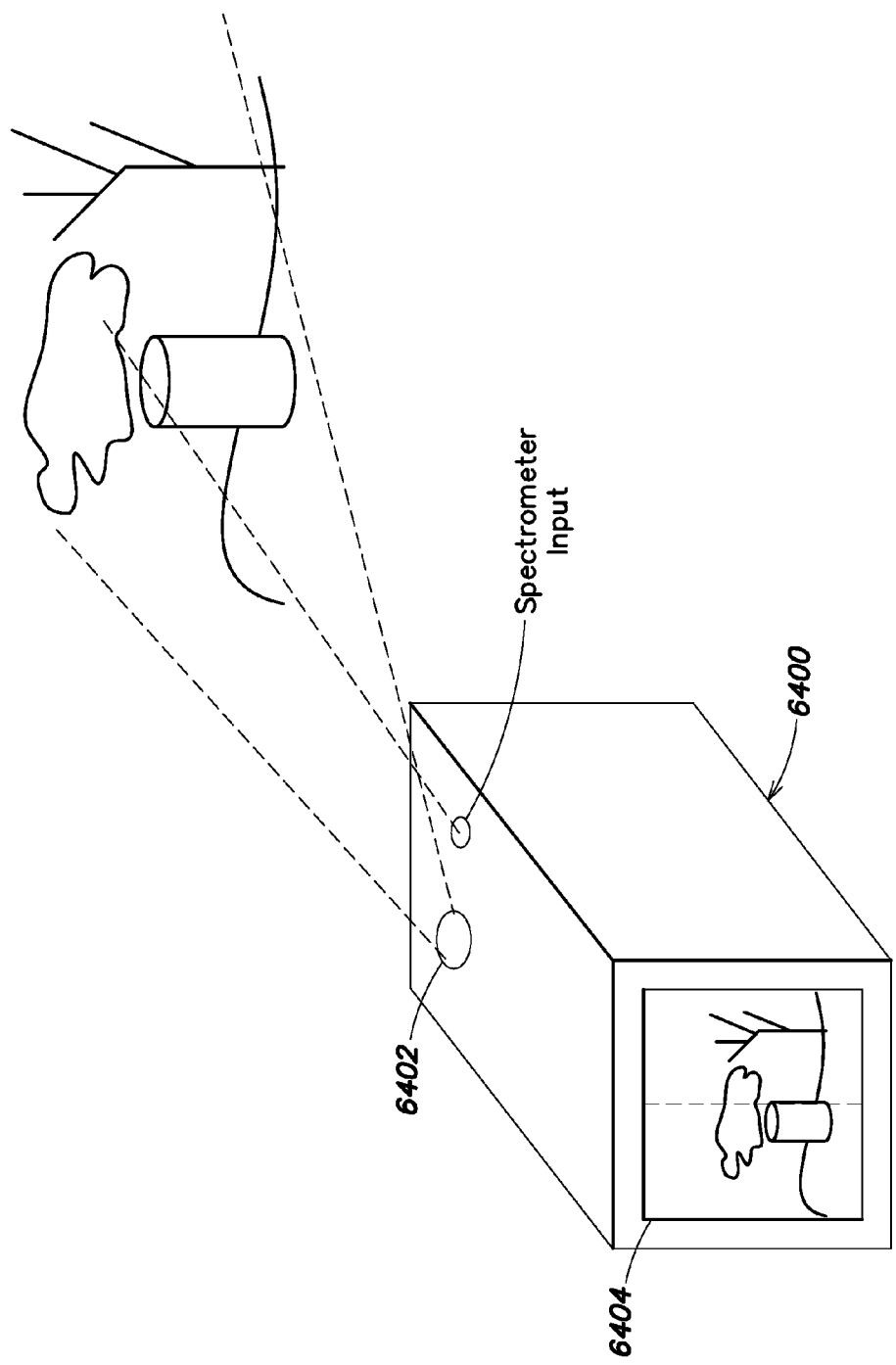
FIG. 64 illustrates a camera-type spectrometer according to embodiments of the present invention.

The spectrometer may also be coupled to a visible or infrared imaging system 6400 (e.g., a camera 6402 with a display 6404) so as to provide context information on the target measured, as shown on FIG. 64. The spectrometer in-coupling optical system can be adjusted so as to point toward the center of the imaging field of the camera. A display attached to the spectrometer can provide live imaging capability to help the operator point the spectrometer in the direction of a specific target to be measured. The images of the measurement scene can be stored to save the context in which the measurement was performed.

Wavelength Range

The spectrometer design and concept presented here are not specific to any particular wavelength range of the electromagnetic spectrum. An inventive encoder can be designed to provide position-dependent spectral features for any wavelength range of interest. An example of a specific encoder presented earlier in this description is targeting the 400 nm to 800 nm wavelength range. However, using appropriate encoder, detector, and optical system, other spectral ranges are accessible, including infrared and terahertz.

For an infrared spectrometer, the detector may measure both the encoded light and the temperature dependent background radiation of the instrument itself (and of its components). To compensate, the measurement protocol may include subtraction of this background radiation measurement. For instance, a reflective (low-emissivity) shutter or chopper can be used to measure the background radiation just prior or after a measurement.

Encoding Enhancement Techniques

As mentioned above, a measure of the amount of information encoded by the encoder is given by the rank its transfer matrix T. Once noise is taken into account, the full-rank matrix may be expanded to improve the accuracy of calculating $I(\lambda)$ from the measurement of $I(x)$, since the errors are amplified by the inversion process. One can use prior information on the spectrum and regularization algorithms to find a solution that approaches the initial spectrum $I(\lambda)$. However, a robust strategy could also include largely over-determining the system, e.g., by using a (full rank) matrix T that encodes all the information of the spectrum in a redundant manner (the number of rows is superior to the number of columns and many rows are linear combinations of one another). Such a matrix, with a large number of rows, may describe a more complex encoder.

Consider again measuring spectra between $\lambda_1$ and $\lambda_2$ with a resolution of $\Delta\lambda$ with $N=(\lambda_2-\lambda_1)/\Delta\lambda$ filters. Illuminating all the filters uniformly with the light whose spectrum is to be measured, and recording the transmitted intensity through each filter, yields the spectrum with a resolution of $\Delta\lambda$ (i.e. N points between $\lambda_1$ and $\lambda_2$). The transfer matrix T of this system is such that each line corresponds to the transmission spectrum of a different filter. There are thus N such lines. The number of columns is given by the number of frequency points used to measure the transmission spectrum of each filter. It should be at least N and may be superior to N. Assuming that no line of the resulting matrix can be obtained as a linear combination of other lines in the matrix, the rank of the matrix is N. As a consequence, it is possible to calculate back $I(\lambda)=T^{-1}.I(x)$ from a measurement $I(x)=T.I(\lambda)$, The resulting vector $I(\lambda)$ has N points, giving a resolution of $\Delta\lambda$. If the matrix has more than N columns (i.e., the transmission spectrum of the N filters is known with a higher resolution than $\Delta\lambda$), the rank is still N: this extra information is superfluous. If some lines are linear combinations of others, then the rank is less than N. In that case, some information may be lost during the encoding process. In such rank deficient problems, there are typically several or an infinity number of solutions (i.e. vectors $I'(\lambda)$ such that $I(x)=T. I'(\lambda)$).

It is possible to use regularization algorithms to find a smooth solution that closely approaches the actual spectrum $I(\lambda)$. As a consequence, rank-deficient encoders can be used to build a spectrometer. Even in the case of a full-rank transfer matrix T that is not diagonal, quasi-diagonal, or sparse (such as in standard grating spectrometer), the noise may be amplified for such an inverse problem. However, this can be addressed by largely over-determining the system using a more complex encoder without reducing the number of frequency components encoded for at each point (and thus on the total measured signal $I(x)$). This enables more design possibilities for the encoder than previously recognized. Quasi-arbitrary frequency responses of object or interfaces can be used, as illustrated by the thin film encoder presented above.

Nevertheless, increasing the rank of the transfer matrix T may make the measurement more robust. FIGS. 65A and 65B illustrate one way to increase the rank of the transfer matrix T—by adding different dielectric films 6502, 6504, 6506, and 6508 on an encoder 6500 at different positions. These films 6502, 6504, 6506, and 6508 can add a frequency response of their own or alter the frequency response of the encoder by changing the boundary condition at the surface of the encoder 6500. Alternatively, more complex encoders can be designed since in general, the more complex the structure of the encoder, the more information it will encode. For example, in the case of thin film stacks used as encoders, multiple different stacks can be fabricated side by side on a substrate, or stacks containing more thin film layers can be fabricated.

Figure 66B:
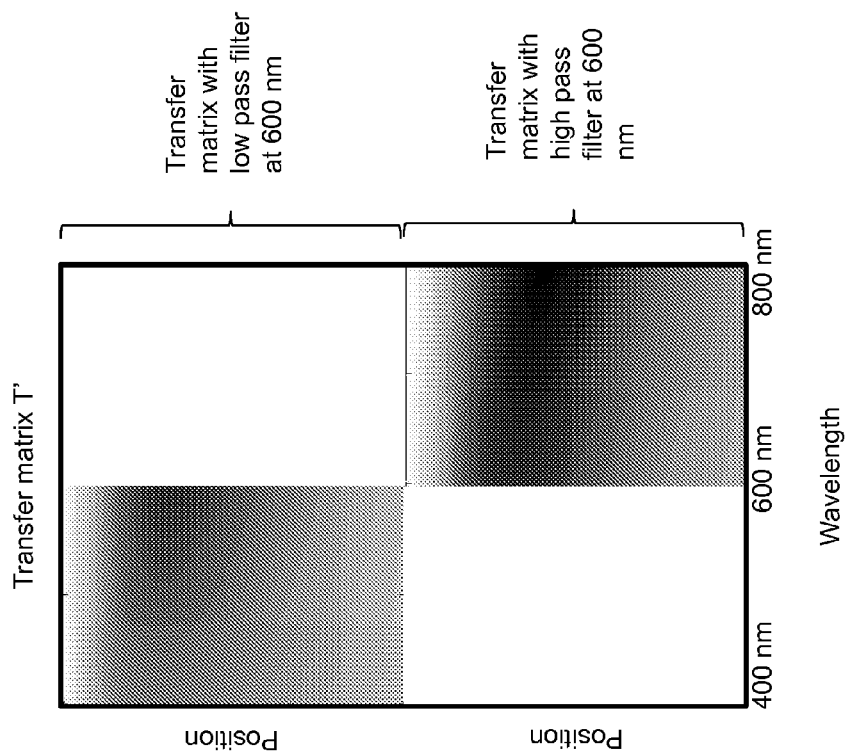
FIGS. 66A and 66B illustrate, respectively, a transfer matrix and a spectral encoder with high- and low-pass filters according to embodiments of the present invention.
Figure 66A:
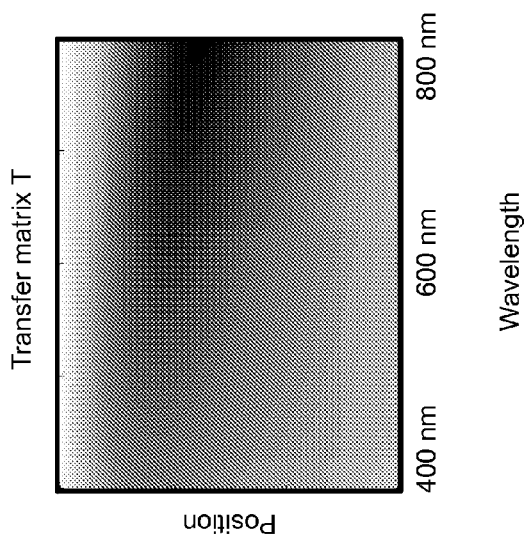

FIGS. 66A and 66B illustrate an encoder transfer matrix and an encoder/filter combination, respectively, with a low-pass and a high-pass filter that increase the amount of information encoded by the transfer matrix. Assume that the encoder's number of rows without the filters is N when operating between the wavelengths of 400 nm and 800 nm. Using two filters (for example, a low-pass filter at 600 nm and a high-pass filter at 600 nm), it is possible to obtain a transfer matrix T' with twice the number of rows, by concatenation of the two matrices T1 and T2 obtained by placing respectively the low-pass and the high-pass filter in the optical path.

Figure 67:
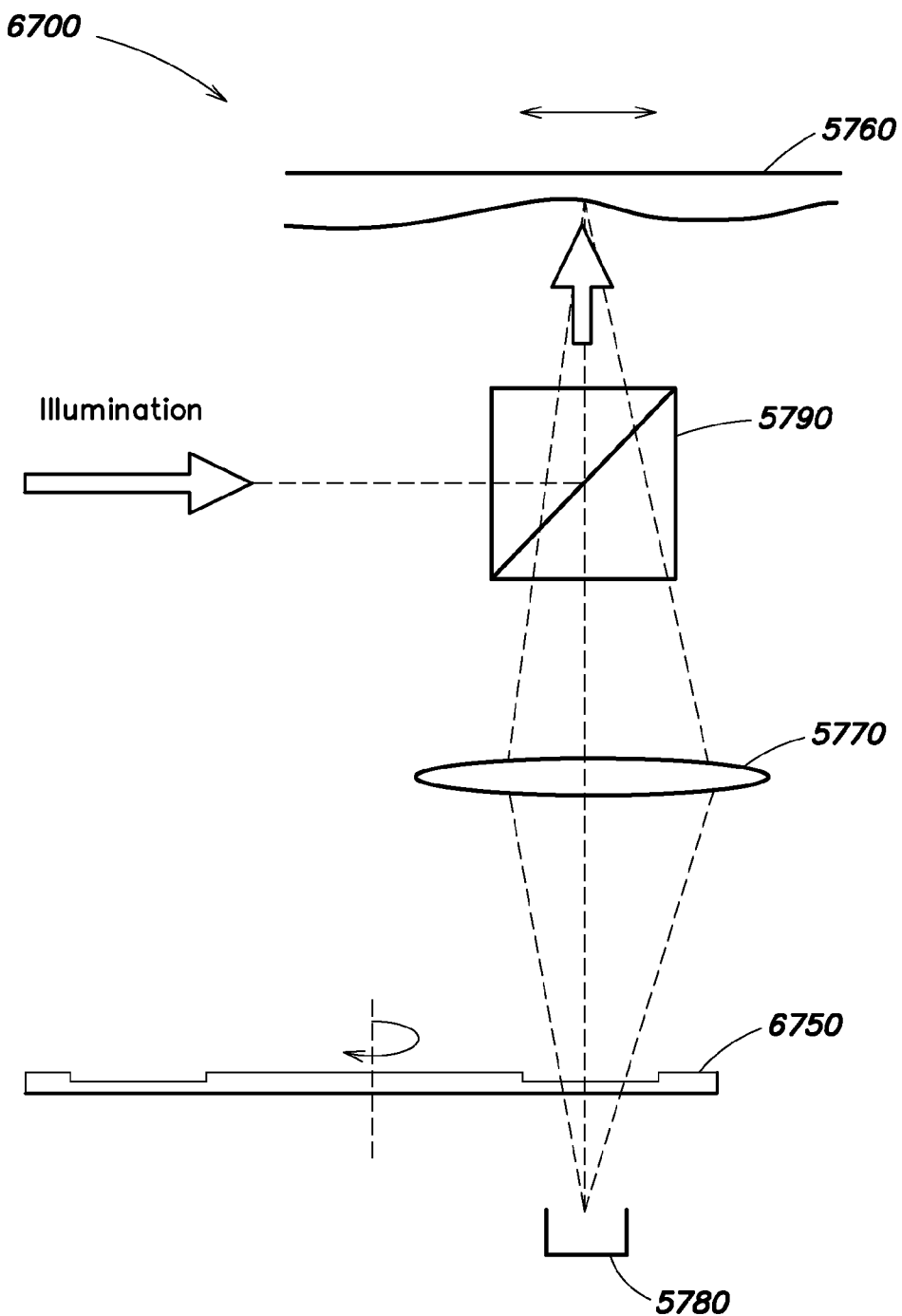
FIG. 67 illustrates a spectrometer using the spectral encoder of FIG. 66B according to embodiments of the present invention.
Figure 68:
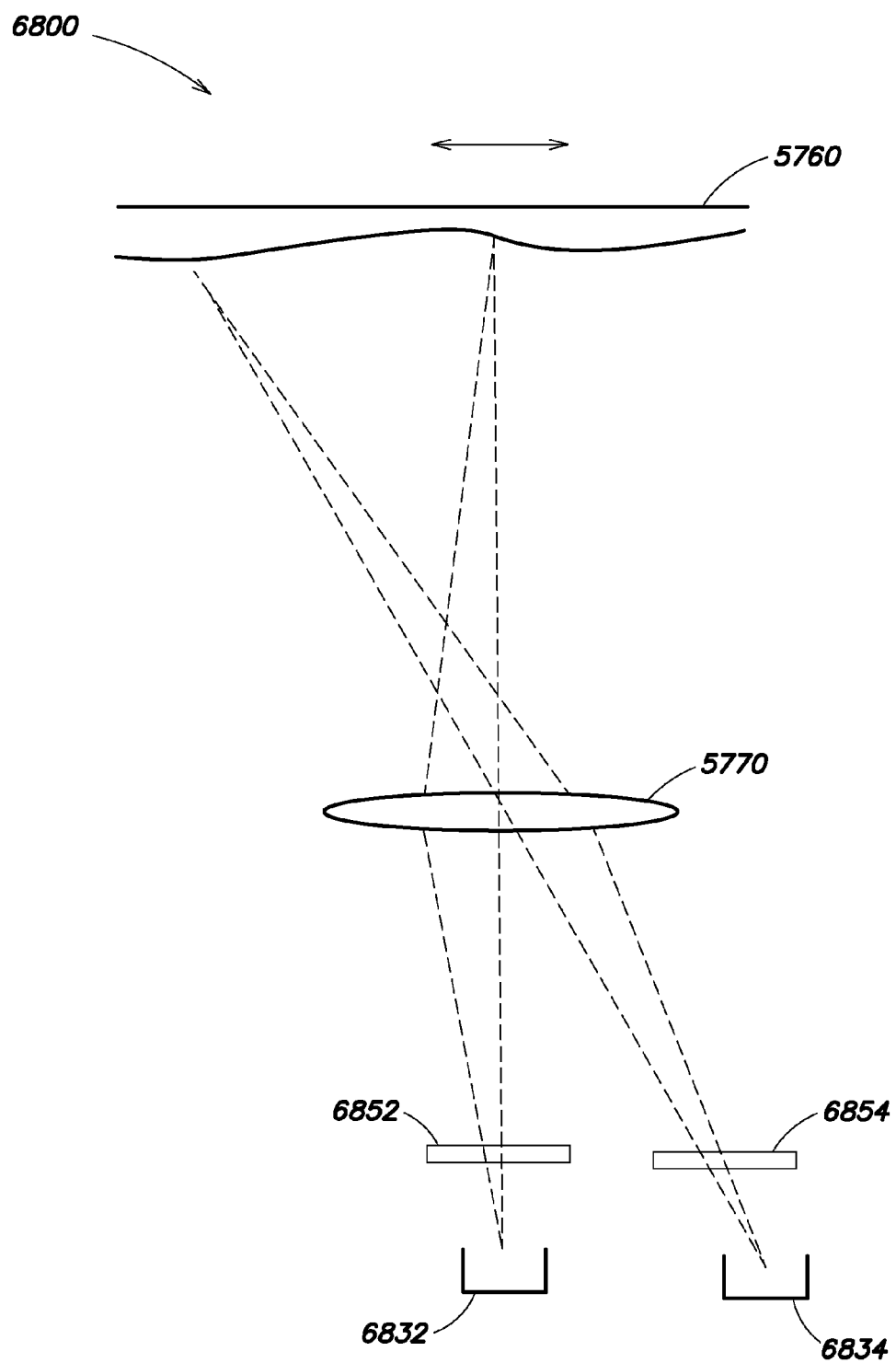
FIG. 68 illustrates a spectrometer that uses a spectral encoder with a pair of filtered detectors to increase the effective rank of the spectrometer's transfer matrix according to embodiments of the present invention.

The filters can be on a filter wheel 6750 and be successively introduced in the optical path of the spectrometer 6700, e.g., as shown in FIG. 67, or they can cover different areas of the encoder. Such filters could be implemented for example by depositing one or several additional dielectric or metallic layers on top of the encoder. Different filters 6852 and 6854 could also be inserted in front of respective single-element detector(s) 6832 and 6834 as in the spectrometer 6800 shown in FIG. 68. Different detectors, each with a different filter, or each with a different intrinsic frequency response, could also be used. For example, in the imaging mode and in the visible, a CMOS or CCD camera can be used as a detector array, and the red-blue-green filters often integrated with such detectors can be used to increase the information encoded by the matrix T.

Figure 69:
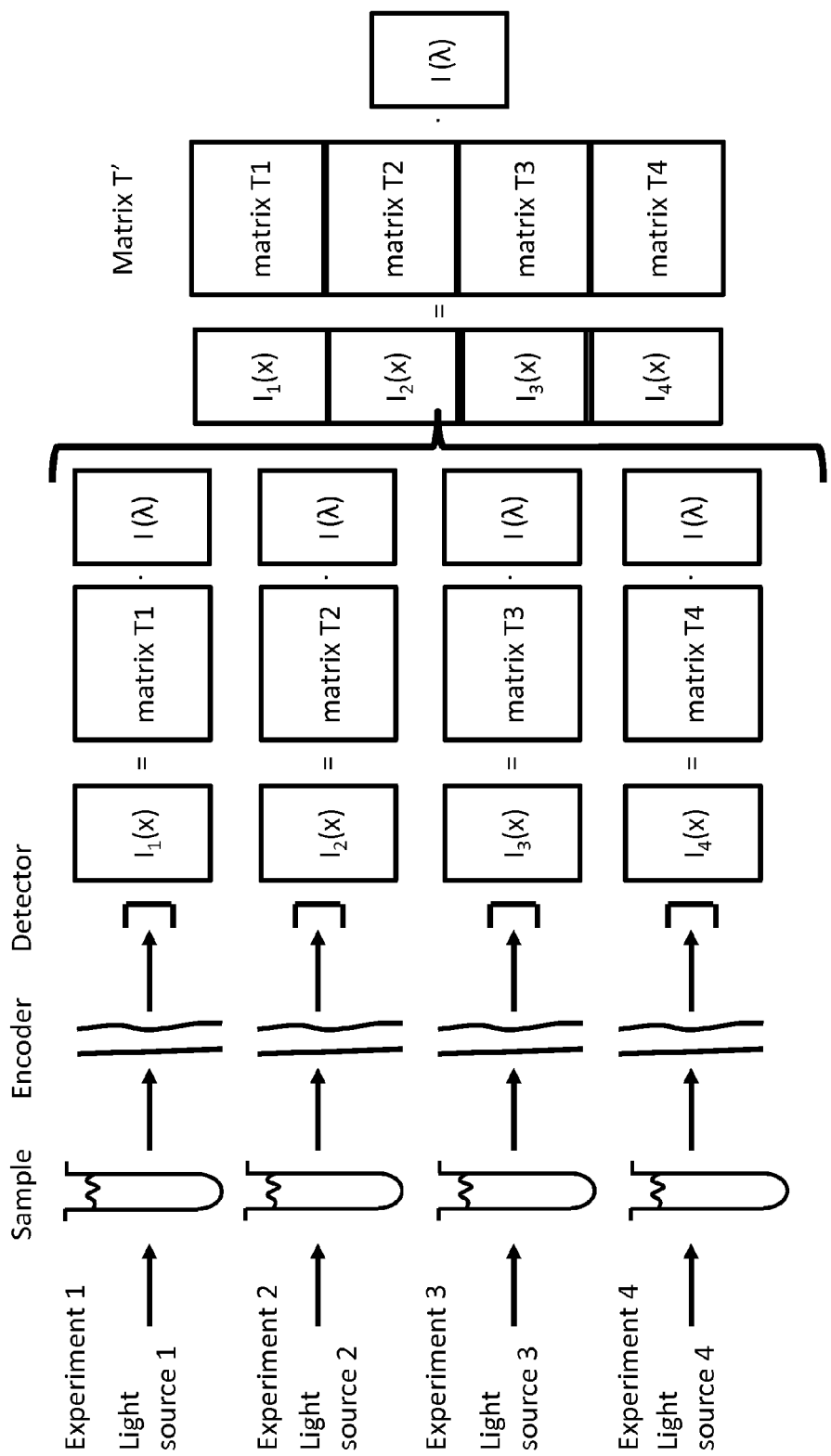
FIG. 69 illustrates a spectrometer system with multiple light sources and multiple spectral encoders according to embodiments of the present invention.

For absorption spectroscopy of a sample, different light sources can be used successively to illuminate the sample. For example, in the visible, one can use a red, a green, a blue, and a white light-emitting diode (LED) to successively illuminate a cuvette containing a sample whose absorption spectrum is to be measured. The four successive measurements may contain different information and can be combined. The effective transfer matrix T' corresponding to the sum of the measurements is formed by concatenating the four different sub-matrices obtained by multiplying the original matrix T of the encoder with the emitted spectrum of each diode as shown in FIG. 69. It has four times as many rows as the initial matrix T.

In the case of infrared absorption spectroscopy, a broadly tunable source can be used, such as an external cavity diode laser or quantum cascade laser. A quantum cascade laser can be designed to have a very broad gain spectrum. When a Fabry-Perot type cavity is used, instabilities and non-linearities frequently result in simultaneous lasing on many cavity modes. The so-called diagonal active region design results in a broad tuning of the multimode spectrum with different applied voltage (Stark effect). It is thus possible to use a single Fabry-Perot quantum cascade laser as a broadly tunable multimode source. The different broad spectra achieved for different driving conditions can be used to increase the effective amount of information encoded by the transfer matrix in a similar fashion as described above.

NON-LIMITING WORKING EXAMPLES

Example 1

In this example, the aforedescribed concepts at visible frequencies were investigated by modifying the reflectivity of a gold (Au) surface by coating it with evaporated germanium (Ge) films of nanometer thickness, which creates broadband absorption resonances with the spectral position determined by the film thickness.

The wide optical absorption band influences the color by suppressing the reflectivity in a portion of the visible spectrum. Ge was selected because it is highly absorbing at visible frequencies (see FIG. 8A) due to direct electronic transitions which appear at energies higher than that of the fundamental absorption edge. An optically-thick (150 nm) Au film was coated with Ge of thickness h between 7 nm and 25 nm by using electron-beam evaporation, which resulted in drastic changes in the reflectivity. Near-normal incidence measurements (7° incidence angle with unpolarized light) was performed using a spectrophotometer with a photomultiplier tube (PMT) detector between 400 nm and 850 nm—sample preparation and measurement are described further in Example 2 below. The experimental reflectivity spectra for Ge films of thickness between 7 nm and 25 nm coated on Au are given in FIG. 8B.

The calculated reflection spectra corresponding to the measurements in FIG. 8B were obtained by using Eqn. (1) and are shown in FIG. 8C. Good agreement between the experimental data and the calculations was observed. The optical constants for the evaporated Au and Ge were obtained by variable angle spectroscopic ellipsometry (VASE) of optically thick films (see Example 2 below for further description). The spectral position of the absorption band, which corresponds to the reflectivity minimum, depends on h, with a shift of approximately 20 nm in wavelength for every 1 nm change in h across the visible spectral range. This strong absorption resonance occurs in a film that is significantly thinner than the wavelength of light (e.g. $\sim\lambda/(13n_2)$ at $\lambda\sim560$ nm, with $n_2\sim4.3$ for the 10 nm Ge film in the calculation), which is the result of interplay between the complex reflection coefficient at the Ge/Au substrate and the large but finite attenuation of light within the Ge film. Note that the absorption coefficient of Ge decreases with increasing wavelength, and the properties of Au slowly approach those of a PEC, such that the resonant absorption thickness will slowly converge to $h\sim\lambda/(4n_2)$ at long wavelengths.

Figure 9:
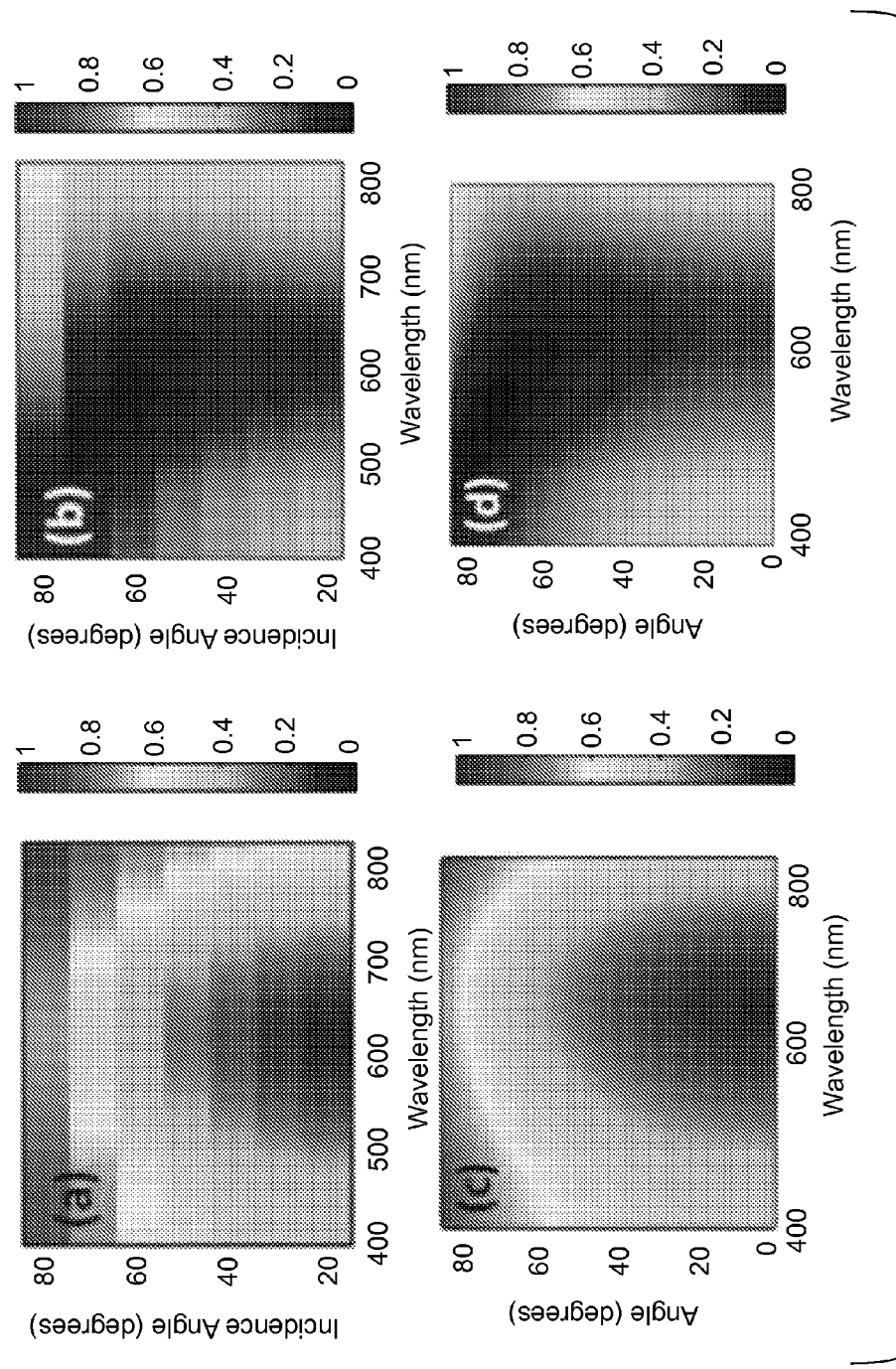
FIGS. 9A and 9B show experimental reflectivity spectra for s- and p-polarizations, respectively, for angles of incidence from 20° to 80° for an Au film coated with 15 nm of Ge in one embodiment.
FIGS. 9C and 9D) show the respective calculated spectra corresponding to those in FIGS. 9A and 9B using Eqn. (1).

Because these coatings are significantly thinner than the wavelength of light, there is little phase accumulation due to the propagation through the film. As a result, the optical properties of these coatings are robust with respect to the angle of incidence. This is demonstrated by measuring the s- and p-polarized reflectivity of the sample with 15 nm of Ge, which shows that the absorption feature remains prominent for angles of incidence from 0° and ~60° in both polarizations (FIGS. 9A and 9B). The corresponding calculated spectra are shown in FIGS. 9C and 9D.

Figure 10:
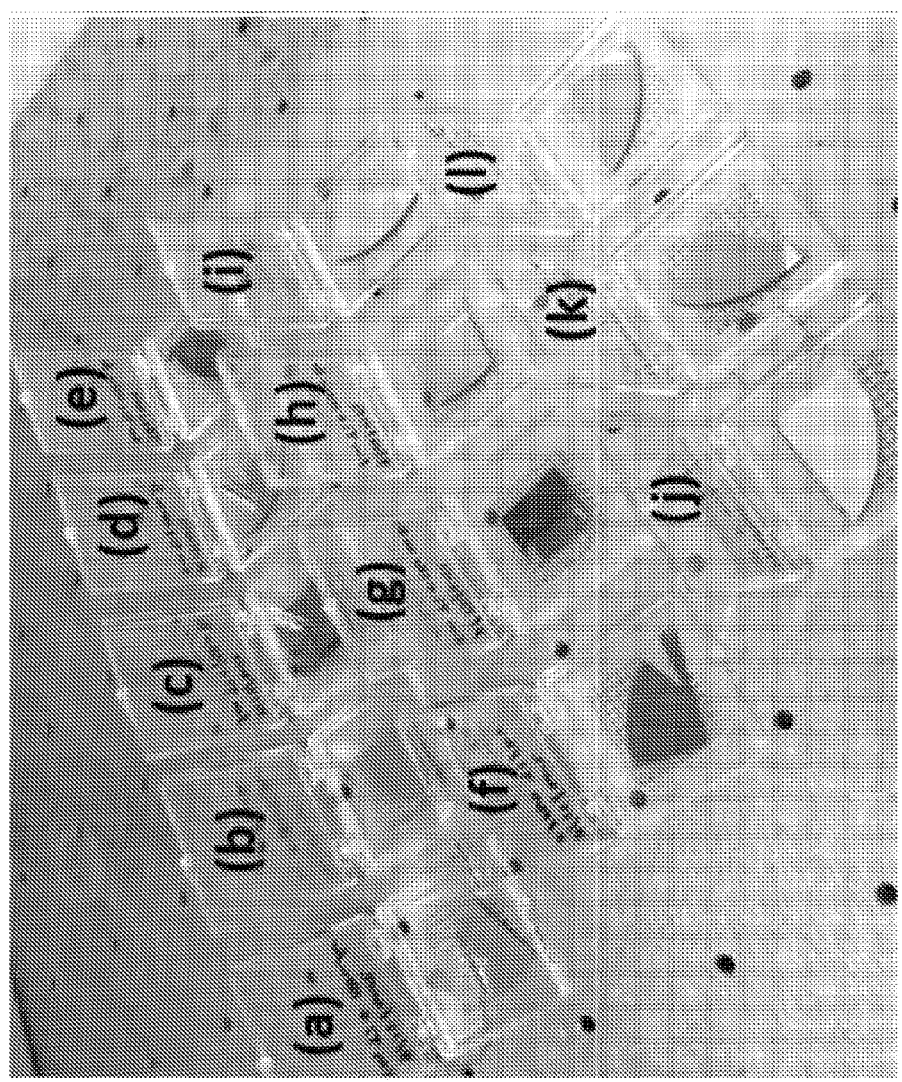
FIG. 10 is a color photograph that shows a wide variety of colors formed by coating Au with nanometer films of Ge. Samples (a)-(i) have Ge coatings of 0 nm, 3 nm, 5 nm, 7 nm, 10 nm, 15 nm, 20 nm, 25 nm, and 30 nm thicknesses, respectively deposited on optically-thick Au, which was deposited on polished silicon. Samples (j)-(l) have Ge coatings of 0 nm, 10 nm, and 20 nm thickness, respectively, deposited over 150 nm of Au, on a rough (unpolished) silicon substrate. (The clip marks from mounting in the e-beam evaporator are visible on some samples.)
Figure 11:
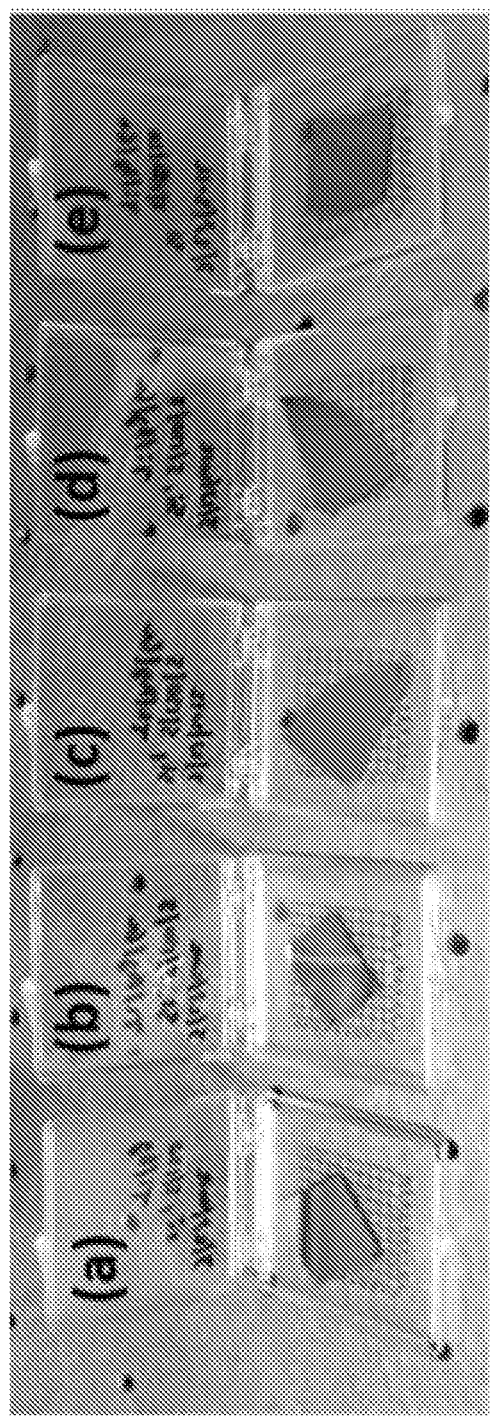
FIG. 11 is a color photograph that shows thick silver (Ag) films coated with 0, 3, 5, 7, and 10 nm of evaporated Ge and labeled (a), (b), (c), (d), and (e), respectively.

The large change in reflectivity allows for the coloring of metals using these films of sub-wavelength thickness. FIG. 10 shows a photograph of samples of Au coated from 0 nm to 30 nm of Ge, creating an array of colors including pink, blue, and violet, among others. In samples (a)-(i), the substrate material for Au deposition was a polished silicon wafer. In samples (j)-(l), the rough, unpolished back-side of the wafer was used, and the various colors are still clearly visible, indicating that the effect provided by the coatings described herein is relatively insensitive to surface roughness. Such an observation is unexpected given our every-day experience with thin film interference effects. For example, one can refer to the difference in the spectra of the reflected light from a soap film when the observer is placed at different positions—in this example, the robustness of the effect against roughness stems from the low sensitivity of the resonance used on angle of incidence. Several samples of silver (Ag) colored via the same principle were investigated. In particular, a color similar to that of gold is induced in Ag samples by coating them with 7-10 nm of Ge (FIG. 11). Similar type of coloring can be done for various other metals.

Example 2

Methods

The Au, Ge, and Ag films were deposited by electron-beam evaporation using a Denton evaporator. Au was deposited at a rate of ~2 Å/s under a vacuum of ~$10^{-6}$ torr, with the rate measured by a crystal monitor. Ge was deposited at a rate of 1 Å/s at a vacuum of ~$2\times10^{-6}$ torr. The image in FIG. 10 was taken with a Mayon PowerShot ELPH 310 HS digital camera under illumination from regular white ceiling fluorescent lights.

The near-normal incidence reflectivity spectra were taken using a Hitachi 4100 spectrophotometer with a tungsten lamp source and a photomultiplier tube (PMT) detector in the 400-850 nm range. The incident light was unpolarized and was incident at an angle of 7°. The angle-dependent, polarization-dependent spectra were taken using a Woollam WVASE32 spectroscopic ellipsometer using reflection/transmission (R/T) mode.

The complex refractive indices given in FIG. 8A and used in the calculation of the spectra in FIG. 8C and FIGS. 9C-9D were obtained by variable-angle spectroscopic ellipsometry (VASE) of optically-thick evaporated films (150 nm for Au and 1000 nm for Ge in the 400-850 nm range). In ellipsometry literature this type of measurement is referred to as measuring the "pseudo dielectric function", which is named "pseudo" because of the assumption that a single reflection comes from a sharp interface between the material and the air. This method was preferred to ellipsometry on thin absorbing films (e.g., ~10 nm Ge on a known substrate) because it decreases the number of unknowns from (m, k, h) to (m, k), which helps avoid over-fitting errors and non-unique solutions.

The theoretical spectra in FIG. 8C and FIGS. 9C-9D were calculated using Eqn. (1). In the case of FIG. 8C, unpolarized incident light was simulated by calculating the reflectivity for both s- and p-polarizations, and taking an average of the two.

CONCLUSION

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The articles "a" and "an" are used herein to refer to one or to more than one (i.e., to at least one) of the grammatical object of the article. By way of example, "a polymer resin" means one polymer resin or more than one polymer resin. Any ranges cited herein are inclusive. The terms "substantially" and "about" used throughout this Specification are used to describe and account for small fluctuations. For example, they may refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

The invention claimed is:

1. A device with a working wavelength of $\lambda$, comprising:
   a reflector that is reflective at the working wavelength of $\lambda$, the reflector comprising a substrate having an unpolished surface and a reflective layer disposed over the unpolished surface of the substrate; and
   a dielectric layer disposed over the reflector, wherein a refractive index of the dielectric layer is n at $\lambda$, an extinction coefficient of the dielectric layer is k at $\lambda$, k is equal to or greater than 0.5 in at least one state of the dielectric layer, and a thickness h of the dielectric layer is less than $\lambda/4n$ such that the reflector and the dielectric layer form a resonator at $\lambda$.

2. The device of claim 1, wherein the reflective layer is a metal layer.

3. The device of claim 1, wherein the reflector has a reflectivity less than 100% at $\lambda$.

4. The device of claim 1, wherein the substrate is semi-transparent at the working wavelength of $\lambda$.

5. The device of claim 1, wherein the substrate comprises at least one of sapphire, a semiconductor, a metal, glass, or a conducting oxide.

6. The device of claim 1, wherein the dielectric layer comprises at least one of a semiconductor, a metal-dielectric alloy, an organic material, or a phase-change material.

7. The device of claim 1, wherein the thickness h of the dielectric layer, the extinction coefficient k of the dielectric layer, and a reflectivity of the reflector are configured such that incident light at wavelength $\lambda$, is absorbed by the device.

8. The device of claim 7, wherein the device is colored based on absorption of incident light at wavelength $\lambda$.

9. The device of claim 7, wherein the device is a reflection optical filter.

10. The device of claim 7, wherein the device is a transmission optical filter.

11. The device of claim 1, wherein the thickness h of the dielectric layer varies as a function of position across the device.

12. The device of claim 11, wherein the thickness h of the dielectric layer is patterned to represent an image.

13. The device of claim 12, wherein the image is one of a logo, a bar code, or a tag.

14. The device of claim 1, wherein the device is one of a metal-insulator-metal diode, a p-n junction photodetector, a p-i-n junction photodetector, a Schottky photodiode, a photovoltaic cell, a thermoelectric photodetector, a bolometer, and an optical memory.

15. The device of claim 1, further comprising a conductive layer disposed over the dielectric layer such that the conductive layer, the dielectric layer, and the reflector form a junction.

16. The device of claim 1, wherein the dielectric layer comprises a tunable material having a first state with an extinction coefficient $k_1$ at $\lambda$ and a second state with an extinction coefficient $k_2$ equal to or greater than 0.5 at $\lambda$, such that the device has a tunable absorption at $\lambda$.

17. The device of claim 16, wherein the tunable material is an oxide of a metal.

18. The device of claim 16, further comprising an actuator configured to tune the tunable material to switch between the first state and the second state.

19. The device of claim 18, wherein the actuator is configured to tune the tunable material by at least one of temperature, voltage, current, optical intensity, pressure, and magnetic field.

20. The device of claim 1, wherein the dielectric layer comprises a tunable material, and further comprising an actuator configured to tune the tunable material to vary between a range of values of the extinction coefficient k.

21. The device of claim 1, wherein the extinction coefficient k of the dielectric layer is larger than 0.5 in at least one state of the dielectric layer.

22. The device of claim 1, wherein the thickness h of the dielectric layer is less than $\lambda/8n$.

23. The device of claim 1, wherein the wavelength $\lambda$ is in a range of 350 nm to 800 nm.

24. The device of claim 1, wherein the wavelength $\lambda$ is an ultraviolet wavelength or an infrared wavelength.

25. The device of claim 1, wherein the reflector comprises a Bragg reflector.

26. A method comprising:
  modulating incident light comprising a wavelength of $\lambda$ by exposing an optical device to the incident light, the optical device comprising:
    a reflector that is reflective at the working wavelength of $\lambda$, the reflector comprising a substrate having an unpolished surface and a reflective layer disposed over the unpolished surface of the substrate; and
    a dielectric layer disposed over the reflector, wherein a refractive index of the dielectric layer is n at $\lambda$, an extinction coefficient of the dielectric layer is k at $\lambda$, wherein k is equal to or greater than 0.5 in at least one state of the dielectric layer, and a thickness h of the dielectric layer is less than $\lambda/4n$.

27. The method of claim 26, wherein the dielectric layer comprises a tunable material, and the method further comprises applying at least one of heat, voltage, current, optical pulse, pressure, and magnetic field to the dielectric layer to switch between states of the tunable material.

28. The method of claim 26, wherein the thickness h of the dielectric layer varies as a function of position along the reflector such that the incident light is modulated differently at different positions along the reflector.

29. The method of claim 26, wherein the thickness h of the dielectric layer is patterned to represent an image, and modulating the incident light comprises displaying the image.

30. The method of claim 29, wherein the image is one of a logo, a bar code, and a tag.

31. The method of claim 26, wherein the reflector has a reflectivity less than 100% at $\lambda$.

32. The method of claim 26, wherein modulating the incident light comprises absorbing the incident light.

33. The method of claim 26, wherein modulating the incident light comprises reflecting the incident light.

* * * * *